(12) United States Patent
Sasaki et al.

(10) Patent No.: US 11,385,512 B2
(45) Date of Patent: Jul. 12, 2022

(54) DISPLAY DEVICE COMPRISING A METAL WIRING CONNECTED TO A TRANSPARENT COUNTER ELECTRODE AND OVERLAPPING A DRAIN ELECTRODE OF A THIN FILM TRANSISTOR

(71) Applicants: Japan Display Inc., Tokyo (JP); Panasonic Liquid Crystal Display Co., Ltd., Himeji (JP)

(72) Inventors: Tohru Sasaki, Mobara (JP); Takahiro Ochiai, Chiba (JP)

(73) Assignees: JAPAN DISPLAY INC., Tokyo (JP); PANASONIC LIQUID CRYSTAL DISPLAY CO., LTD., Himeji (JP)

( * ) Notice: Subject to any disclaimer, the term of this patent is extended or adjusted under 35 U.S.C. 154(b) by 0 days.

(21) Appl. No.: 17/239,714

(22) Filed: Apr. 26, 2021

(65) Prior Publication Data

US 2021/0247650 A1    Aug. 12, 2021

Related U.S. Application Data

(63) Continuation of application No. 16/898,645, filed on Jun. 11, 2020, now Pat. No. 11,016,351, which is a (Continued)

(30) Foreign Application Priority Data

Sep. 4, 2007    (JP) .............................. JP2007-228412

(51) Int. Cl.
*G02F 1/1362*    (2006.01)
*G02F 1/1343*    (2006.01)
(Continued)

(52) U.S. Cl.
CPC ...... *G02F 1/136227* (2013.01); *G02F 1/1368* (2013.01); *G02F 1/13439* (2013.01);
(Continued)

(58) Field of Classification Search
CPC ....... G02F 2001/13629; G02F 1/13629; G02F 2201/124; G02F 2001/134318;
(Continued)

(56) References Cited

U.S. PATENT DOCUMENTS 6,335,770 B1    1/2002   Komatsu
7,502,084 B2    3/2009   Nishimura
(Continued)

FOREIGN PATENT DOCUMENTS

JP    63121886    5/1988
JP    2044317 A   2/1990
(Continued)

*Primary Examiner* — Paul C Lee
(74) *Attorney, Agent, or Firm* — Juan Carlos A. Marquez; Marquez IP Law Office, PLLC

(57) ABSTRACT

To form a sufficiently large storage capacitor, a liquid crystal display device includes a liquid crystal display panel having a first substrate, a second substrate, and a liquid crystal held between the first substrate and the second substrate, the liquid crystal display panel having multiple pixels arranged in matrix. The first substrate has, in a transmissive display area provided in each of the pixels, a laminated structure containing a first transparent electrode, a first insulating film, a second transparent electrode, a second insulating film, and a third transparent electrode which are laminated in this order. The first transparent electrode and the second transparent electrode are electrically insulated from each other and together form a first storage capacitor through the first insulating film, and the second transparent electrode and the third transparent electrode are electrically insulated from each other and together form a second storage capacitor through the second insulating film.

7 Claims, 43 Drawing Sheets

Related U.S. Application Data continuation of application No. 16/528,008, filed on Jul. 31, 2019, now Pat. No. 10,718,983, which is a continuation of application No. 14/985,606, filed on Dec. 31, 2015, now Pat. No. 10,409,122, which is a continuation of application No. 14/502,108, filed on Sep. 30, 2014, now Pat. No. 9,261,747, which is a continuation of application No. 13/718,467, filed on Dec. 18, 2012, now Pat. No. 8,879,036, which is a continuation of application No. 13/550,330, filed on Jul. 16, 2012, now Pat. No. 8,368,830, which is a continuation of application No. 12/230,417, filed on Aug. 28, 2008, now Pat. No. 8,253,873.

(51) Int. Cl.
    *G02F 1/1333*      (2006.01)
    *G02F 1/1368*      (2006.01)
    *G02F 1/1335*      (2006.01)

(52) U.S. Cl.
    CPC .. *G02F 1/133345* (2013.01); *G02F 1/133512* (2013.01); *G02F 1/133514* (2013.01); *G02F 1/134363* (2013.01); *G02F 1/136213* (2013.01); *G02F 1/136286* (2013.01); *G02F 1/13629* (2021.01)

(58) Field of Classification Search
    CPC ..... G02F 1/134318; G02F 2001/13606; G02F 1/13606
    See application file for complete search history.

(56) References Cited

U.S. PATENT DOCUMENTS

| | | |
|---|---|---|
| 2003/0117559 A1 | 6/2003 | Kim et al. |
| 2004/0109119 A1 | 6/2004 | Lee |
| 2005/0041182 A1* | 2/2005 | Ono .................. G02F 1/134363 349/106 |
| 2005/0073620 A1 | 4/2005 | Gotoh et al. |
| 2005/0110931 A1 | 5/2005 | Yoo et al. |
| 2005/0139837 A1 | 6/2005 | Lee et al. |
| 2005/0190312 A1 | 9/2005 | Yang |
| 2005/0200791 A1 | 9/2005 | Ahn |
| 2007/0030423 A1 | 2/2007 | Ono et al. |
| 2007/0035677 A1 | 2/2007 | Yamazaki et al. |
| 2007/0070266 A1 | 3/2007 | Ochiai et al. |
| 2007/0153195 A1 | 7/2007 | Nam et al. |
| 2007/0159571 A1 | 7/2007 | Yang |
| 2007/0171319 A1* | 7/2007 | Fujita ................ G02F 1/134309 349/43 |
| 2007/0190703 A1 | 8/2007 | Lee et al. |
| 2007/0236640 A1 | 10/2007 | Kimura |
| 2007/0296883 A1 | 12/2007 | Kwon et al. |
| 2007/0296899 A1 | 12/2007 | Murade |
| 2008/0018814 A1 | 1/2008 | Tsai et al. |

FOREIGN PATENT DOCUMENTS

| | | | |
|---|---|---|---|
| JP | 06148684 | 5/1994 | |
| JP | 6148687 A | 5/1994 | |
| JP | 08179363 | 7/1996 | |
| JP | 2000180900 | 6/2000 | |
| JP | 2001056474 A | 2/2001 | |
| JP | 2001059976 A | 3/2001 | |
| JP | 2004151546 A * | 5/2004 | ......... H01L 27/1255 |
| JP | 2004170911 A * | 6/2004 | ....... G02F 1/136209 |
| JP | 2007004125 A | 1/2007 | |
| JP | 2007057752 A | 3/2007 | |
| JP | 2007147793 A * | 6/2007 | |
| JP | 2007316535 A | 12/2007 | |
| JP | 2008191669 A | 8/2008 | |
| JP | 2010224406 A | 10/2010 | |

* cited by examiner

DISPLAY DEVICE COMPRISING A METAL WIRING CONNECTED TO A TRANSPARENT COUNTER ELECTRODE AND OVERLAPPING A DRAIN ELECTRODE OF A THIN FILM TRANSISTOR

CROSS-REFERENCE TO RELATED APPLICATION

This application is a Continuation of U.S. application Ser. No. 16/898,645 filed on Jun. 11, 2020, which is a Continuation of U.S. application Ser. No. 16/528,008 filed on Jul. 31, 2019, which is a Continuation of U.S. application Ser. No. 14/985,606 filed Dec. 31, 2015, which is a Continuation of U.S. application Ser. No. 14/502,108 filed on Sep. 30, 2014, which is a Continuation of U.S. application Ser. No. 13/718,467 filed on Dec. 18, 2012, which is a Continuation of U.S. application Ser. No. 13/550,330 filed on Jul. 16, 2012, which is a Continuation of U.S. application Ser. No. 12/230,417 filed on Aug. 28, 2008. Priority is claimed based on U.S. application Ser. No. 16/898,645 filed on Jun. 11, 2020, which claims priority to U.S. application Ser. No. 16/528,008 filed on Jul. 31, 2019, which claims priority to U.S. application Ser. No. 14/985,606 filed Dec. 31, 2015, which claims priority to U.S. application Ser. No. 14/502,108 filed on Sep. 30, 2014, which claims priority from U.S. application Ser. No. 13/718,467 filed on Dec. 18, 2012, which claims priority from U.S. application Ser. No. 13/550,330 filed on Jul. 16, 2012, which claims priority from U.S. application Ser. No. 12/230,417 filed on Aug. 28, 2008, which claims priority from Japanese application JP 2007-228412 filed on Sep. 4, 2007, the content of which is hereby incorporated by reference into this application.

BACKGROUND OF THE INVENTION

1. Field of the Invention

The present invention relates to a liquid crystal display device, and more particularly, to a technology effectively applied to a liquid crystal display device that has a liquid crystal display panel with fine pixel dimensions.

2. Description of the Related Art

A liquid crystal display device is composed of a pair of substrates (for example, glass substrates) and a liquid crystal composition sealed in a gap between the substrates. Specifically, in the case of an in-plane switching (IPS) liquid crystal display device, for example, thin film transistors with amorphous silicon or other semiconductor layers, pixel electrodes, signal lines, scanning lines, gate electrodes, counter electrodes, and the like are formed on one of the substrates (hereinafter, referred to as TFT substrate), whereas a light shielding film, a color filter, and the like are formed on the other substrate (hereinafter, referred to as CF substrate). The TFT substrate and the CF substrate are arranged to face each other across a predetermined interval, which is kept by a spacer, and are sealed with a sealant. A liquid crystal composition is sealed between the substrates.

Pixels in a common liquid crystal display device each have a storage capacitor. The storage capacitor is used mainly to prevent feed-through voltage caused by a voltage change in the scanning line or the signal line from affecting the voltage of the pixel electrode during a hold period in which the thin film transistor is off.

The storage capacitor is implemented by, for example, the following four structures:

(1) Upper layer transparent pixel electrode/insulating film/lower layer transparent storage capacitor electrode.

(2) Upper layer transparent pixel electrode/insulating film/lower layer metal storage capacitor electrode.

(3) Upper layer metal source (or drain) electrode/insulating film/lower layer metal storage capacitor electrode.

(4) Upper layer metal source (or drain) electrode/insulating film/intermediate metal storage capacitor electrode/insulating film/lower layer polycrystalline silicon source (or drain) electrode.

The above-mentioned structure (1) is described in, for example, JP 08-179363 A, and the above-mentioned structure (4) is described in, for example, JP 2000-180900 A.

SUMMARY OF THE INVENTION

When one of the electrodes that constitute the storage capacitor is metal as in the above-mentioned structures (2) to (4), the non-transparent metal part makes it difficult to raise the aperture ratio, particularly in the case of a transmissive liquid crystal display device. It is therefore preferred to employ transparent conductive materials for both of the electrodes of the storage capacitor as in the above-mentioned structure (1).

However, reducing the pixel dimensions for the purpose of obtaining an ultra-high definition liquid crystal display panel, such as one for portable terminal that have a VGA-level resolution, accordingly reduces the area per pixel that can be used to form the electrodes of the storage capacitor. The insulating film that forms the storage capacitor can be thinned in response to the reduction in electrode area only to a limited degree, because the insulating film needs to retain a certain thickness in consideration of manufacture yield. Then allocating the entire transmissive display area in a single pixel to the electrodes of the storage capacitor that has the structure (1) is not enough to prevent the storage capacitor from being smaller.

The reduction in capacitance of the storage capacitor is more prominent in IPS liquid crystal display panels, where one of the electrodes is a planar transparent electrode and the other electrode is a comb-shaped transparent electrode which is formed above the former electrode with an insulating film sandwiched between the two. This structure (comb-shaped transparent electrode/insulating film/flat board-like transparent electrode) also functions as the storage capacitor but, since a reduction in dimensions per pixel reduces the comb teeth of the upper layer transparent electrode in length and number, the capacitance of the storage capacitor is made even smaller.

A parasitic capacitor, which is formed between the pixel electrode and the scanning line or the signal line, is also made smaller by a reduction in per-pixel dimensions due to the coupling length being shortened by the reduction. However, compared to the way the capacitance of the storage capacitor, which is almost dependent on the per-pixel area, is reduced the reduction in capacitance of the parasitic capacitor is more gradual. Rather, the parasitic capacitor is hardly reduced in capacitance since obtaining a sufficient aperture ratio requires closing the planar gap between the pixel electrode and the scanning line or the signal line (or increasing the overlapping area), which reduces the coupling interval of the parasitic capacitor. This makes it difficult to form a sufficiently large storage capacitor balanced with the parasitic capacitor even in the conventional structure (1).

If the storage capacitor is not large enough in relation to the parasitic capacitor, the voltage of the pixel electrode is easily affected by feed-through voltage, which is caused by a voltage change in the scanning line or the signal line, during a hold period in which the thin film transistor is off. The resultant problem resides in that the image quality is degraded from such phenomena as smearing and cross talk.

The present invention has been made to solve the aforementioned problems of prior art, and an object of the present invention is therefore to provide a technology with which a sufficiently large storage capacitor can be formed in a display device that has a liquid crystal display panel with fine pixel dimensions.

The above-mentioned and other objects and novel characteristics of the present invention will be clarified by the descriptions herein and the accompanying drawings.

Representative aspects of the present invention are summarized as follows.

(1) A liquid crystal display device including: a liquid crystal display panel having a first substrate, a second substrate, and a liquid crystal held between the first substrate and the second substrate, the liquid crystal display panel having multiple pixels arranged in matrix; and a transmissive display area provided in at least part of each of the pixels, having a laminated structure containing a first transparent electrode, a first insulating film, a second transparent electrode, a second insulating film, and a third transparent electrode which are laminated in this order with the first transparent electrode closest to the first substrate. The first transparent electrode and the second transparent electrode are electrically insulated from each other and together form a first storage capacitor through the first insulating film, and the second transparent electrode and the third transparent electrode are electrically insulated from each other and together form a second storage capacitor through the second insulating film.

(2) In the aspect (1), at least one of the first insulating film and the second insulating film is a laminate of multiple insulating films.

(3) In the aspect (1), the first insulating film and the second insulating film are formed from one of the same material and different materials.

(4) In the aspect (1), the first insulating film and the second insulating film have one of the same refractive index and different refractive indices.

(5) In the aspect (1), the transmissive display area provided in at least part of each of the multiple pixels has a third insulating film, which is placed on the first substrate side of the first transparent electrode.

(6) In the aspect (5), the third insulating film has a dielectric constant equal to or lower than a dielectric constant of one of the first insulating film and the second insulating film.

(7) In the aspect (5), the third insulating film is a laminate of multiple insulating films.

(8) In the aspect (5), the first insulating film, the second insulating film, and the third insulating film are formed from one of the same material and different materials.

(9) In the aspect (1), the first transparent electrode, the second transparent electrode, and the third transparent electrode are formed from one of the same material and different materials.

(10) In the aspect (1), the first transparent electrode, the second transparent electrode, and the third transparent electrode have one of the same refractive index and different refractive indices.

(11) In the aspect (1), the first transparent electrode, the second transparent electrode, and the third transparent electrode have one of the same thickness and different thicknesses.

(12) In the aspect (1), the first transparent electrode, the second transparent electrode, the third transparent electrode, the first insulating film, and the second insulating film are respectively set to such refractive indices and thicknesses that, when combined, provide a no-reflection condition with respect to at least a part of light whose wavelength is within the visible light range.

(13) In the aspect (5), the first transparent electrode, the second transparent electrode, the third transparent electrode, the first insulating film, the second insulating film, and the third insulating film are set respectively to such refractive indices and thicknesses that, when combined, provide a no-reflection condition with respect to at least a part of light whose wavelength is within the visible light range.

(14) In the aspect (1), the first transparent electrode, the second transparent electrode, and the third transparent electrode have one of the same area and different areas.

(15) In the aspect (1), an overlap between the first transparent electrode and the second transparent electrode which is measured by area is the same as, or differs from, an overlap between the second transparent electrode and the third transparent electrode which is measured by area.

(16) In the aspect (1), the first substrate has a reflective electrode in a reflective display area, which is provided in at least part of each of the multiple pixels, and the reflective electrode is electrically connected to at least one of the first transparent electrode, the second transparent electrode, and the third transparent electrode.

(17) In the aspect (1), the third transparent electrode has multiple comb-teeth electrodes, and the liquid crystal display device generates an electric field that has a component parallel to a surface of the first substrate between the third transparent electrode and the second transparent electrode, and uses the electric field to drive a liquid crystal on the surface side of the third transparent electrode.

(18) In the aspect (1), the third transparent electrode has a shape of a flat board with a slit, and the liquid crystal display device generates an electric field that has a component parallel to a surface of the first substrate between the third transparent electrode and the second transparent electrode, and uses the electric field to drive a liquid crystal on the surface side of the third transparent electrode.

(19) In the aspect (1), each of the multiple pixels has a fourth transparent electrode, which is placed on the second substrate side, and the liquid crystal display device generates an electric field between the fourth transparent electrode and the third transparent electrode, and uses the electric field to drive a liquid crystal on the surface side of the third transparent electrode.

(20) In any one of the aspects (1) to (18), each of the multiple pixels has a thin film transistor, the third transparent electrode is a counter electrode, the second transparent electrode is a pixel electrode, and the first transparent electrode is a storage capacitor electrode.

(21) In the aspect (20), the first insulating film is a laminate of a gate insulating layer and an interlayer insulating layer with the gate insulating layer placed closer to the first substrate, the third transparent electrode is connected to a common electrode wiring line, the second transparent electrode is connected to a first electrode of the thin film transistor through an opening formed in the interlayer insulating layer, and the first transparent electrode is connected to a storage capacitor wiring line.

(22) In the aspect (20), the first insulating film is a laminate of a gate insulating layer and an interlayer insulating layer with the gate insulating layer placed closer to the first substrate, the first transparent electrode is connected to a common electrode wiring line, the second transparent electrode is connected to a first electrode of the thin film transistor through an opening formed in the interlayer insulating layer, and the third transparent electrode is connected to one of the first transparent electrode and the common electrode wiring line through openings formed in the gate insulating layer, the interlayer insulating layer, and the second insulating film.

(23) In the aspect (20), the first transparent electrode is connected to a storage capacitor wiring line, the second transparent electrode is connected to a first electrode of the thin film transistor, and the third transparent electrode is connected to a common electrode wiring line.

(24) In the aspect (20), the first transparent electrode is connected to a common electrode wiring line, the second transparent electrode is connected to a first electrode of the thin film transistor, and the third transparent electrode is connected to one of the first transparent electrode and the common electrode wiring line through openings formed in the first insulating film and the second insulating film.

(25) In the aspect (20), the liquid crystal display device has an interlayer insulating layer formed above a first electrode of the thin film transistor, the first transparent electrode is formed above the interlayer insulating layer, the first transparent electrode is connected to a common electrode wiring line, the second transparent electrode is connected to the first electrode of the thin film transistor through openings formed in the interlayer insulating layer and the first insulating film, and the third transparent electrode is connected to one of the first transparent electrode and the common electrode wiring line through openings formed in the first insulating film and the second insulating film.

(26) In the aspect (20), the liquid crystal display device has an interlayer insulating layer formed above a first electrode of the thin film transistor, the first transparent electrode is formed above the interlayer insulating layer, the third transparent electrode is connected to a common electrode wiring line, the second transparent electrode is connected to the first electrode of the thin film transistor through openings formed in the interlayer insulating layer and the first insulating film, the first transparent electrode is connected to an insular transparent electrode pattern which is formed within an opening in the first insulating film, and the insular transparent electrode pattern is connected to the common electrode wiring line through an opening formed in the second insulating film.

(27) In the aspect (21) or (23), the common electrode wiring line and the storage capacitor wiring line have one of the same voltage and different voltages.

(28) In the aspect (20), the first transparent electrode in one pixel is separated from the first transparent electrode in another pixel.

(29), In the aspect (20), the first transparent electrode is one of common on a pixel row basis to be shared by pixels in one pixel row, common on a pixel column basis to be shared by pixels in one pixel column, and shared by all pixels.

(30) In the aspect (20), the third transparent electrode in one pixel is separated from the third transparent electrode in another pixel.

(31), In the aspect (20), the third transparent electrode is one of common on a pixel row basis to be shared by pixels in one pixel row, common on a pixel column basis to be shared by pixels in one pixel column, and shared by all pixels.

(32) In the aspect (20), one of the first transparent electrode and the second transparent electrode is connected to a common electrode wiring line, the common electrode wiring line is provided for each pixel row, and the common electrode wiring line in each pixel row is shared.

(33) In the aspect (20), one of the first transparent electrode and the second transparent electrode is connected to a common electrode wiring line, the common electrode wiring line is provided for each pixel row, and the common electrode wiring line in one pixel row is independent from the common electrode wiring line in another pixel row.

(34) In the aspect (21) or (23), the storage capacitor wiring line is provided for each pixel row, and the storage capacitor wiring line in each pixel row is shared.

(35) In the aspect (21) or (23), the storage capacitor wiring line is provided for each pixel row, and the storage capacitor wiring line in one pixel row is independent from the storage capacitor wiring line in another pixel row.

(36) In the aspect (20), the first transparent electrode and at least part of the first electrode of the thin film transistor form a third storage capacitor through an insulating film that is inserted between the first transparent electrode and the at least part of the first electrode of the thin film transistor.

(37) In the aspect (21) or (23), part of the capacitor storage wiring line and at least part of the first electrode of the thin film transistor form a third storage capacitor through an insulating film that is inserted between the part of the storage capacitor wiring line and the at least part of the first electrode of the thin film transistor.

(38) In any one of the aspects (1) to (19), each of the multiple pixels has a thin film transistor, the first transparent electrode and the third transparent electrode are pixel electrodes, and the second transparent electrode is a counter electrode.

(39) In the aspect (38), the first transparent electrode is connected to a first electrode of the thin film transistor, the second transparent electrode is connected to a common electrode wiring line, and the third transparent electrode is connected to the first electrode of the thin film transistor through openings formed in the first insulating film and the second insulating film.

(40) In the aspect (38), the first insulating film is a laminate of a gate insulating layer and an interlayer insulating layer with the gate insulating layer placed closer to the first substrate, the first transparent electrode is connected to a first electrode of the thin film transistor through an opening formed in the gate insulating layer, the second transparent electrode is connected to a common electrode wiring line, and the third transparent electrode is connected to the first electrode of the thin film transistor through openings formed in the interlayer insulating layer and the second insulating film.

(41) In the aspect (38), the liquid crystal display device has an interlayer insulating layer formed above a first electrode of the thin film transistor, the first transparent electrode is formed above the interlayer insulating layer, the first transparent electrode is connected to the first electrode of the thin film transistor through an opening formed in the interlayer insulating layer, the second transparent electrode is connected to a common electrode wiring line, and the third transparent electrode is connected to the first transparent electrode through openings formed in the first insulating film and the second insulating film.

(42) In the aspect (38), the first insulating film is a laminate of a gate insulating layer and an interlayer insulating layer with the gate insulating layer placed closer to the first substrate, the first transparent electrode is connected to the third transparent electrode through openings formed in the gate insulating layer, the interlayer insulating layer, and the second insulating film, the second transparent electrode is connected to a common electrode wiring line, and the third transparent electrode is connected to a first electrode of the thin film transistor through openings formed in the interlayer insulating layer and the second insulating film.

(43) In the aspect (38), the second transparent electrode in one pixel is separated from the second transparent electrode in another pixel.

(44) In the aspect (38), the second transparent electrode is one of common on a pixel row basis to be shared by pixels in one pixel row, common on a pixel column basis to be shared by pixels in one pixel column, and shared by all pixels.

(45) In the aspect (38), the second transparent electrode is connected to a common electrode wiring line, the common electrode wiring line is provided for each pixel row, and the common electrode wiring line in each pixel row is shared.

(46) In the aspect (38), the second transparent electrode is connected to a common electrode wiring line, the common electrode wiring line is provided for each pixel row, and the common electrode wiring line in one pixel row is independent from the common electrode wiring line in another pixel row.

(47) In the aspect (38), the liquid crystal display device has a storage capacitor wiring line formed on the first substrate side of the first electrode of the thin film transistor, and part of the capacitor storage wiring line and at least part of the first electrode of the thin film transistor form a third storage capacitor through an insulating film that is inserted between the part of the storage capacitor wiring line and the at least part of the first electrode of the thin film transistor.

An effect obtained from the representative embodiments of the present invention disclosed in this application is summarized as follows.

According to the present invention, a sufficiently large storage capacitor can be formed in a liquid crystal display device that has a liquid crystal display panel with fine pixel dimensions.

DETAILED DESCRIPTION OF THE INVENTION

Embodiments of the present invention will be described below in detail with reference to the accompanying drawings.

Throughout the drawings illustrating the embodiments, components that have an identical function are denoted by the same reference symbol in order to avoid repetitive descriptions.

[Basic Structure]

Figure 1A:
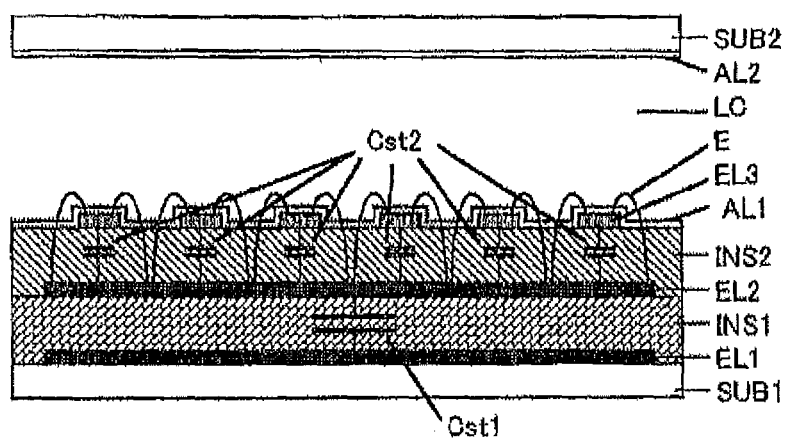
FIGS. 1A and 1B are sectional views showing a basic sectional structure of a main part of a pixel in a liquid crystal display device according to a mode of carrying out the present invention.
Figure 1B:
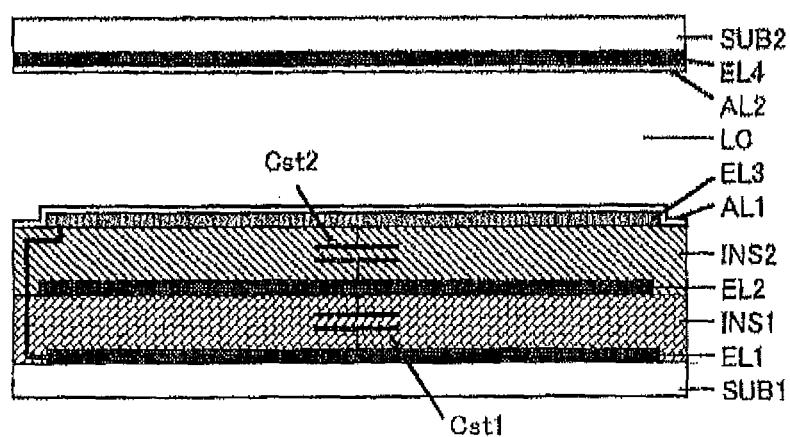

FIGS. 1A and 1B show a basic sectional structure of a main part of a pixel in a liquid crystal display device according to a mode of carrying out the present invention. Shown in FIG. 1A is a case where the present invention is applied to an IPS liquid crystal display device, and shown in FIG. 1B is a case where the present invention is applied to a vertical-field driven liquid crystal display device. In either case, a transmissive display area provided in at least a part of each pixel has a laminated structure in which a first transparent electrode EL1 is put on a first substrate SUB1 and then a first insulating film INS1, a second transparent electrode EL2, a second insulating film INS2, a third transparent electrode EL3, a first alignment film AL1, a liquid crystal layer LC, a second alignment film AL2, and a second substrate SUB2 are laminated on top of the first transparent electrode EL1 in the order stated.

In the case where the liquid crystal display device displays color images, the above-mentioned pixels correspond to sub-pixels. In the following description, one sub-pixel in the case of color image display is treated as one pixel.

The first transparent electrode EL1 and the second transparent electrode EL2 are electrically insulated from each other, and together form a first storage capacitor Cst1 through the first insulating film INS1. The second transparent electrode EL2 and the third transparent electrode EL3 are electrically insulated from each other, and together form a second storage capacitor Cst2 through the second insulating film INS2.

As described in the following embodiments, the first storage capacitor Cst1 and the second storage capacitor Cst2 may have the same capacitance or different capacitances. The transmissive display area may further have a third insulating film INS3, which is placed below the first transparent electrode EL1, though not shown in FIGS. 1A and 1B.

The first, second, and third insulating films (INS1 to INS3) may each be a laminate constituted of multiple insulating films. The first, second, and third insulating films (INS1 to INS3) may have the same material, dielectric constant, refractive index, and thickness, or may have different materials, dielectric constants, refractive indices, and thicknesses. The dielectric constant of the third insulating film INS3 is desirably equal to or lower than the dielectric constant of the first insulating film INS1 or of the second insulating film INS2.

The first, second, and third transparent electrodes (EL1 to EL3) may have the same material, refractive index, thickness, and area or may have different materials, refractive indices, thicknesses, and areas. Desirably, the refractive indices and thicknesses of the first, second, and third transparent electrodes (EL1 to EL3) and the first, second, and third insulating films (INS1 to INS3) are set so as to, when combined, provide a no-reflection condition with respect to at least some of light whose wavelength is within the visible light range, respectively.

In the IPS liquid crystal display device of FIG. 1A, the third transparent electrode EL3 has a comb teeth shape in plan view, and the liquid crystal layer LC is driven by an electric field E, which is generated between the third transparent electrode EL3 and the second transparent electrode EL2. The shape of the third transparent electrode EL3 may instead be like a slip, or a flat board with a slit, or a flat board with an opening. In the case of a reflective or transflective liquid crystal display device that employs an IPS display mode, a reflective electrode provided in a reflective display area, which is provided in at least a part of each pixel, is electrically connected to at least one of the first transparent electrode EL1 and the second transparent electrode EL2. The first to third transparent electrodes (EL1 to EL3) can be used in the following two ways:

(1) The second transparent electrode EL2 in one pixel is separated from the second transparent electrode EL2 in another pixel to serve as a pixel electrode, whereas the first transparent electrode EL1 serves as a storage capacitor electrode and the third transparent electrode EL3 serves as a counter electrode. The first transparent electrode EL1 and the third transparent electrode EL3 may be electrically connected to or electrically insulated from each other. In the case where the first transparent electrode EL1 and the third transparent electrode EL3 are electrically insulated from each other, the first transparent electrode EL1 and the third transparent electrode EL3 may have the same voltage or different voltages. In the case of a reflective or transflective liquid crystal display device that employs an IPS display mode, particularly when the reflective electrode is connected to the first transparent electrode EL1, the reflective electrode may double as a storage capacitor wiring line.

(2) The first transparent electrode EL1 and the third transparent electrode EL3 in one pixel are separated from the first and third transparent electrodes EL1 and EL3 in another pixel, and are electrically connected to each other to serve as pixel electrodes, whereas the second transparent electrode EL2 serves as a counter electrode. The second transparent electrode EL2 in this case doubles as a storage capacitor electrode. In the case of a reflective or transflective liquid crystal display device that employs an IPS display mode, particularly when the reflective electrode is connected to the second transparent electrode EL2, the reflective electrode may double as a storage capacitor wiring line.

The vertical-field driven liquid crystal display device of FIG. 1B has a fourth transparent electrode EL4, which is shaped like a flat board in plan view, between the second alignment film AL2 and the second substrate SUB2 as a counter electrode. The first transparent electrode EL1 and the third transparent electrode EL3 in one pixel are separated from the first and third transparent electrodes EL1 and EL3 in another pixel, and are electrically connected to each other. The third transparent electrode EL3 serves as a pixel electrode that is shaped like a flat board in plan view. The liquid crystal layer LC is driven by an electric field generated between the third transparent electrode EL3 and the fourth transparent electrode EL4. The shapes of the third transparent electrode EL3 and the fourth transparent electrode EL4 in plan view may be like a flat board with a slit or a flat board with an opening.

In the vertical-field driven liquid crystal display device, the second transparent electrode EL2 serves as a storage capacitor electrode, and the second transparent electrode EL2 and the fourth transparent electrode EL4 may have the same voltage or different voltages. In the case of a reflective or transflective liquid crystal display device that employs a vertical-field driven liquid crystal display mode, a reflective electrode provided in a reflective display area, which is provided in at least part of each pixel, is electrically connected to at least one of the first to third transparent electrodes EL1 to EL3. The reflective electrode may double as a storage capacitor wiring line, particularly when connected to the second transparent electrode EL2. The vertical-field driven liquid crystal display mode discussed here may be a known technology such as the VA mode, the TN mode, the ECB mode, the OCB mode, and the polymer dispersed type.

Embodiments in which the above-mentioned basic structure is applied to an active matrix liquid crystal display device with thin film transistors will now be described.

First Embodiment

A first embodiment of the present invention, as well as second to sixth embodiments of the present invention which will be described later, deals with an IPS liquid crystal display device in which the second transparent electrode EL2 serves as a pixel electrode, whereas the first transparent electrode EL1 and the third transparent electrode EL3 serve as a storage capacitor electrode and as a counter electrode, respectively.

Figure 2A:
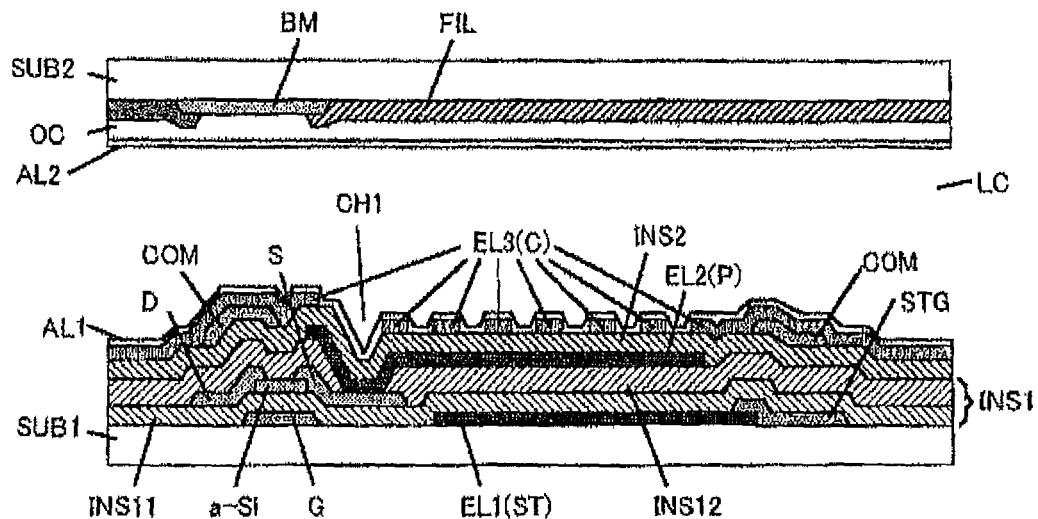
FIGS. 2A and 2B are schematic diagrams showing a pixel structure in a liquid crystal display device according to a first embodiment of the present invention.
Figure 2B:
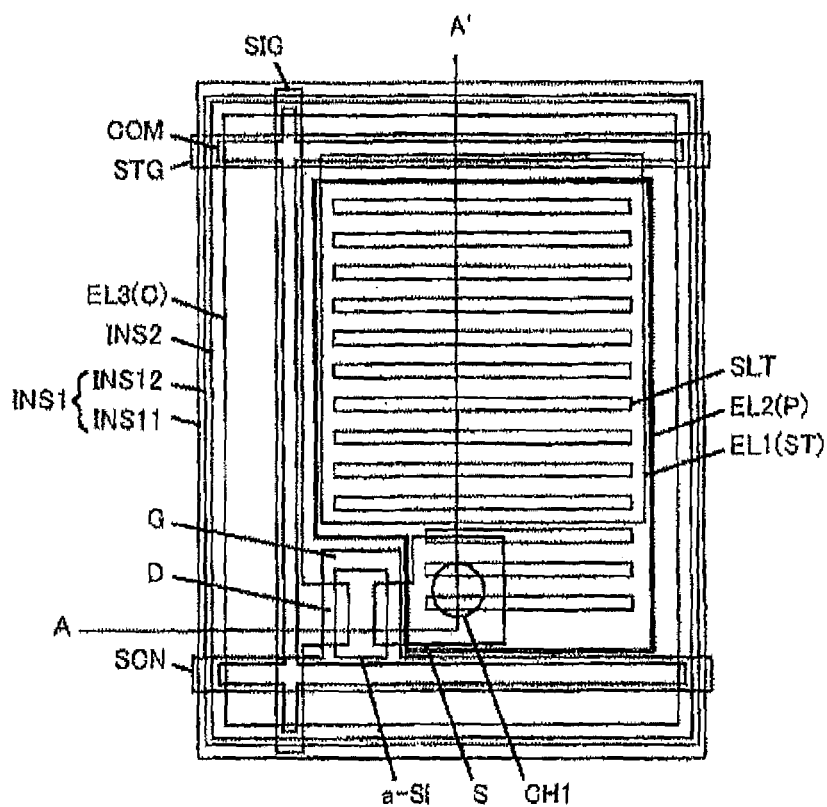

FIGS. 2A and 2B are schematic diagrams showing a pixel structure in the liquid crystal display device according to the first embodiment of the present invention. FIG. 2A shows the sectional structure of a pixel and FIG. 2B shows the plan view structure of the pixel on the TFT substrate side. The sectional structure shown in FIG. 2A corresponds to a view taken along the line A-A' shown in FIG. 2B.

On the first substrate SUB1, scanning lines SCN and as many storage capacitor wiring lines STG are provided so that the former and the latter are associated with each other on a one-on-one basis. Signal lines SIG intersect with the scanning lines SCN and the storage capacitor wiring lines STG with a gate insulating film INS11 interposed therebetween. Each pixel defined by the intersecting scanning lines SCN and signal lines SIG is provided with a thin film transistor TFT, a transparent storage capacitor electrode EL1 (ST), which functions as the first transparent electrode, and a transparent pixel electrode EL2 (P), which functions as the second transparent electrode. The transparent storage capacitor electrode EL1 (ST) and the transparent pixel electrode EL2 (P) have different areas as shown in FIG. 2B.

The storage capacitor wiring line STG and the transparent storage capacitor electrode EL1 (ST) partially overlap each other to be electrically connected to each other. A gate electrode G of the thin film transistor TFT is connected to the scanning line SCN, a drain electrode D of the thin film transistor TFT is connected to the signal line SIG, and a source electrode S of the thin film transistor TFT is connected to the transparent pixel electrode EL2 (P) through an opening (contact hole) CH1 formed in a passivation film INS12.

A laminate constituted of the passivation film INS12 and the gate insulating film INS11 is used as the first insulating film INS1. Through the first insulating film INS1, the first storage capacitor Cst1 is formed between the transparent storage capacitor electrode EL1 (ST) and the transparent pixel electrode EL2 (P).

Formed above those electrodes are the second insulating film INS2, which serves as an interlayer insulating film, a common electrode wiring line COM, which is shaped after the shape of the storage capacitor wiring line STG and the signal line SIG, and a transparent counter electrode EL3 (C), which functions as the third transparent electrode. The second storage capacitor Cst2 is formed between the transparent pixel electrode EL2 (P) and the transparent counter electrode EL3 (C) through the second insulating film INS2, whereby the TFT substrate is obtained.

The transparent counter electrode EL3 (C) and the common wiring line COM directly overlap each other to be electrically connected to each other and thereby lower the overall resistance of the counter electrode. The first alignment film AL1 for aligning the liquid crystal layer LC in a given direction is formed in the topmost layer on the TFT substrate.

On the second substrate SUB2, a light shielding film (black matrix) BM, a color filter FIL whose color varies from one pixel to another, a protective film (overcoat) OC, and the second alignment film AL2 are formed to obtain a counter substrate.

The first alignment film AL1 and the second alignment film AL2 are each processed in advance so that liquid crystal molecules are aligned in a given direction. The first substrate SUB1 and the second substrate SUB2 are arranged such that their alignment film formation faces are opposed to each other across a predetermined interval, and the gap between the two is filled with a nematic liquid crystal composition having a positive dielectric anisotropy to form the liquid crystal layer LC.

The transparent counter electrode EL3 (C) above the transparent pixel electrode EL2 (P) has multiple slit-like openings SLT which run parallel to one another, and hence an electric field having a component parallel to the surface of the first substrate SUB1 is generated between the transparent pixel electrode EL2 (P) and the transparent counter electrode EL3 (C) through the liquid crystal layer LC. The liquid crystal layer LC is driven by this electric field.

A retardation plate and polarization plate (not shown) are disposed outside of the first substrate SUB1 and the second substrate SUB2 to obtain a normally black (NB) display mode liquid crystal display device. Drive circuits (not shown) are connected to the scanning lines SCN, the storage capacitor wiring lines STG, the signal lines SIG, and the common electrode wiring lines COM.

Figure 3:
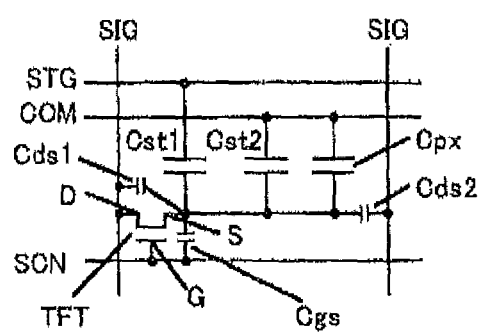
FIG. 3 is a circuit diagram showing an equivalent circuit that represents a single pixel in the liquid crystal display device according to the first embodiment and in a liquid crystal display device according to a third embodiment of the present invention.

FIG. 3 shows an equivalent circuit that represents a single pixel in the liquid crystal display device according to the first embodiment. The transparent pixel electrode EL2 (P), or the source electrode S, is provided with a parasitic capacitor Cgs, which is formed between the gate (G) and source (S) of the thin film transistor TFT, and parasitic capacitors Cds1 and Cds2, which are formed by the transparent pixel electrode EL2 (P) and the signal lines SIG, in addition to the first storage capacitor Cst1, the second storage capacitor Cst2, and a pixel capacitor Cpx.

When the pixel dimensions are reduced to obtain fine pixels, an equivalent storage capacitor sufficiently large in relation to the parasitic capacitors including Cgs, Cds1, Cds2, and the like can be formed from the parallel capacitance of the first storage capacitor Cst1 and the second storage capacitor Cst2. This makes the voltage of the transparent pixel electrode EL2 (P) less susceptible to feedthrough voltage, which is caused by a voltage change in the scanning line SCN or the signal line SIG, during a hold period in which the thin film transistor TFT is off. Phenomena called smearing and cross talk can thus be reduced.

It also reduces the leakage of electric charges accumulated in the transparent pixel electrode EL2 (P) and the source electrode (S) during a hold period. Accordingly, the electric field applied to the liquid crystal layer LC drops less and degradation in image quality can be prevented.

Furthermore, since the first storage capacitor Cst1 and the second storage capacitor Cst2 are constituted of the transparent storage capacitor electrode EL1 (ST), the first insulating film INS1, the transparent pixel electrode EL2 (P), the second insulating film INS2, and the transparent counter electrode EL3 (C), which are all transparent, forming a storage capacitor that is sufficiently large in relation to the parasitic capacitor does not lower the aperture ratio of the transmissive display portion. The formation of a sufficiently large storage capacitor and the securing of a sufficiently high aperture ratio are thus accomplished simultaneously. Those effects of the first embodiment are shared by the second to sixth embodiments and an eleventh embodiment which will be described later.

In this embodiment and the third embodiment described later, the storage capacitor wiring line STG in one pixel row and the storage capacitor wiring line STG in another pixel row may receive voltage application independently of each other or commonly. The common electrode wiring line COM and the transparent counter electrode EL3 (C) in one pixel row may receive voltage application independently of those in another pixel row, or the common electrode wiring line COM and the transparent counter electrode EL3 (C) in one pixel column may receive voltage application independently of those in another pixel column, though, from the standpoint of reducing the resistance of the counter electrode, it is preferred to connect the common electrode wiring line COM and the transparent counter electrode EL3 (C) in one pixel to those in adjacent pixels so that a voltage is applied commonly to all pixels. The voltage of the storage capacitor wiring line STG and the voltage of the common electrode wiring line COM may be the same, which does not mean that the two always need to match.

FIGS. 4A to 4H show steps of manufacturing the TFT substrate in the liquid crystal display device according to the first embodiment.

Figure 4A:
FIGS. 4A to 4H are diagrams showing steps of manufacturing a TFT substrate in the liquid crystal display device according to the first embodiment of the present invention.

In FIG. 4A, a film is formed from a transparent conductive material such as ITO on the first substrate SUB1, which is a transparent insulating member such as a glass substrate. The film is treated by a photolithography process to form the transparent storage capacitor electrode EL1 (ST).

Figure 4B:

In FIG. 4B, a film is formed from a metal material to form the gate electrode G, the scanning line SCN (not shown), and the storage capacitor wiring line STG simultaneously by a photolithography process. This layer is called a gate layer. Part of the transparent storage capacitor electrode EL1 (ST) is overlapped with part of the storage capacitor wiring line STG, and hence the transparent storage capacitor electrode EL1 (ST) and the storage capacitor wiring line STG are electrically connected to each other.

Figure 4C:

In FIG. 4C, the gate insulating film INS11, which is made of a transparent insulating material such as SiN, SiO, or TaO, and a semiconductor layer a-Si, which is made of amorphous silicon, are formed in succession, and only the semiconductor layer a-Si is treated by a photolithography process. A heavily doped n-type thin film (not shown) is present on the top face of the semiconductor layer a-Si.

Figure 4D:
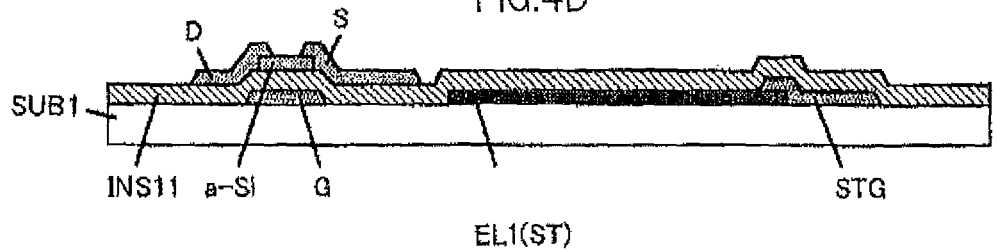

In FIG. 4D, a film is formed from a metal material to form the source electrode S, the drain electrode D, and the signal line SIG (not shown) simultaneously by a photolithography process. This layer is called a drain layer. The heavily doped n-type layer which is not covered with the drain layer is removed at the same time when the drain layer is treated.

Figure 4E:
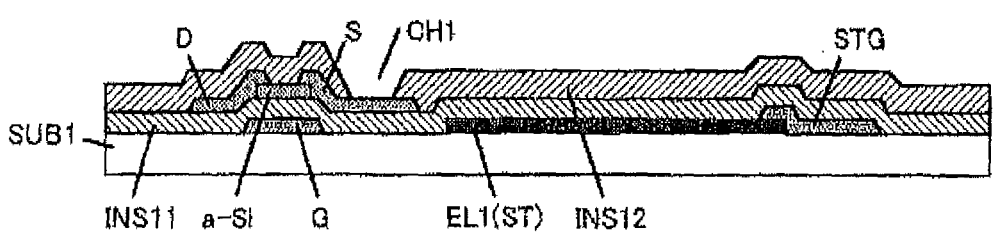

In FIG. 4E, the passivation film INS12 is formed from SiN. The passivation film INS12 and the gate insulating film INS11 are treated at once by a photolithography process. The opening CH1 is formed in a portion of the passivation film INS12 that is located above the source electrode S.

Figure 4F:
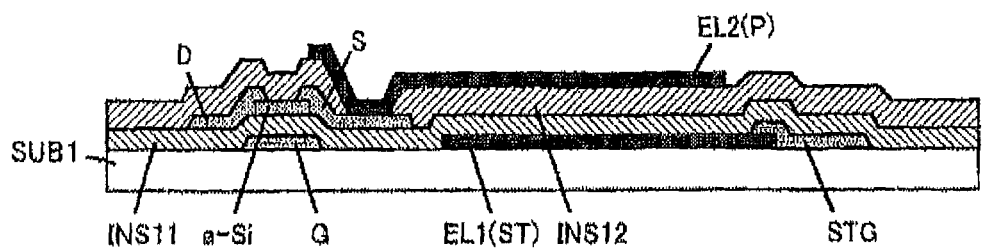

In FIG. 4F, a film is formed from a transparent conductive material such as ITO and is treated by a photolithography process to form the transparent pixel electrode EL2 (P). The transparent pixel electrode EL2 (P) is electrically connected to the source electrode S through the opening CH1 in the passivation film INS12. A region in which the transparent storage capacitor electrode EL1 (ST) and the transparent pixel electrode EL2 (P) overlap each other through the laminate constituted of the gate insulating film INS11 and the passivation film INS12 serves as the first storage capacitor Cst1.

Figure 4G:
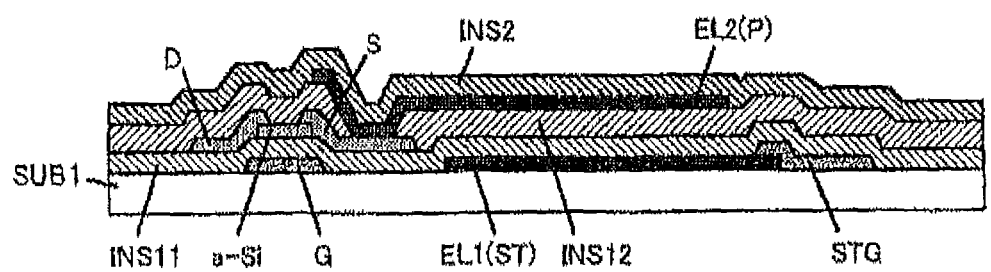

In FIG. 4G, the second insulating film INS2 is formed from SiN and is treated by a photolithography process. By this photolithography process, a pixel portion is not patterned, whereas openings are opened in terminal portions and interlayer connection portions.

Figure 4H:
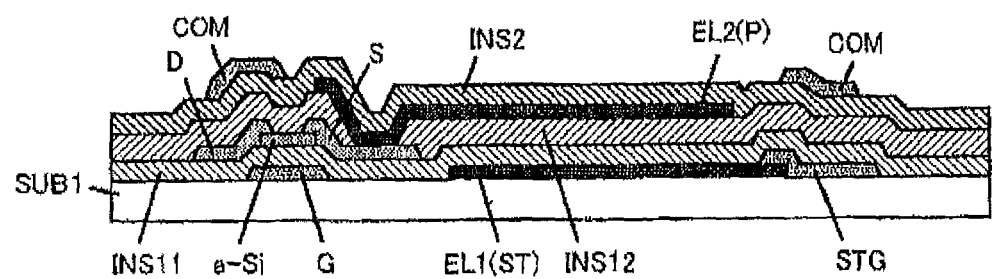

In FIG. 4H, a film is formed from a metal material and is treated by a photolithography process to form the common electrode wiring line COM.

Lastly, a film is formed from a transparent conductive material such as ITO to cover the common electrode wiring line COM, and is treated by a photolithography process to form the transparent counter electrode EL3 (C) as the one shown in FIG. 2A. The TFT substrate is thus manufactured by conducting a photolithography process nine times in total.

The steps of FIGS. 4A to 4F can be adopted from, for example, a manufacturing process of an IPS liquid crystal display device in which a comb-like pixel electrode, or a pixel electrode having a slit, is formed on a planar counter electrode (C) with an interlayer insulating film interposed between the electrodes. Then, three subsequent steps are added to the steps of FIGS. 4A to 4F.

The order in which the steps of FIGS. 4A and 4B are executed may be reversed as long as the transparent storage capacitor electrode EL1 (ST) and the storage capacitor wiring line STG are electrically connected to each other.

Figure 35A:
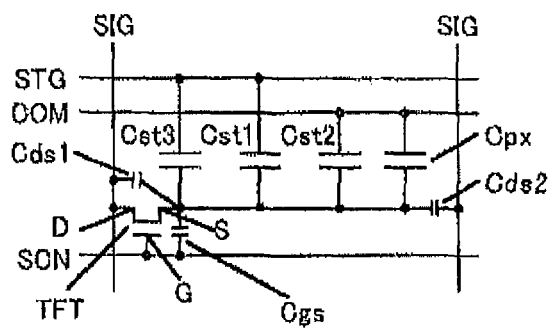
FIGS. 35A to 35C are circuit diagrams showing modification examples of the equivalent circuits that represent a single pixel in the liquid crystal display devices according to the first to tenth embodiments of the present invention.

In the first embodiment and the third embodiment described later, a third storage capacitor Cst3 may be formed in a region where the transparent storage capacitor electrode EL1 (ST), or the storage capacitor wiring line STG formed in the gate layer, overlaps with the source electrode S with the gate insulating film INS11 interposed between the two by letting the transparent storage capacitor electrode EL1 (ST) or the storage capacitor wiring line STG slip in under the source electrode S. In this case, the third storage capacitor Cst3 constitutes an equivalent circuit connected in parallel to the first storage capacitor Cst1 as shown in FIG. 35A.

Figure 5A:
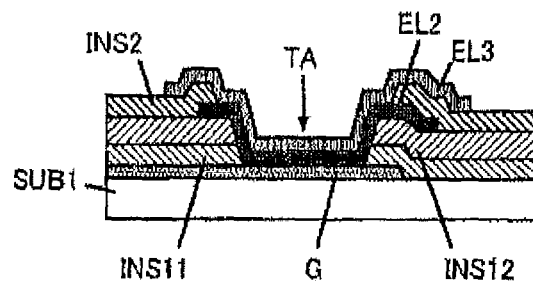
FIGS. 5A to 5D are sectional views showing the sectional structures of terminal portions and interlayer connection portions of the TFT substrate in the liquid crystal display device according to the first embodiment of the present invention.
Figure 5B:
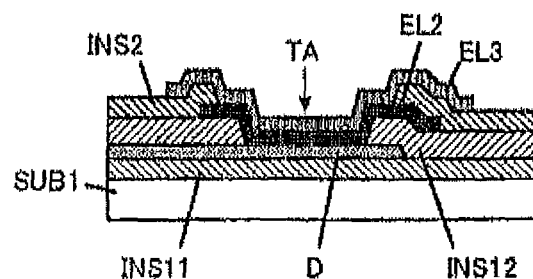
Figure 5C:
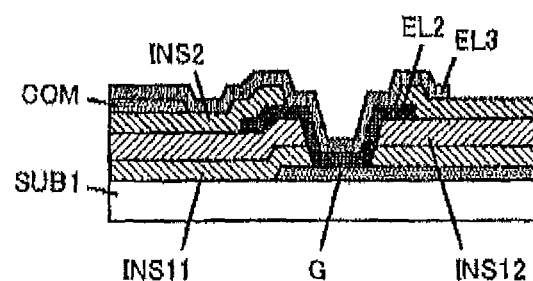
Figure 5D:
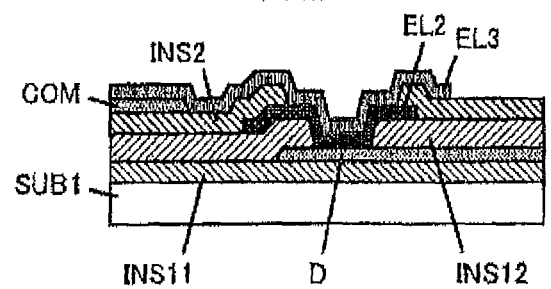

The sectional structures of the terminal portions and the interlayer connection portions that are formed by the manufacturing steps of the first embodiment are shown in FIGS. 5A to 5D. FIG. 5A shows terminal portions of the scanning line SCN and the storage capacitor wiring line STG which are formed in the gate layer. FIG. 5B shows a terminal portion of the signal line SIG which is formed in the drain layer. FIG. 5C shows a connection portion between the common electrode wiring line COM and the gate layer. FIG. 5D shows a connection portion between the common electrode wiring line COM and the drain layer. In FIGS. 5A and 5B, TA represents a terminal portion as in FIGS. 11A and 11B, FIGS. 14A and 14B, FIGS. 17A to 17D, FIGS. 20A and 20B, FIGS. 23A and 23B, FIGS. 26A and 26B, and FIGS. 29A and 29B, which will be described later.

The transparent electrode EL2 is formed as shown in the drawings in order to prevent the treatment of the second insulating film INS2 from disturbing the gate insulating film INS11 and the passivation film INS12 and in order to prevent the treatment of the common electrode wiring line COM from disturbing the gate layer and the drain layer.

The structure of the first embodiment and the structures of the second to eleventh embodiments described later can also be applied to a reflective or transflective liquid crystal display device of IPS display mode. In that case, a reflective electrode is formed in part of the transparent storage capacitor electrode EL1 (ST) or part of the transparent pixel electrode EL2 (P) to be used as a reflective display portion, which may be provided with a liquid crystal layer thickness adjusting layer. Using a part of the storage capacitor wiring line STG and a part of the common electrode wiring line COM for the reflective electrode is particularly preferred because it does not increase the number of the manufacturing steps.

The structures of those embodiments are also applicable to a liquid crystal display device that has both, within one pixel, an IPS display mode transmissive display portion of NB display mode and an IPS display mode reflective display portion of normally white (NW) display mode.

In this embodiment and all the embodiments described later, the transparent conductive material employed may be SnO, InZnO, ZnO, or the like instead of ITO. The transparent storage capacitor electrode EL1 (ST), the transparent pixel electrode EL2 (P), and the transparent counter electrode EL3 (C) are desirably set to thicknesses that are appropriate in terms of manufacture yield and that are appropriate in terms of optical design.

The gate layer, the drain layer, and the common electrode wiring line COM may also employ Al, Cr, Cu, Mo, Nd, Ta, Ti, W, Zr and other similar metal materials, or an alloy of those materials.

The gate insulating film INS11, the passivation film INS12, and the second insulating film INS2 may be formed from SiO or TaO instead of SiN, or may also be a laminate of SiO and TaO layers, or may partially contain an organic insulating material such as photosensitive acrylic resin.

The gate insulating film INS11, the passivation film INS12, and the second insulating film INS2 are desirably set to thicknesses that are appropriate in terms of manufacture yield as well as characteristics and reliability for a thin film transistor TFT and a liquid crystal display device, and that are appropriate in terms of optical design.

The semiconductor layer may be formed from polycrystalline silicon, an organic semiconductor, crystalline silicon, or the like instead of amorphous silicon.

The shape in plan view of the transparent counter electrode EL3 (C), which is located closest to the liquid crystal layer LC, may be like a slip or comb-teeth instead of a shape with multiple slit-like openings SLT which are parallel to one another. The transparent counter electrode EL3 (C) may also have a shape in plan view that makes it possible to generate an electric field in multiple different field directions, and hence the liquid crystal layer LC can change to multiple domains having different alignment directions upon application of an electric field to the liquid crystal layer LC.

How the layers are treated does not need to be limited to a photolithography process, and printing, ink jet, or the like may be employed. The dielectric anisotropy of the liquid crystal composition may also be negative, and the liquid crystal composition does not always need to be a nematic liquid crystal, depending on the display mode.

Second Embodiment

Figure 6A:
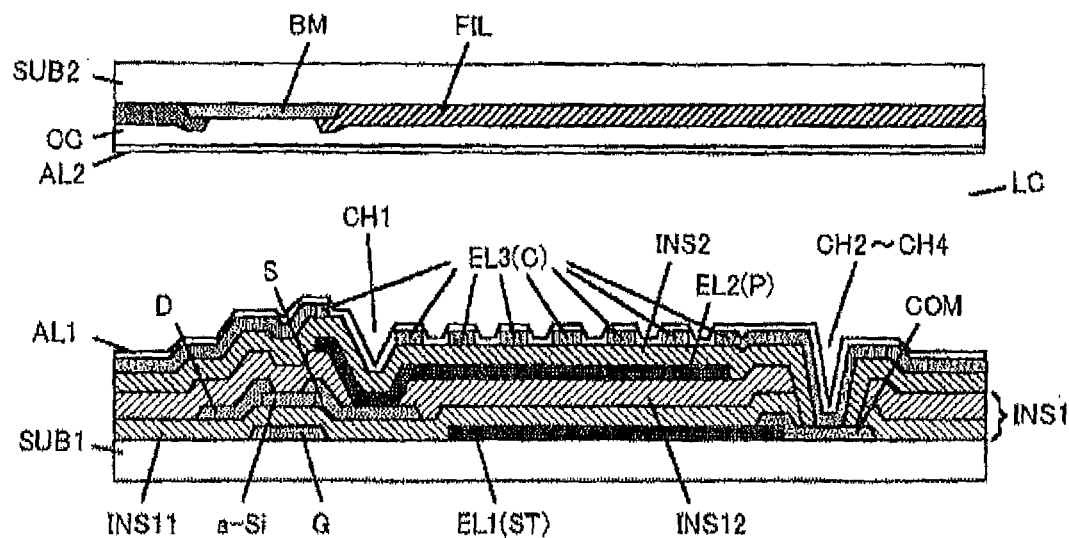
FIGS. 6A and 6B are schematic diagrams showing a pixel structure in a liquid crystal display device according to a second embodiment of the present invention.
Figure 6B:
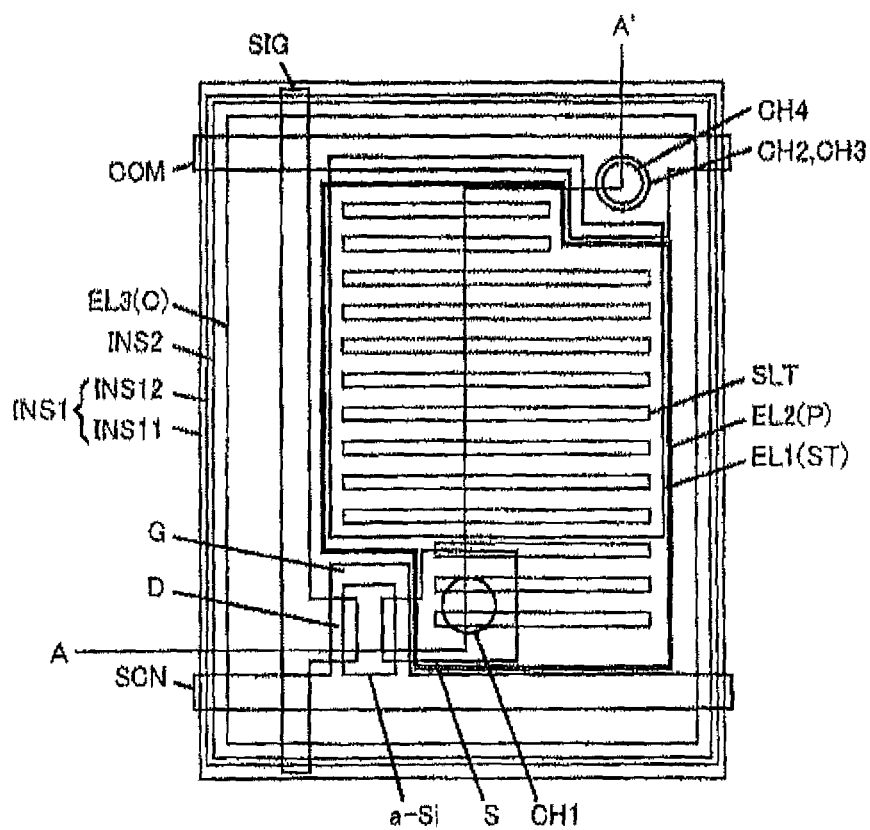

FIGS. 6A and 6B are schematic diagrams showing a pixel structure in a liquid crystal display device according to the second embodiment of the present invention. Shown in FIG. 6A is the sectional structure of a pixel, and shown in FIG. 6B is the plan view structure of the pixel on the TFT substrate side. The sectional structure of FIG. 6A corresponds to a view taken along the line A-A' shown in FIG. 6B.

The difference from the first embodiment is that, instead of using the common electrode wiring line COM between the transparent counter electrode EL3 (C) and the second insulating film INS2, the second embodiment makes the storage capacitor wiring line STG formed in the gate layer double as the common electrode wiring line COM.

The transparent counter electrode EL3 (C) in the second embodiment is reduced in resistance as in the first embodiment by forming openings (contact holes CH2 to CH4) in a portion of the gate insulating film INS 11, a portion of the passivation film INS12, and a portion of the second insulating film INS2 that are located above the common electrode wiring line formed in the gate layer, and by connecting the transparent counter electrode EL3 (C) to the common electrode wiring line COM through the openings (CH2 to CH4).

Figure 7:
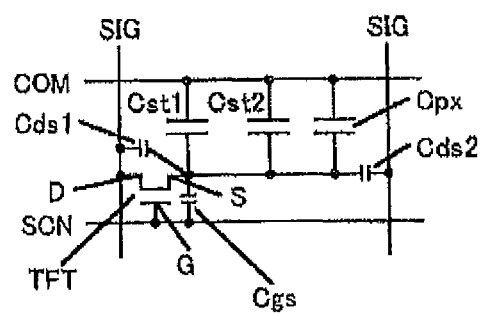
FIG. 7 is a circuit diagram showing an equivalent circuit that represents a single pixel in the liquid crystal display device according to the second embodiment and in liquid crystal display devices according to a fourth, fifth, sixth, seventh, eighth, ninth, and tenth embodiments of the present invention.

An equivalent circuit per pixel in the second embodiment, where the storage capacitor wiring line STG doubles as the common electrode wiring line COM, is as shown in FIG. 7.

In the second embodiment, an equivalent storage capacitor sufficiently large in relation to the parasitic capacitors including Cgs, Cds1, and Cds2 can also be formed from the parallel capacitance of the first storage capacitor Cst1 and the second storage capacitor Cst2, and the same effects as in the first embodiment can be attained.

In this embodiment and the fourth embodiment described later, a voltage may be applied commonly to the common electrode wiring line COM in one pixel row and the common electrode wiring line COM in another pixel row, or the common electrode wiring line COM and the transparent counter electrode EL3 (C) in one pixel row may be separated from those in another pixel row to receive voltage application independently of the other pixel row.

In FIG. 6B, the openings (CH2 to CH4) are formed in the gate insulating film INS11, the passivation film INS12, and the second insulating film INS2 as a connection portion between the transparent counter electrode EL3 (C) and the common electrode wiring line COM. The transparent counter electrode EL3 (C) accordingly has a smaller region where the slit-like openings SLT are provided to apply an electric field to the liquid crystal layer LC, and the aperture ratio is lowered compared to FIG. 2B. However, the structure of FIG. 6B has an advantage over the structure of FIG. 2B in that the number of TFT substrate manufacturing steps in the second embodiment is one step less than in the first embodiment as described below.

FIGS. 8A to 8G show steps of manufacturing the TFT substrate in the liquid crystal display device according to the second embodiment. FIGS. 8A to 8D are the same as FIGS. 4A to 4D described in the first embodiment.

Figure 8A:
FIGS. 8A to 8G are diagrams showing steps of manufacturing a TFT substrate in the liquid crystal display device according to the second embodiment of the present invention.
Figure 8B:
Figure 8C:
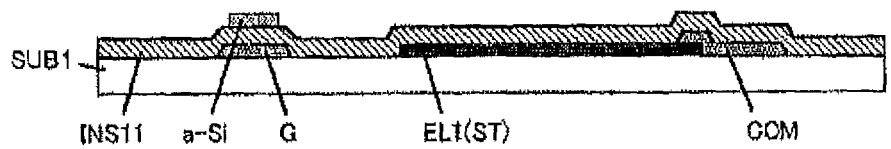
Figure 8D:
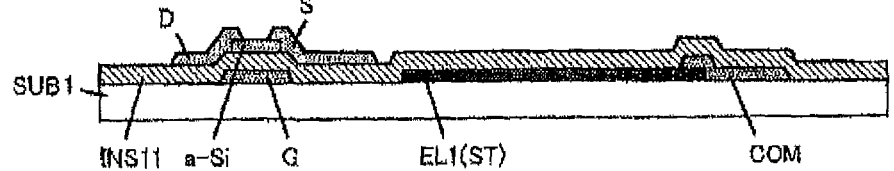
Figure 8E:
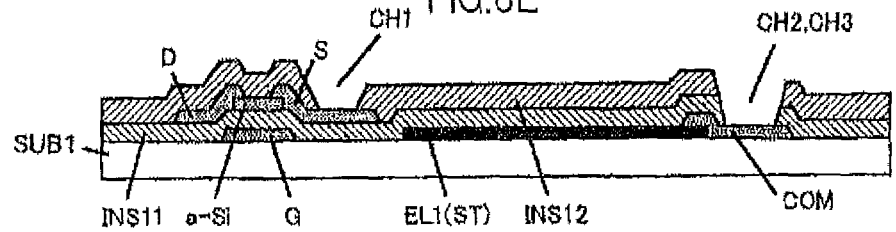

FIG. 8E is similar to FIG. 4E except that the openings (CH2 and CH3) are formed in a portion of the gate insulating film INS11 and a portion of the passivation film INS12 that are located above the common electrode wiring line COM, in addition to forming the opening CH1 in a portion of the passivation film INS12 that is located above the source electrode S, by treating the gate insulating film INS11 and the passivation film INS12 at once.

Figure 8F:
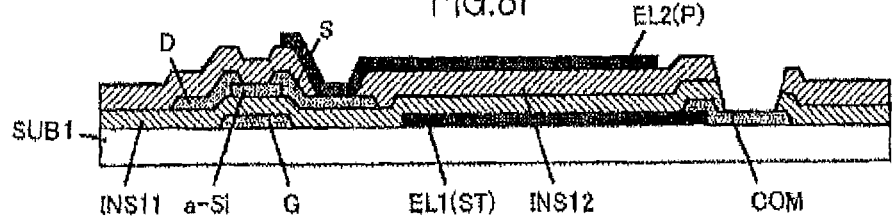

The step of FIG. 8F is the same as the step of FIG. 4F.

Figure 8G:
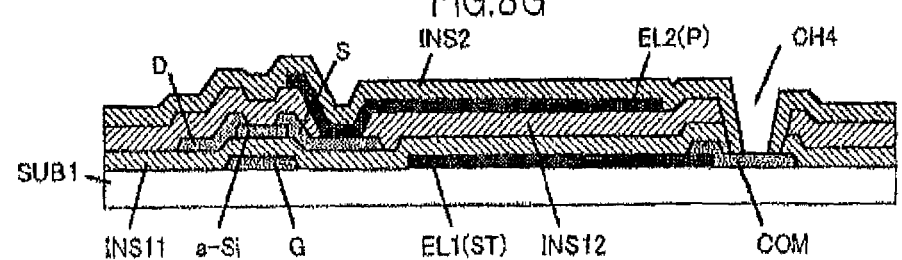

FIG. 8G is similar to FIG. 4G except that, when the second insulating film INS2 is treated, an opening CH4 is formed in a portion of the second insulating film INS2 that is within the openings (CH2 and CH3) of the gate insulating film INS11 and the passivation film INS12, thereby exposing the surface of the common electrode wiring line COM in the gate layer. Thereafter, a step corresponding to FIG. 4H is skipped, and a film is formed from a transparent conductive material such as ITO and treated by a photolithography process to form the transparent counter electrode EL3 (C) as the one shown in FIG. 6A.

The transparent counter electrode EL3 (C) and the common electrode wiring line COM are electrically connected to each other through the openings (CH2 to CH4) in the gate insulating film INS11, the passivation film INS12, and the second insulating film INS2.

The TFT substrate is thus manufactured by conducting a photolithography process eight times in total.

As in the first embodiment, the steps of FIGS. 8A to 8F can be adopted from a manufacturing process of an IPS liquid crystal display device in which a comb-like pixel electrode (P), or a pixel electrode (P) having a slit, is formed on a planar counter electrode (C) with an interlayer insulating film interposed between the electrodes. Then, two subsequent steps are added to the steps of FIGS. 8A to 8F.

As in the first embodiment, the order in which the steps of FIGS. 8A and 8B are executed may be reversed as long as the transparent storage capacitor electrode EL1 (ST) and the common electrode wiring line COM are electrically connected to each other.

In this embodiment and the fourth embodiment described later, a third storage capacitor Cst3 may also be formed in a region where the transparent storage capacitor electrode EL1 (ST), or the common electrode wiring line COM formed in the gate layer, overlaps the source electrode S with the gate insulating film INS11 interposed between the two by letting the transparent storage capacitor electrode EL1 (ST) or the common electrode wiring line COM slip in under the source electrode S. In this case, the third storage capacitor Cst3 constitutes an equivalent circuit connected in parallel to the first storage capacitor Cst1, the second storage capacitor Cst2, and the pixel capacitor Cpx as shown in FIG. 35C.

The sectional structures of terminal portions that are formed by the manufacturing steps of the second embodiment are the same as those in FIGS. 5A and 5B. The sectional structures of interlayer connection portions that are formed by the manufacturing steps of the second embodiment are the same as those in FIGS. 5C and 5D except for the following points.

In other words, in the second embodiment where the common electrode wiring line COM between the transparent counter electrode EL3 (C) and the second insulating film INS2 is not used, the sectional structures of the interlayer connection portions do not have the common electrode wiring line COM between the transparent counter electrode EL3 (C) and the second insulating film INS2 unlike those in FIGS. 5C and 5D.

Third Embodiment

Figure 9A:
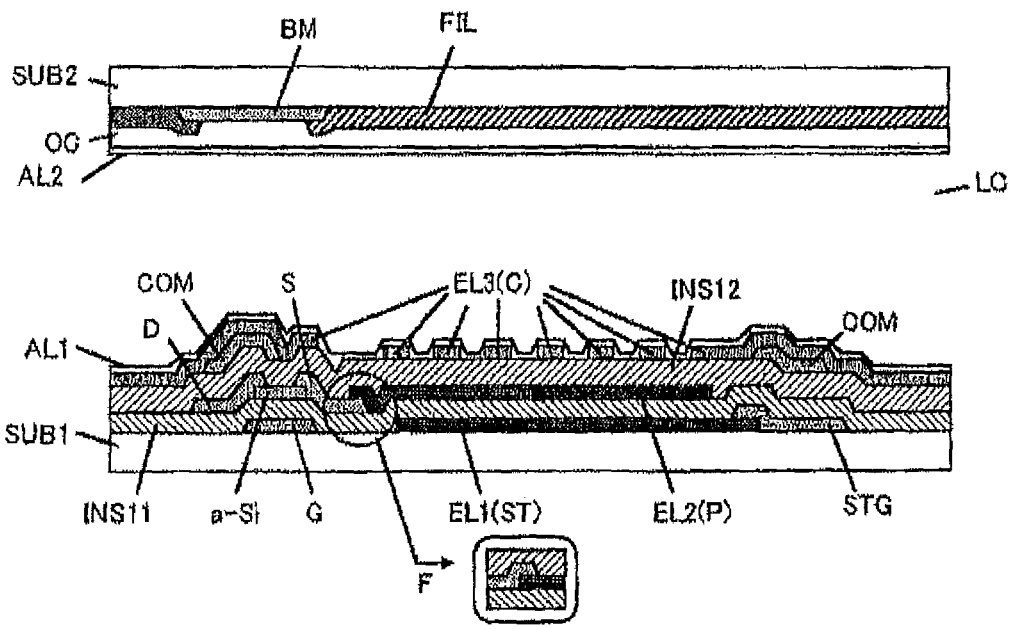
FIGS. 9A and 9B are schematic diagrams showing a pixel structure in the liquid crystal display device according to the third embodiment of the present invention.
Figure 9B:
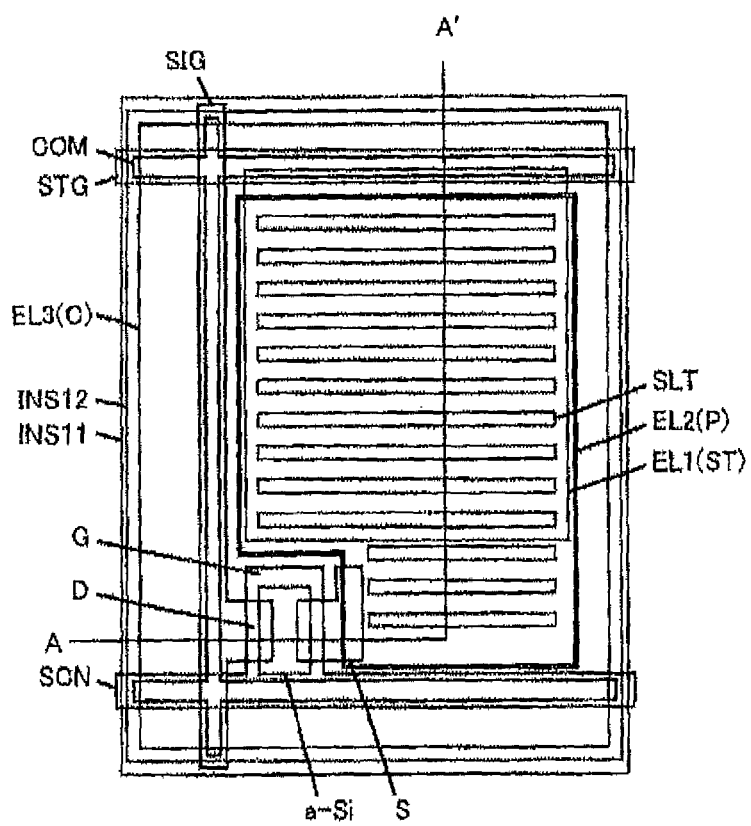

FIGS. 9A and 9B are schematic diagrams showing a pixel structure in a liquid crystal display device according to the third embodiment of the present invention. Shown in FIG. 9A is the sectional structure of a pixel, and shown in FIG. 9B is the plan view structure of the pixel on the TFT substrate side. The sectional structure of FIG. 9A corresponds to a view taken along the line A-A' shown in FIG. 9B.

The difference from the first embodiment is that the third embodiment uses the passivation film INS12 as the second insulating film INS2 by moving the transparent pixel electrode EL2 (P) to a place between the gate insulating film INS11 and the passivation film INS 12 and constituting the first insulating film INS1 solely from the gate insulating film INS11.

Accordingly, this embodiment can reduce one insulating film and, in addition, can easily form a sufficiently large storage capacitor in a pixel having reduced pixel dimensions because the capacitance per unit area of the first insulating film INS1 which constitutes the first storage capacitor Cst1 is increased.

In the first embodiment, the source electrode S of the thin film transistor TFT and the transparent pixel electrode EL2 (P) are connected to each other through an opening formed in the passivation film INS 12. In the third embodiment, the source electrode S and the transparent pixel electrode EL2 (P) are electrically connected each other by an overlapping portion between the two.

With the need to form the opening of the passivation film INS 12 in the pixel region eliminated, the area that can be used to display increases and the aperture ratio is improved. An equivalent circuit that represents a single pixel in the third embodiment is the same as the one in the first embodiment which is shown in FIG. 3.

In FIG. 9B where only one insulating film is formed between the drain layer and the common electrode wiring line COM and between the drain layer and the transparent counter electrode EL3 (C), the parasitic capacitance between the signal line SIG and the common electrode wiring line COM tends to be larger than the parasitic capacitance of FIG. 2B. However, the structure of FIG. 9B has an advantage over the structure of FIG. 2B in that the number of TFT substrate manufacturing steps in the third embodiment is one step less than in the first embodiment as described below.

FIGS. 10A to 10G show steps of manufacturing the TFT substrate in the liquid crystal display device according to the third embodiment. FIGS. 10A to 10D are the same as FIGS. 4A to 4D described in the first embodiment.

Figure 10A:
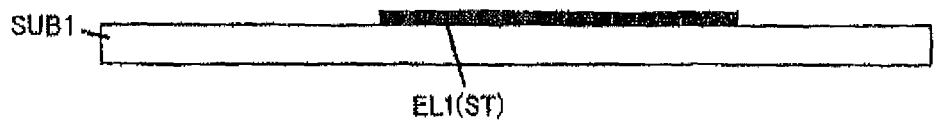
FIGS. 10A to 10G are diagrams showing steps of manufacturing a TFT substrate in the liquid crystal display device according to the third embodiment of the present invention.
Figure 10B:
Figure 10C:
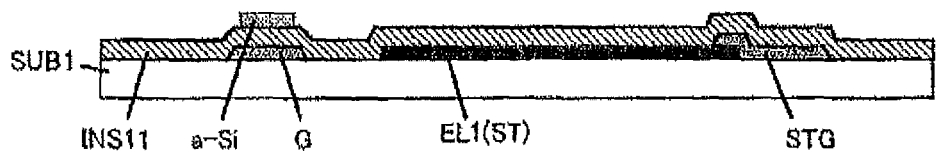
Figure 10D:
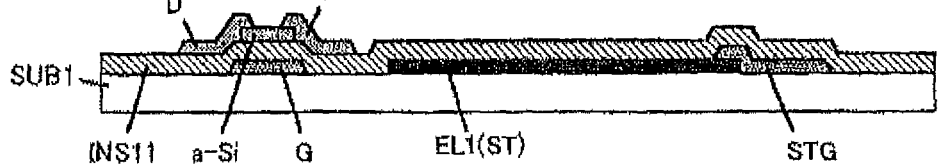
Figure 10E:
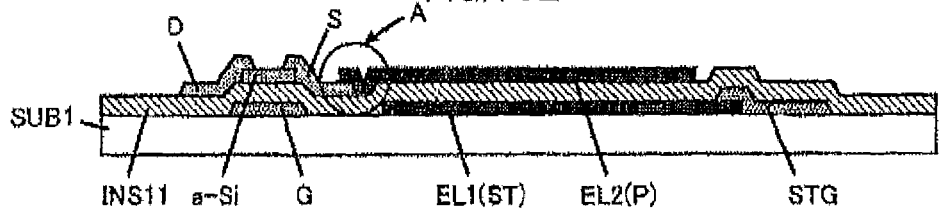

In FIG. 10E, a film is formed from a transparent conductive material such as ITO and treated by a photolithography process to form the transparent pixel electrode EL2 (P). The transparent pixel electrode EL2 (P) and the source electrode S are electrically connected to each other by an overlapping portion between the two (the circled portion indicated by an arrow A). A region where the transparent storage capacitor electrode EL1 (ST) and the transparent pixel electrode EL2 (P) overlap each other with the gate insulating film INS11 interposed between the electrodes serves as the first storage capacitor Cst1.

Figure 10F:
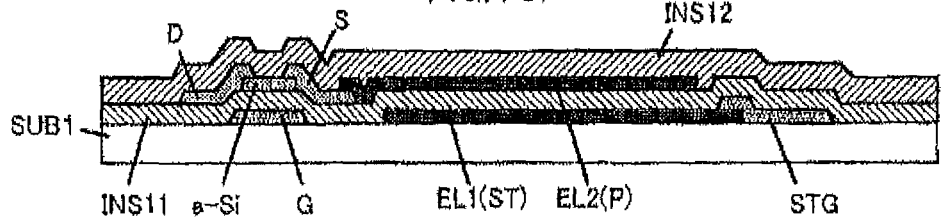

In FIG. 10F, the passivation film INS12 is formed from SiN, and the gate insulating film INS11 and the passivation film INS12 are treated by a photolithography process at once. By this photolithography process, a pixel portion is not patterned, whereas openings are opened in terminal portions and interlayer connection portions.

Figure 10G:
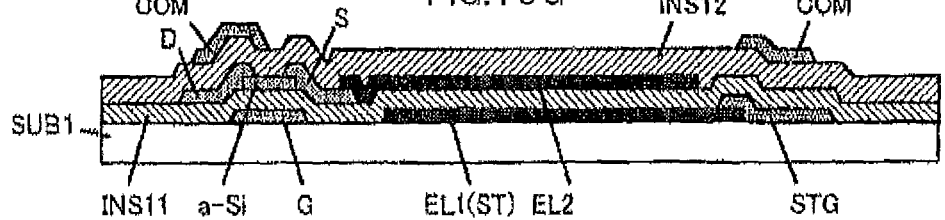

In FIG. 10G, a film is formed from a metal material and is treated by a photolithography process to form the common electrode wiring line COM.

Lastly, a film is formed from a transparent conductive material such as ITO to cover the common electrode wiring line COM, and is treated by a photolithography process to form the transparent counter electrode EL3 (C) as the one shown in FIG. 9A. The TFT substrate is thus manufactured by conducting a photolithography process eight times in total.

As in the first embodiment, the order in which the steps of FIGS. 10A and 10B are executed may be reversed as long as the transparent storage capacitor electrode EL1 (ST) and the common electrode wiring line COM are electrically connected to each other.

A third storage capacitor Cst3 may also be formed in a region where the transparent storage capacitor electrode EL1 (ST) and the source electrode S overlap each other with the gate insulating film INS11 interposed between the two by letting the transparent storage capacitor electrode EL1 (ST) slip in under the source electrode S. In this case, the third storage capacitor Cst3 constitutes an equivalent circuit as the one shown in FIG. 35A.

The connection portion between the transparent pixel electrode EL2 (P) and the source electrode S may also have a structure reverse to the one shown in FIG. 9A, and hence the source electrode S is laid on top of the transparent pixel electrode EL2 (P) (see a structure indicated by an arrow F shown in FIG. 9A), because the connection portion is merely required to establish an electric connection between the transparent pixel electrode EL2 (P) and the source electrode S. This structure can be formed by reversing the order in which the steps of FIG. 10D and FIG. 10E are executed.

Figure 11A:
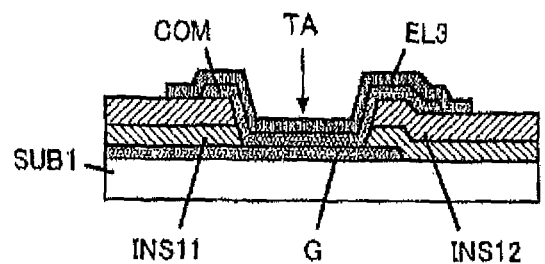
FIGS. 11A to 11D are sectional views showing the sectional structures of terminal portions and interlayer connection portions of the TFT substrate in the liquid crystal display device according to the third embodiment of the present invention.
Figure 11B:
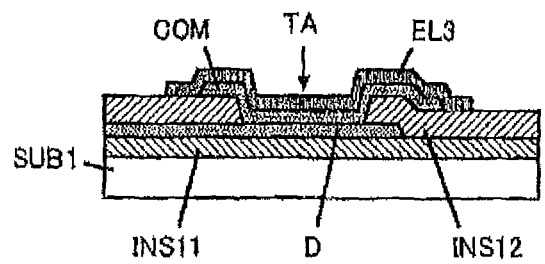
Figure 11C:
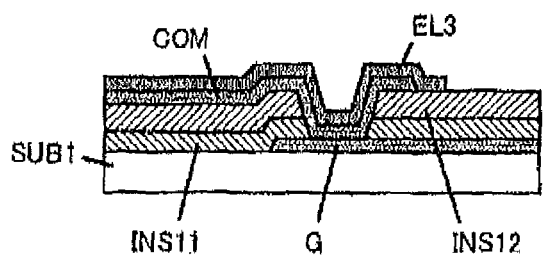
Figure 11D:
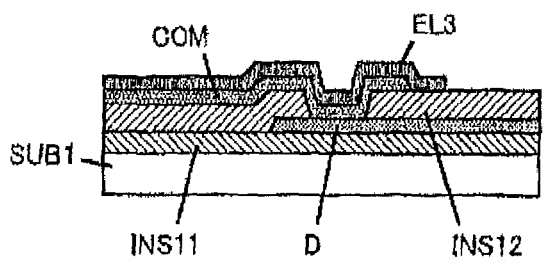

The sectional structures of the terminal portions and the interlayer connection portions that are formed by the manufacturing steps of the third embodiment are shown in FIGS. 11A to 11D. FIG. 11A shows terminal portions of the scanning line SCN and the storage capacitor wiring line STG which are formed in the gate layer. FIG. 11B shows a terminal portion of the signal line SIG which is formed in the drain layer. FIG. 11C shows a connection portion between the common electrode wiring line COM and the gate layer. FIG. 11D shows a connection portion between the common electrode wiring line COM and the drain layer.

The common electrode wiring line COM is formed as shown in the drawings in order to prevent the treatment of the common electrode wiring line COM from disturbing the gate layer and the drain layer.

Fourth Embodiment

Figure 12A:
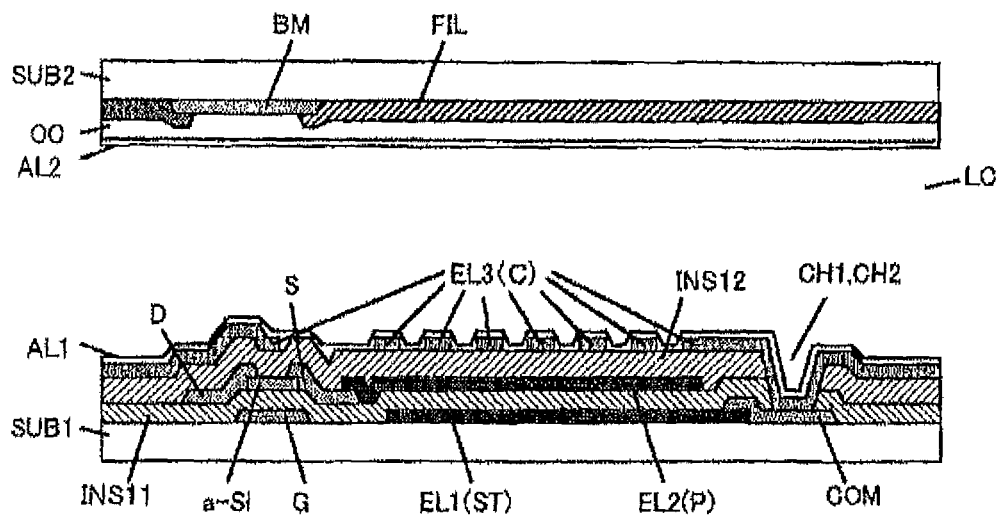
FIGS. 12A and 12B are schematic diagrams showing a pixel structure in the liquid crystal display device according to the fourth embodiment of the present invention.
Figure 12B:
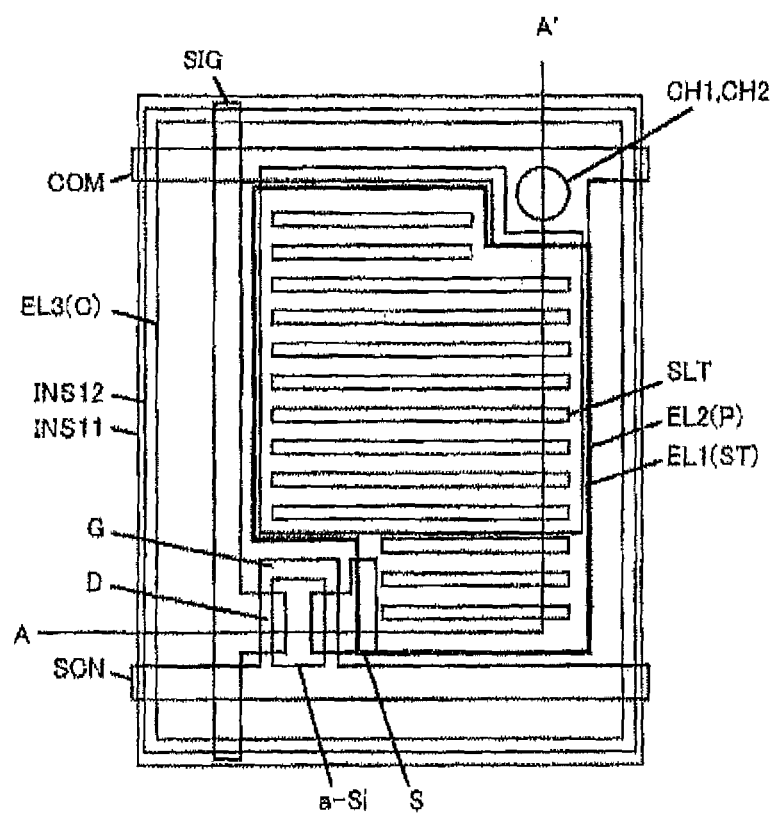

FIGS. 12A and 12B are schematic diagrams showing a pixel structure in a liquid crystal display device according to the fourth embodiment of the present invention. Shown in FIG. 12A is the sectional structure of a pixel, and shown in FIG. 12B is the plan view structure of the pixel on the TFT substrate side. The sectional structure of FIG. 12A corresponds to a view taken along the line A-A' shown in FIG. 12B.

The difference from the third embodiment is that, instead of using the common electrode wiring line COM between the transparent counter electrode EL3 (C) and the passivation film INS12, the fourth embodiment makes the storage capacitor wiring line STG formed in the gate layer double as the common electrode wiring line COM as in the second embodiment.

The transparent counter electrode EL3 (C) in the fourth embodiment is reduced in resistance as in the third embodiment by forming openings (contact holes CH1 and CH2) in a portion of the gate insulating film INS 11 and a portion of the passivation film INS12 that are located above the common electrode wiring line COM formed in the gate layer, and by connecting the transparent counter electrode EL3 (C) to the common electrode wiring line COM through the openings (CH1 and CH2).

An equivalent circuit per pixel in the fourth embodiment, where the storage capacitor wiring line STG doubles as the common electrode wiring line COM, is the same as the one described in the second embodiment with reference to FIG. 7.

In FIG. 12B, the openings (CH1 and CH2) are formed in the gate insulating film INS11 and the passivation film INS12 as a connection portion between the transparent counter electrode EL3 (C) and the common electrode wiring line COM. The transparent counter electrode EL3 (C) accordingly has a smaller region where the slit-like openings SLT are provided to apply an electric field to the liquid crystal layer LC, and the aperture ratio is lowered compared to FIG. 9B. However, the structure of FIG. 12B has an advantage over the structure of FIG. 9B in that the number of TFT substrate manufacturing steps in the fourth embodiment is even smaller (by one step) than in the third embodiment as described below.

FIGS. 13A to 13F show steps of manufacturing the TFT substrate in the liquid crystal display device according to the fourth embodiment. FIGS. 13A to 13E are the same as FIGS. 10A to 10E described in the third embodiment.

Figure 13A:
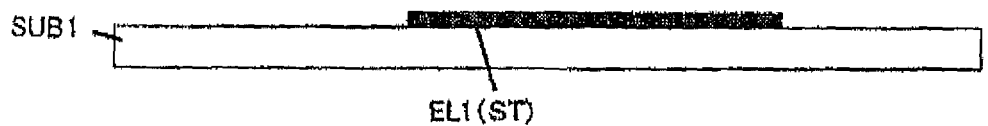
FIGS. 13A to 13F are diagrams showing steps of manufacturing a TFT substrate in the liquid crystal display device according to the fourth embodiment of the present invention.
Figure 13B:
Figure 13C:
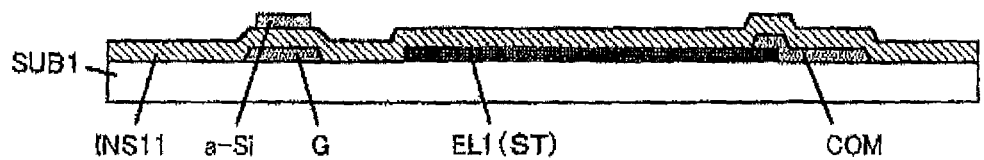
Figure 13D:
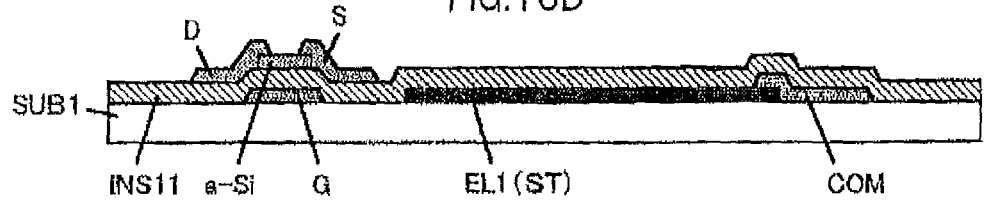
Figure 13E:
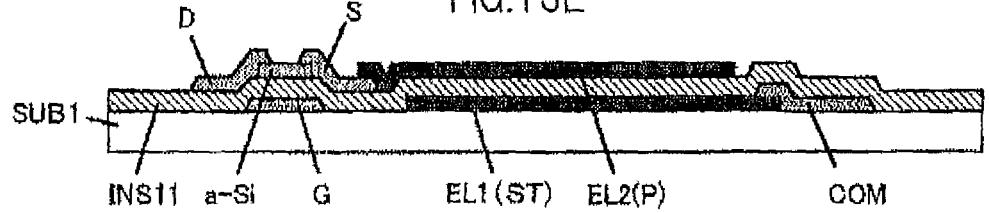
Figure 13F:
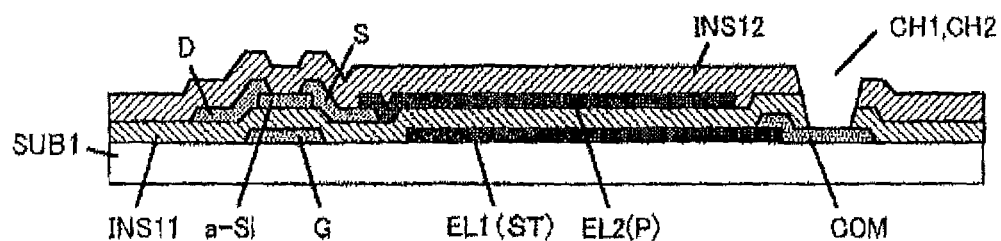
Figure 14A:
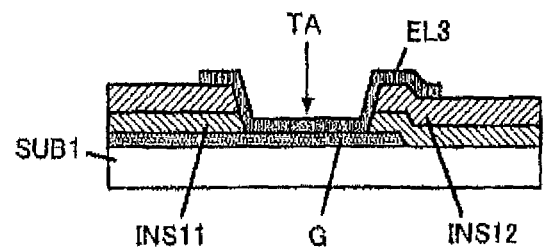
FIGS. 14A to 14D are sectional views showing the sectional structures of terminal portions and interlayer connection portions of the TFT substrate in the liquid crystal display device according to the fourth embodiment of the present invention.
Figure 14B:
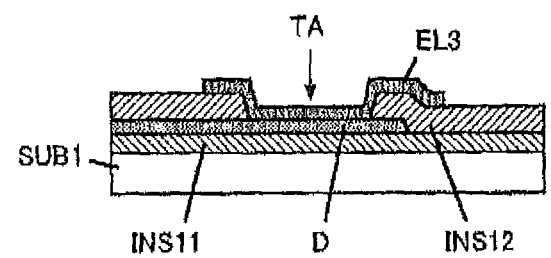
Figure 14C:
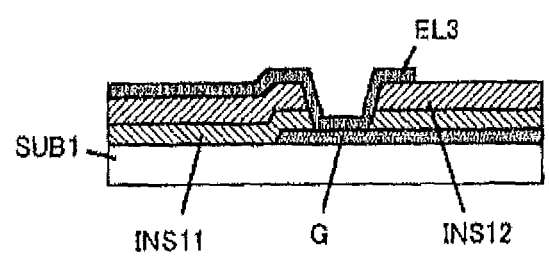
Figure 14D:
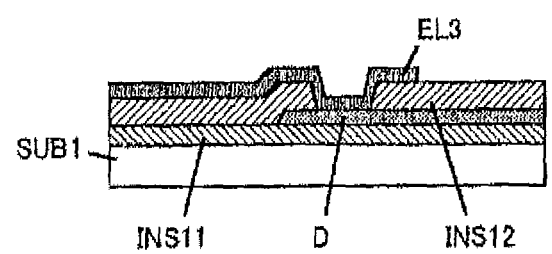

FIG. 13F is similar to FIG. 10F except that the openings (CH1 and CH2) are formed in a portion of the gate insulating film INS11 and a portion of the passivation film INS12 that are located above the common electrode wiring line COM, in addition to forming openings in terminal portions and interlayer connection portions, by treating the gate insulating film INS11 and the passivation film INS12 at once, thus exposing the surface of the common electrode wiring line COM formed in the gate layer.

Thereafter, a step corresponding to FIG. 10G is skipped, and a film is formed from a transparent conductive material such as ITO and treated by a photolithography process to form the transparent counter electrode EL3 (C) as the one shown in FIG. 12A. The transparent counter electrode EL3 (C) and the common electrode wiring line COM are electrically connected to each other through the openings (CH1 and CH2) in the gate insulating film INS11 and the passivation film INS12. The TFT substrate is thus manufactured by conducting a photolithography process seven times in total.

As in the third embodiment, the order in which the steps of FIGS. 13A and 13B are executed may be reversed as long as the transparent storage capacitor electrode EL1 (ST) and the common electrode wiring line COM are electrically connected to each other.

A third storage capacitor Cst3 may also be formed in a region where the transparent storage capacitor electrode EL1 (ST) and the source electrode S overlap each other with the gate insulating film INS11 interposed between the two by letting the transparent storage capacitor electrode EL1 (ST) slip in under the source electrode S. In this case, the third storage capacitor Cst3 constitutes an equivalent circuit as the one shown in FIG. 35C.

As is the case for the connection portion between the transparent pixel electrode EL2 (P) and the source electrode S in the third embodiment, the connection portion between the transparent pixel electrode EL2 (P) and the source electrode S in the fourth embodiment may also have a structure reverse to the one shown in FIG. 12A, and hence the source electrode S is laid on top of the transparent pixel electrode EL2 (P), because the connection portion is merely required to establish an electric connection between the transparent pixel electrode EL2 (P) and the source electrode S. This structure can be formed by reversing the order in which the steps of FIG. 13D and FIG. 13E are executed.

The sectional structures of the terminal portions and the interlayer connection portions that are formed by the manufacturing steps of the fourth embodiment are shown in FIGS. 14A to 14D. In the fourth embodiment where the common electrode wiring line COM between the transparent counter electrode EL3 (C) and the passivation film INS12 is not used, the sectional structures of the terminal portions and the interlayer connection portions do not have the common electrode wiring line COM between the transparent counter electrode EL3 (C) and the passivation film INS12 unlike those in FIGS. 11A to 11D.

Fifth Embodiment

In the first to fourth embodiments, limitations are put on the material and thickness of the gate insulating film and the passivation film in consideration of the characteristics and reliability of the thin film transistor TFT, and an insulating film used for a storage capacitor is also bound by the limitations. In the fifth embodiment and the sixth embodiment described later, the first and second storage capacitors are moved to a layer above the passivation film and are each formed from a dedicated insulating film, thereby increasing the degree of freedom in selecting a material, a thickness, and the like for the first and second insulating films used for storage capacitors.

Figure 15A:
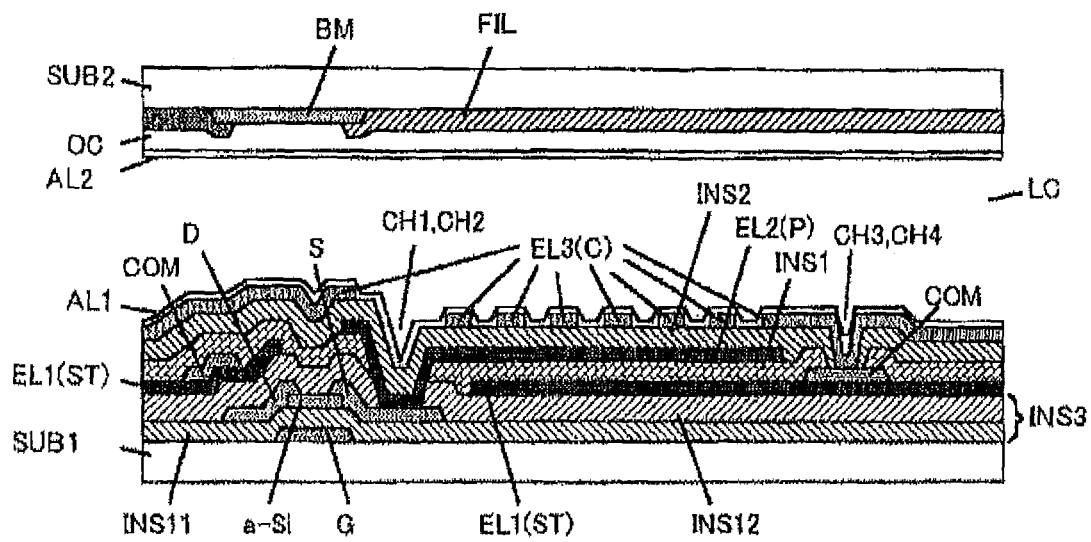
FIGS. 15A and 15B are schematic diagrams showing a pixel structure in the liquid crystal display device according to the fifth embodiment of the present invention.
Figure 15B:
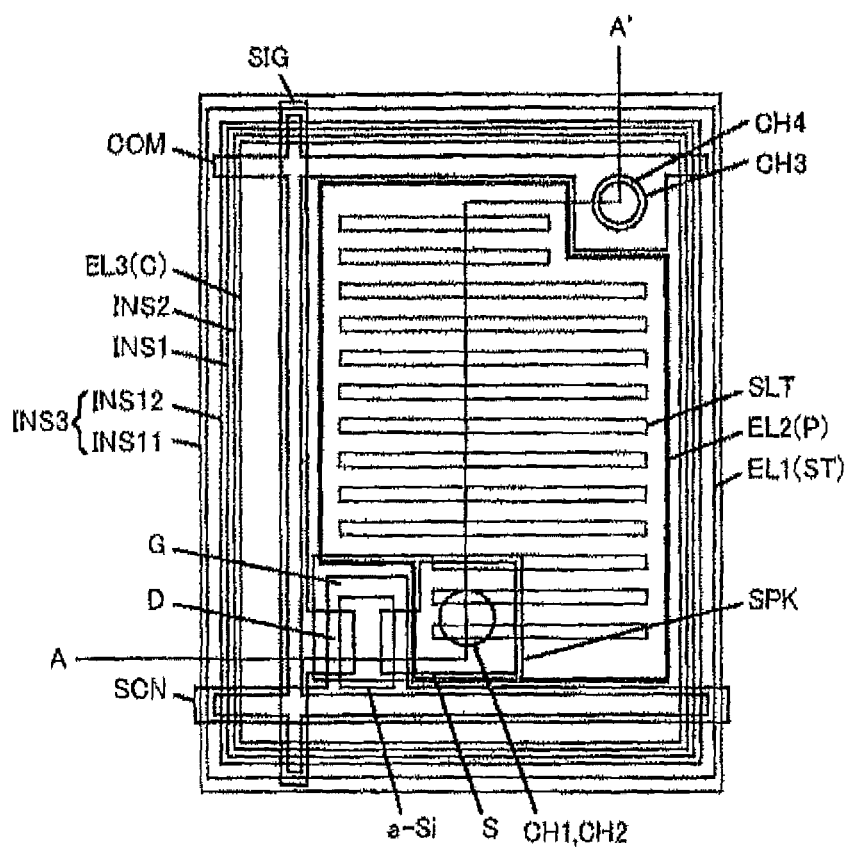

FIGS. 15A and 15B are schematic diagrams showing a pixel structure in a liquid crystal display device according to the fifth embodiment of the present invention. Shown in FIG. 15A is the sectional structure of a pixel, and shown in FIG. 15B is the plan view structure of the pixel on the TFT substrate side. The sectional structure of FIG. 15A corresponds to a view taken along the line A-A' shown in FIG. 15B.

On a first substrate SUB1, signal lines SIG are formed to intersect with scanning lines SCN with a gate insulating film INS11 interposed therebetween. Each pixel defined by the intersecting scanning lines SCN and signal lines SIG is provided with a thin film transistor TFT and a transparent pixel electrode EL2 (P), which functions as the second transparent electrode.

As shown in FIG. 15A, a transparent storage capacitor electrode EL1 (ST), which functions as a first transparent electrode, is formed between a passivation film INS12 of the thin film transistor TFT and a first insulating film INS1. An opening (contact hole) CH1 is formed in the passivation film INS12 to electrically connect the transparent pixel electrode EL2 (P) and a source electrode S of the thin film transistor TFT to each other. The transparent storage capacitor electrode EL1 (ST) has an opening SPK, which is apart from the opening CH1 by at least a minimum insulation distance.

The transparent storage capacitor electrode EL1 (ST) in one pixel may be separated from the transparent storage capacitor electrode EL1 (ST) in another pixel. Desirably, the transparent storage capacitor electrodes EL1 (ST) in adjacent pixels are connected to each other in order that the resistance can be lowered. The laminate composed of the gate insulating film INS11 and the passivation film INS12 below the transparent storage capacitor electrode EL1 (ST) constitutes a third insulating film INS3.

A common electrode wiring line COM which is shaped after the shape of the scanning line SCN and the signal line SIG and which doubles as a storage capacitor wiring line STG is formed on the transparent storage capacitor electrode EL1 (ST). A first storage capacitor Cst1 is formed between the transparent storage capacitor electrode EL1 (ST) and the transparent pixel electrode EL2 (P) through a first insulating film INS1.

A second insulating film INS2 and a transparent counter electrode EL3 (C), which functions as a third transparent electrode, are formed above the transparent pixel electrode EL2 (P). At this point, openings (contact holes CH3 and CH4) are formed in a portion of the first insulating film INS1 and a portion of the second insulating film INS2 that are located above the common electrode wiring line COM. The transparent counter electrode EL3 (C) and the common electrode wiring line COM are connected to each other through the openings (CH3 and CH4). The overall resistance of the counter electrode is thus lowered.

Multiple slit-like openings SLT parallel to one another are formed in the transparent counter electrode EL3 (C), avoiding the connection portion between the transparent counter electrode EL3 (C) and the common electrode wiring line COM.

A second storage capacitor Cst2 is formed between the transparent pixel electrode EL2 (P) and the transparent counter electrode EL3 (C) through the second insulating film INS2 to thereby obtain the TFT substrate. A first alignment film AL1 for aligning a liquid crystal layer LC in a given direction is formed in the topmost layer of the TFT substrate.

On a second substrate SUB2, a light shielding film (black matrix) BM, a color filter FIL whose color varies from one pixel to another, a protective film (overcoat) OC, and a second alignment film AL2 are formed to obtain a counter substrate.

The first alignment film AL1 and the second alignment film AL2 are each processed in advance so that liquid crystal molecules are aligned in a given direction. The first substrate SUB1 and the second substrate SUB2 are arranged such that their alignment film formation faces are opposed to each other across a predetermined interval, and the gap between the two is filled with a nematic liquid crystal composition having a positive dielectric anisotropy to form the liquid crystal layer LC.

The transparent pixel electrode EL2 (P) and the transparent counter electrode EL3 (C) are arranged such that an electric field having a component parallel to the surface of the first substrate SUB1 is generated between the transparent pixel electrode EL2 (P) and the transparent counter electrode EL3 (C) through the liquid crystal layer LC to form a pixel capacitor Cpx.

A retardation plate and polarization plate (not shown) are disposed outside of the first substrate SUB1 and the second substrate SUB2 to obtain an NB display mode liquid crystal display device. Drive circuits (not shown) are connected to the scanning lines SCN, the signal lines SIG, and the common electrode wiring lines COM.

An equivalent circuit that represents a single pixel in the liquid crystal display device according to the fifth embodiment and in a liquid crystal display device according to the sixth embodiment which will be described later is the same as the one described in the second embodiment with reference to FIG. 7.

In the fifth embodiment and the sixth embodiment described later, the transparent storage capacitor electrode EL1 (ST), the common electrode wiring line COM, and the transparent counter electrode EL3 (C) in one pixel row may be separated from those in another pixel row to receive voltage application independently of those in the other pixel row, or the transparent storage capacitor electrode EL1 (ST), the common electrode wiring line COM, and the transparent counter electrode EL3 (C) in one pixel column may be separated from those in another pixel column to receive voltage application independently of those in the other pixel column, although, from the standpoint of reducing the resistance of the counter electrode, it is preferred to connect the transparent storage capacitor electrode EL1 (ST), the common electrode wiring line COM, and the transparent counter electrode EL3 (C) in one pixel to those in adjacent pixels so that a voltage is applied commonly to all pixels.

In the fifth embodiment and the sixth embodiment described later, a third storage capacitor Cst3 may be formed between a source electrode S and the capacitor storage wiring line STG through the gate insulating film INS11 by forming the storage capacitor wiring line STG in a gate layer below the source electrode S. In this case, the third storage capacitor Cst3 constitutes an equivalent circuit as the one shown in FIG. 35B.

FIGS. 16A to 16H show steps of manufacturing the TFT substrate in the liquid crystal display device according to the fifth embodiment.

Figure 16A:
FIGS. 16A to 16H are diagrams showing steps of manufacturing a TFT substrate in the liquid crystal display device according to the fifth embodiment of the present invention.

In FIG. 16A, a film is formed from a metal material on the first substrate SUB1, which is a transparent insulating member such as a glass substrate. The film is treated by a photolithography process to form a gate electrode G and the scanning line SCN (not shown). This layer is called a gate layer.

Figure 16B:
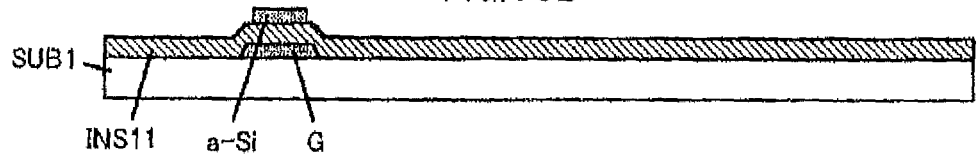

In FIG. 16B, the gate insulating film INS11, which is made of a transparent insulating material such as SiN, SiO, or TaO, and a semiconductor layer a-Si, which is made of amorphous silicon, are formed in succession, and only the semiconductor layer a-Si is treated by a photolithography process. A heavily doped n-type thin film (not shown) is present on the top face of the semiconductor layer a-Si.

Figure 16C:
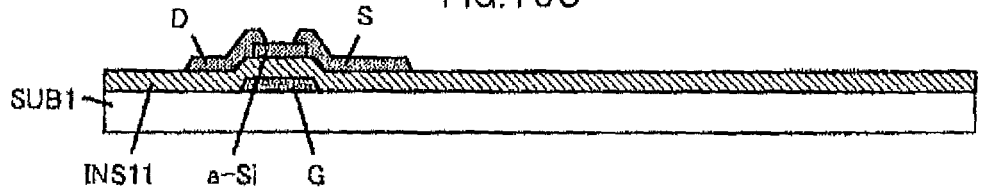

In FIG. 16C, a film is formed from a metal material to form the source electrode S, a drain electrode D, and the signal line SIG (not shown) simultaneously by a photolithography process. This layer is called a drain layer. The heavily doped n-type layer which is not covered with the drain layer is removed at the same time when the drain layer is treated.

Figure 16D:
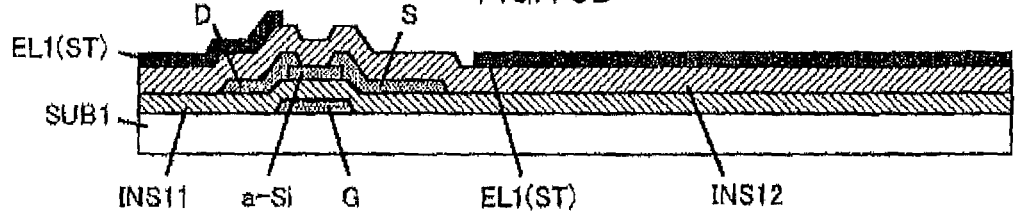

In FIG. 16D, the passivation film INS12 is formed from SiN. While the passivation film INS12 is left untreated, a film is formed from a transparent conductive material such as ITO on the passivation film INS12 and is treated by a photolithography process to form the transparent storage capacitor electrode EL1 (ST).

Figure 16E:
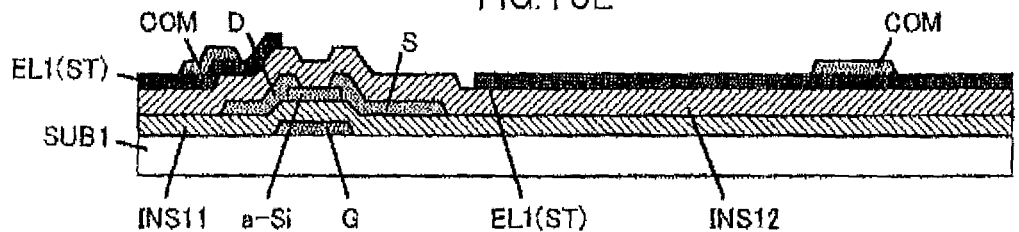

In FIG. 16E, a film is formed from a metal material and is treated by a photolithography process to form the common electrode wiring line COM.

Figure 16F:
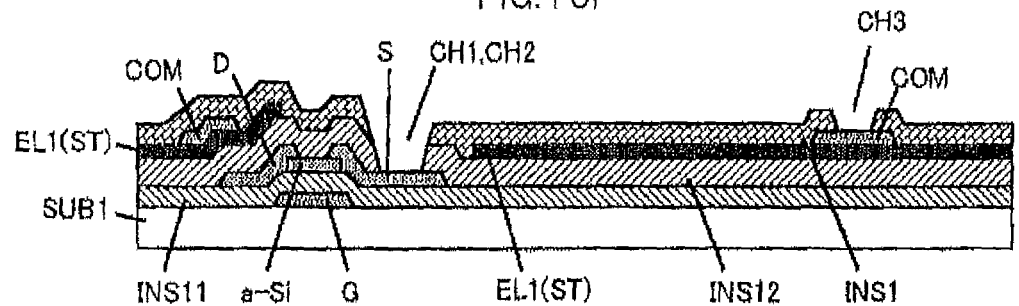

In FIG. 16F, the first insulating film INS1 is formed from SiN, and then, three layers, the gate insulating film INS11, the passivation film INS12, and the first insulating film INS1, are treated by a photolithography process at once.

Openings (CH1 and CH2) are formed in a portion of the passivation film INS12 and a portion of the first insulating film INS1 that are located above the source electrode S, and the opening CH3 is formed in a portion of the first insulating film INS1 that is located above the common electrode wiring line COM to expose the surface of the common electrode wiring line COM.

Figure 16G:
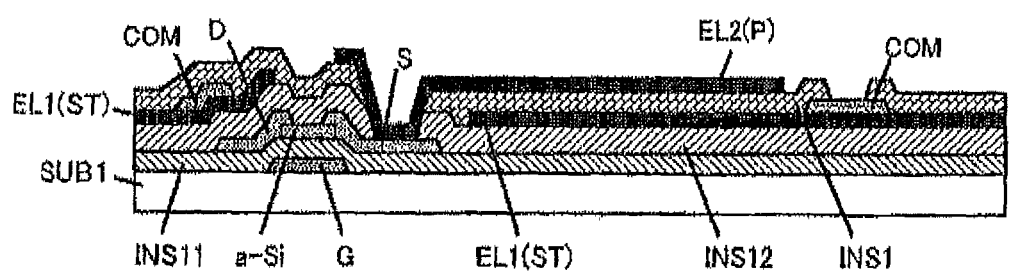

In FIG. 16G, a film is formed from a transparent conductive material such as ITO and is treated by a photolithography process to form the transparent pixel electrode EL2 (P).

The transparent pixel electrode EL2 (P) is electrically connected to the source electrode S through the openings (CH1 and CH2) in the passivation film INS12 and the first insulating film INS1. However, the transparent pixel electrode EL2 (P) is removed from inside the opening CH3 in the first insulating film INS1 which is located above the common electrode wiring line COM, and from around the opening CH3 for at least a minimum insulation distance.

Figure 16H:
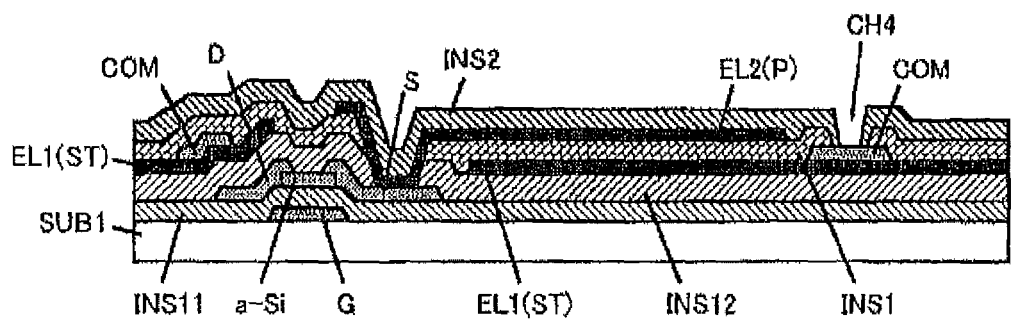

In FIG. 16H, the second insulating film INS2 is formed from SiN and is treated by a photolithography process. Through this photolithography process, the opening CH4 is formed in the second insulating film INS2 in a portion where the opening CH3 has been formed in the first insulating film INS1 above the common electrode wiring line COM, thereby exposing the surface of the common electrode wiring line COM again.

Lastly, a film is formed from a transparent conductive material such as ITO and is treated by a photolithography process to form the transparent counter electrode EL3 (C) as the one shown in FIG. 15A.

The transparent counter electrode EL3 (C) is electrically connected to the common electrode wiring line COM through the openings (CH3 and CH4) in the first insulating film INS1 and the second insulating film INS2. The TFT substrate is thus manufactured by conducting a photolithography process nine times in total.

Compared to the first embodiment, one more insulating film is formed in this embodiment by conducting a photolithography process as many times as in the first embodiment. The fifth embodiment can thus increase the degree of freedom in selecting a material, a thickness, and the like for the first and second insulating films through which storage capacitors are formed without adding many steps to the manufacturing process of the first embodiment.

The sectional structures of terminal portions and interlayer connection portions that are formed by the manufacturing steps of the fifth embodiment are shown in FIGS. 17A to 17F.

Figure 17A:
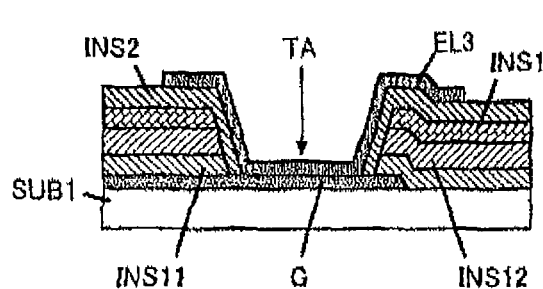
FIGS. 17A to 17F are sectional views showing the sectional structures of terminal portions and interlayer connection portions of the TFT substrate in the liquid crystal display device according to the fifth embodiment of the present invention.

FIG. 17A shows a terminal portion of the scanning line SCN formed in the gate layer. FIG. 17C shows a terminal portion of the signal line SIG formed in the drain layer. FIG. 17E shows a connection portion between the common electrode wiring line COM and the gate layer. FIG. 17F shows a connection portion between the common electrode wiring line COM and the drain layer.

In order to prevent the treatment of the second insulating film INS2 from disturbing the gate insulating film INS11, the passivation film INS12, and the first insulating film INS1, the opening in the second insulating film INS2 is shaped such that the surrounding areas of the openings formed by treating the three layers, the gate insulating film INS11, the passivation film INS12, and the first insulating film INS1, at once are covered.

The layer of the common electrode wiring line COM or the layer of the transparent electrode EL1 cannot be connected directly to the gate layer and the drain layer. Therefore, as shown in FIGS. 17E and 17F, the layer of the transparent electrode EL3 is connected to the common electrode wiring line COM through the openings formed in a portion of the first insulating film INS1 and a portion of the second insulating film INS2 that are located above the common electrode wiring line COM, and the common electrode wiring line COM is connected to the gate layer and the drain layer through this layer of the transparent electrode EL3.

Figure 17B:
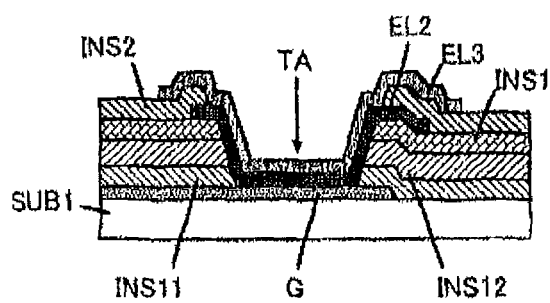
Figure 17C:
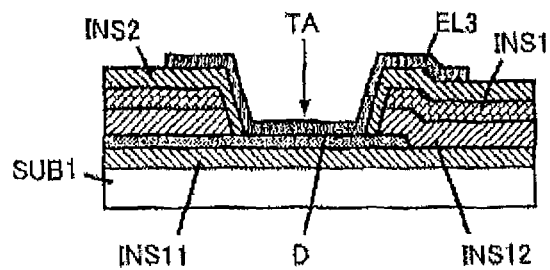
Figure 17D:
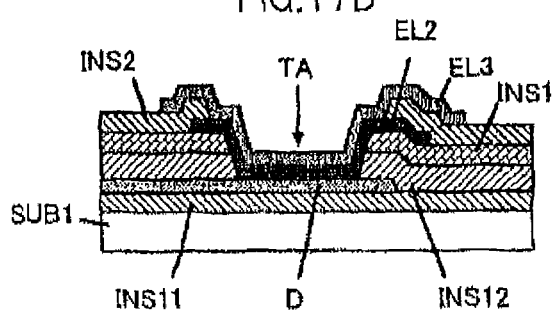
Figure 17E:
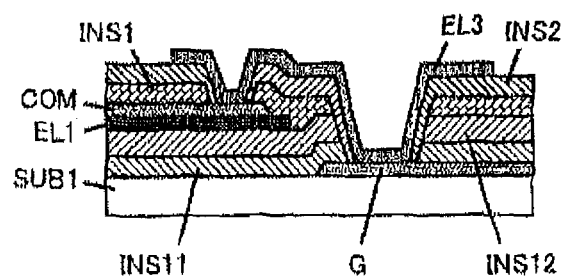
Figure 17F:
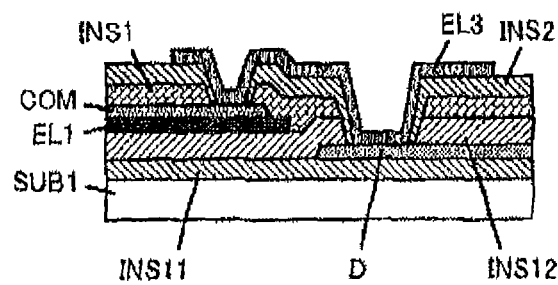

FIG. 17B is a modification example of FIG. 17A, and FIG. 17D is a modification example of FIG. 17C. Forming the layer of the transparent electrode EL2 in the manner shown in the drawings prevents the treatment of the second insulating film INS2 from disturbing the gate insulating film INS11, the passivation film INS12, and the first insulating film INS1, and allows the second insulating film INS2 to have a larger opening. Those structures are therefore effective particularly when terminals are aligned at a small pitch.

Sixth Embodiment

Figure 18A:
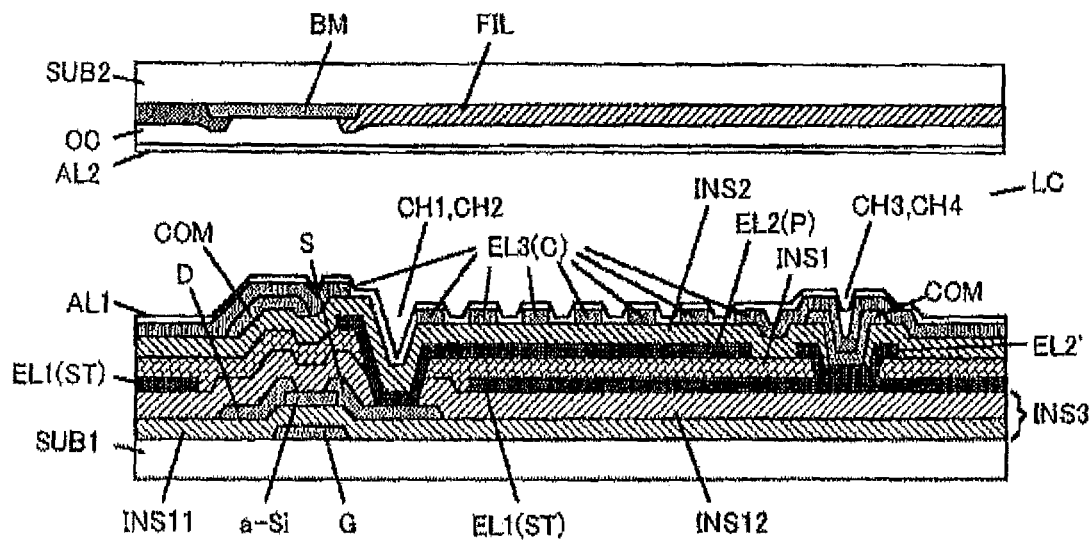
FIGS. 18A and 18B are schematic diagrams showing a pixel structure in the liquid crystal display device according to the sixth embodiment of the present invention.
Figure 18B:
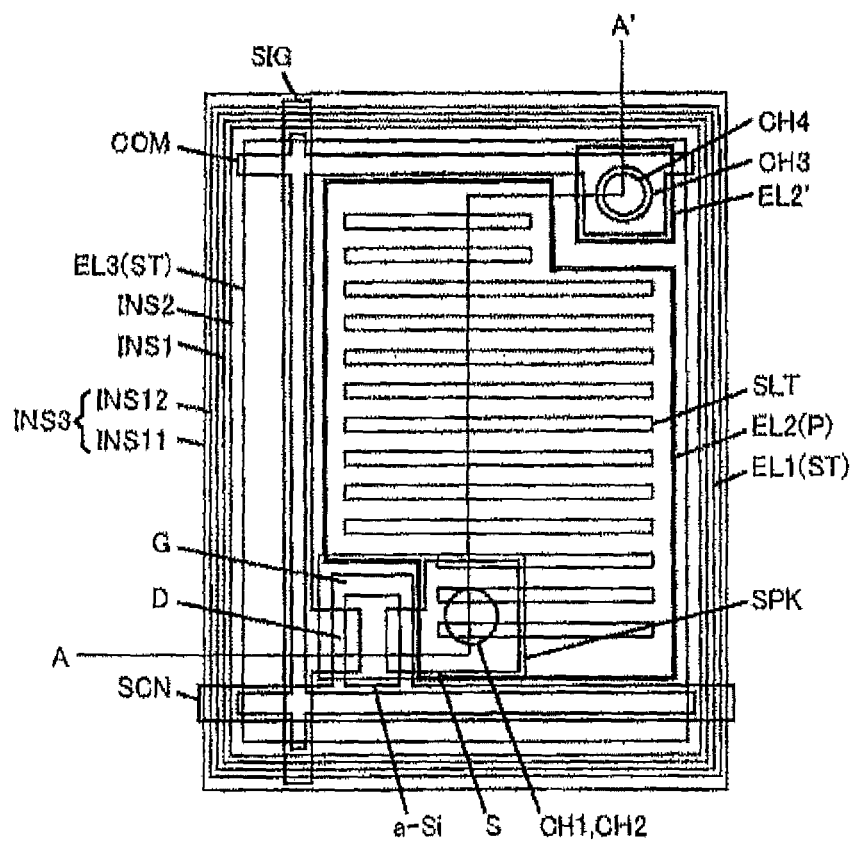

FIGS. 18A and 18B are schematic diagrams showing a pixel structure in a liquid crystal display device according to the sixth embodiment of the present invention. FIG. 18A shows the sectional structure of a pixel and FIG. 18B shows the plan view structure of the pixel on the TFT substrate side. The sectional structure shown in FIG. 18A corresponds to a view taken along the line A-A' illustrated in FIG. 18B.

The sixth embodiment is a modification example of the fifth embodiment, and differs from the fifth embodiment described with reference to FIGS. 15A and 15B in the following points.

The common electrode wiring line COM is placed below the transparent counter electrode EL3 (C) instead of above the transparent storage capacitor electrode EL1 (ST). This modification is accompanied by a change in structure of the opening through which the transparent storage capacitor electrode EL1 (ST) and the transparent counter electrode EL3 (C) are electrically connected to each other.

Specifically, in the opening CH3 formed in a portion of the first insulating film INS1 that is located above the transparent storage capacitor electrode EL1 (ST), an insular transparent electrode pattern EL2' separated from the transparent pixel electrode EL2 (P) is formed from the layer of the transparent pixel electrode EL2 (P). The insular transparent electrode pattern EL2' is connected to the transparent storage capacitor electrode EL1 (ST), and then connected to the common electrode wiring line COM through the opening CH4 formed in a portion of the second insulating film INS2 that is located above the insular transparent electrode pattern EL2'.

The common electrode wiring line COM is not always necessary in the opening CH4 formed in a portion of the second insulating film INS2 that is located above the insular transparent electrode pattern EL2'. Accordingly, the transparent counter electrode EL3 (C) may be formed directly in the opening CH4 within the second insulating film INS2 above the insular transparent electrode pattern EL2'.

In the sixth embodiment, the insular transparent electrode pattern EL2' whose voltage is as high as the voltage of the common electrode wiring line COM needs to be electrically insulated from the transparent pixel electrode EL2 (P) despite the two being the same layer, and therefore must be distanced from the transparent pixel electrode EL2 (P) as shown in FIG. 18B. The required distance makes the transparent pixel electrode EL2 (P) in the sixth embodiment that much smaller in area than in the fifth embodiment. The transparent counter electrode EL3 (C) accordingly has a smaller region where the slit-like openings SLT are provided to apply an electric field to the liquid crystal layer LC, and the aperture ratio is lowered compared to the fifth embodiment. However, the sixth embodiment has the following advantage over the fifth embodiment.

If the common electrode wiring line COM formed from a non-transparent metal material is shaped so as to overlap with the scanning line SCN and the signal line SIG in the fifth embodiment, it leaves the passivation film INS12 as the only insulating film between the drain layer and the common electrode wiring line COM and between the drain layer and the transparent storage capacitor electrode EL1 (ST). The capacitance of the parasitic capacitor between the signal line SIG and the common electrode wiring line COM is likely to increase as a result.

In contrast, the parasitic capacitor between the signal line SIG and the common electrode wiring line COM can be smaller in the sixth embodiment where the insulating film between the drain layer and the common electrode wiring line COM and between the drain layer and the transparent storage capacitor electrode EL1 (ST) is a laminate constituted of the passivation film INS12, the first insulating film INS1, and the second insulating film INS2, which makes the capacitance per-unit area small.

FIGS. 19A to 19H show steps of manufacturing the TFT substrate in the liquid crystal display device according to the sixth embodiment. FIGS. 19A to 19D are the same as FIGS. 16A to 16D in the fifth embodiment, except for the shape of the transparent storage capacitor electrode EL1 (ST).

Figure 19A:
FIGS. 19A to 19H are diagrams showing steps of manufacturing a TFT substrate in the liquid crystal display device according to the sixth embodiment of the present invention.
Figure 19B:
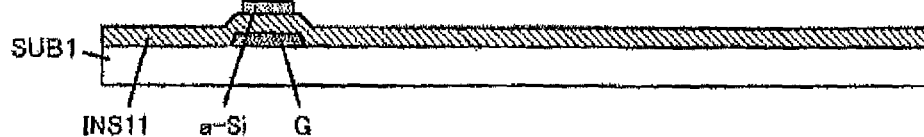
Figure 19C:
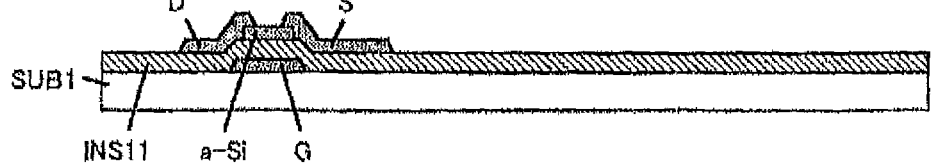
Figure 19D:
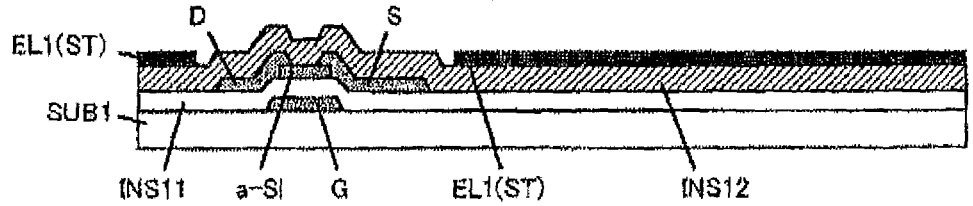
Figure 19E:
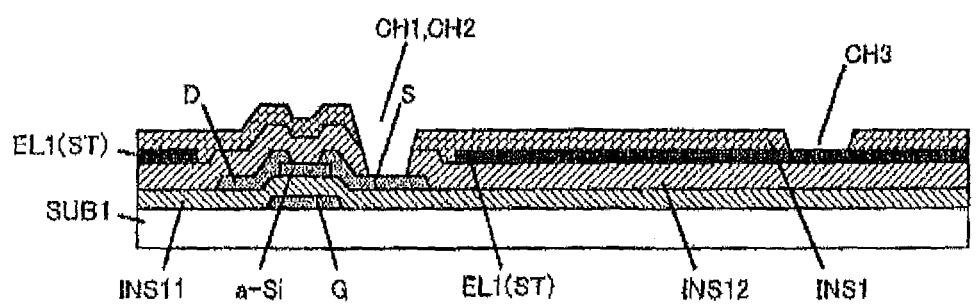

In FIG. 19E, the first insulating film INS1 is formed from SiN, and then three layers, the gate insulating film INS11, the passivation film INS12, and the first insulating film INS1, are treated by a photolithography process at once. Openings (CH1 and CH2) are formed in a portion of the passivation film INS12 and a portion of the first insulating film INS1 that are located above the source electrode S, and the opening CH3 is formed in a portion of the first insulating film INS1 that is located above the transparent storage capacitor electrode EL1 (ST) to expose the surface of the transparent storage capacitor electrode EL1 (ST).

Figure 19F:
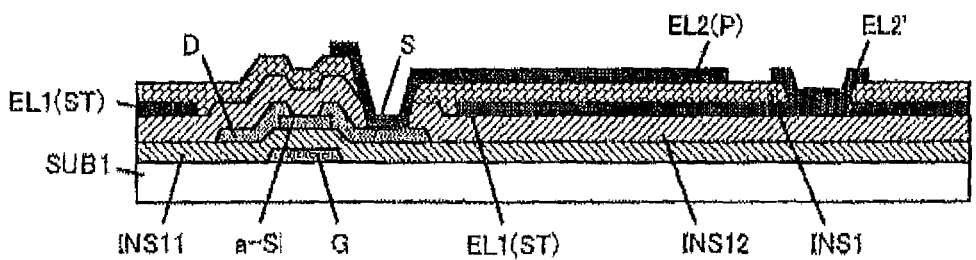

In FIG. 19F, a film is formed from a transparent conductive material such as ITO and is treated by a photolithography process to form the transparent pixel electrode EL2 (P) and the insular transparent electrode pattern EL2'. The transparent pixel electrode EL2 (P) is electrically connected to the source electrode S through the openings (CH1 and CH2) in the passivation film INS12 and the first insulating film INS1. The insular transparent electrode pattern EL2' is electrically connected to the transparent storage capacitor electrode EL1 (ST) through the opening CH3 in the first insulating film INS1.

Figure 19G:
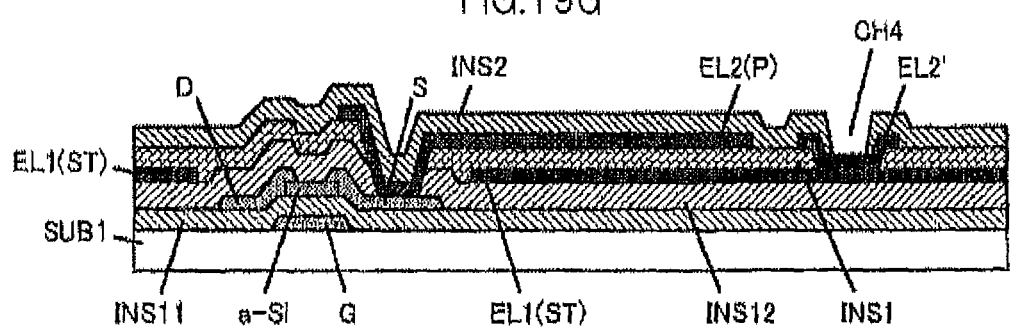

In FIG. 19G, the second insulating film INS2 is formed from SiN and is treated by a photolithography process. Through this photolithography process, the opening CH4 is formed in a portion of the second insulating film INS2 that is located above the insular transparent electrode pattern EL2', thereby exposing the surface of the insular transparent electrode pattern EL2'.

Figure 19H:
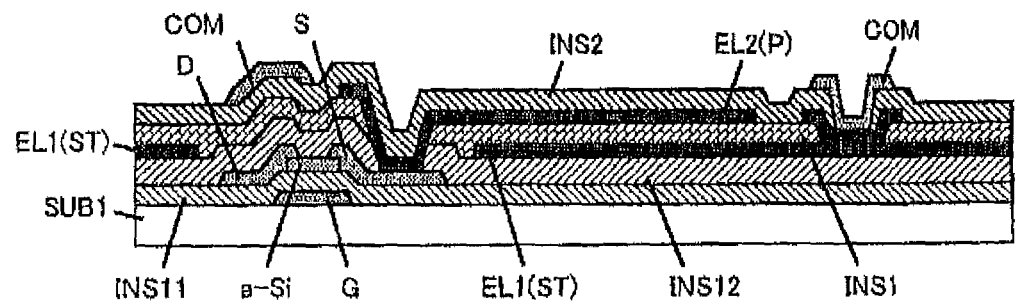

In FIG. 19H, a film is formed from a metal material and is treated by a photolithography process to form the common electrode wiring line COM. The common electrode wiring line COM is electrically connected to the insular transparent electrode pattern EL2' through the opening CH4 in the second insulating film INS2.

Lastly, a film is formed from a transparent conductive material such as ITO, covering the common electrode wiring line COM, and is treated by a photolithography process to form the transparent counter electrode EL3 (C) as the one shown in FIG. 18A. The TFT substrate is thus manufactured by conducting a photolithography process nine times in total. In this way, the sixth embodiment can increase the degree of freedom in selecting a material, a thickness, and the like for the first and second insulating films through which storage capacitors are formed without adding to the number of manufacturing process steps of the fifth embodiment.

Figure 20A:
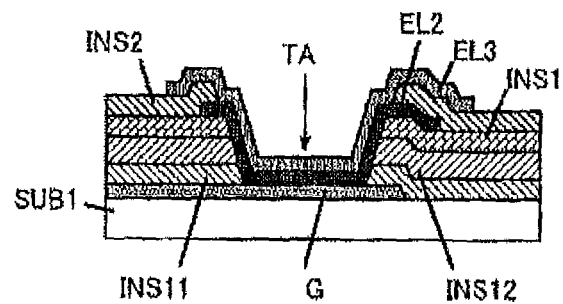
FIGS. 20A to 20D are sectional views showing the sectional structures of terminal portions and interlayer connection portions of the TFT substrate in the liquid crystal display device according to the sixth embodiment of the present invention.
Figure 20B:
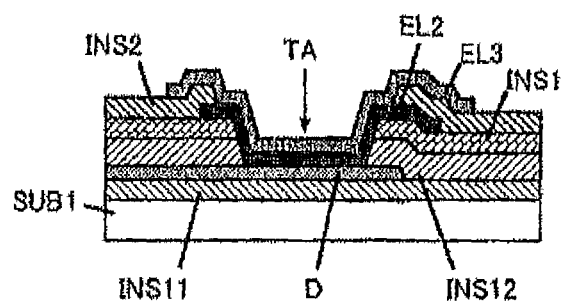

The sectional structures of terminal portions and interlayer connection portions that are formed by the manufacturing steps of the sixth embodiment are shown in FIGS. 20A to 20D. FIG. 20A shows a terminal portion of the scanning line SCN formed in the gate layer. FIG. 20B shows a terminal portion of the signal line SIG formed in the drain layer. The terminal portion structures of the sixth embodiment shown in FIGS. 20A and 20B are the same as those of the fifth embodiment shown in FIGS. 17B and 17D, respectively.

Figure 20C:
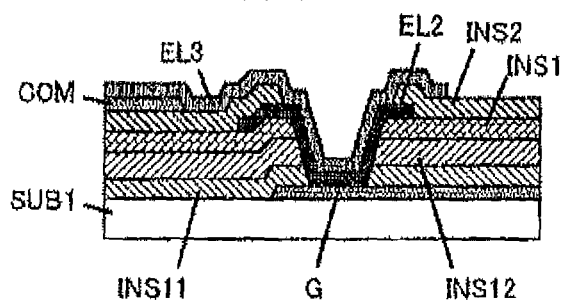
Figure 20D:
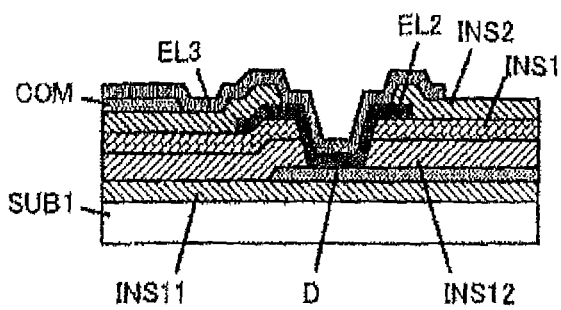

FIG. 20C shows a connection portion between the common electrode wiring line COM and the gate layer. FIG. 20D shows a connection portion between the common electrode wiring line COM and the drain layer. The transparent electrode EL2 is formed as shown in the drawings in order to prevent the treatment of the second insulating film INS2 from disturbing the gate insulating film INS11, the passivation film INS12, and the first insulating film INS1, and in order to prevent the treatment of the common electrode wiring line COM from disturbing the gate layer and the drain layer.

Seventh Embodiment

The seventh embodiment, as well as the eighth to tenth embodiments which will be described later, presents an example of an IPS liquid crystal display device that is structured such that a first transparent electrode EL1 and a third transparent electrode EL3 are used as pixel electrodes P, whereas a second transparent electrode EL2 is used as a counter electrode C that doubles as a storage capacitor electrode.

Figure 21A:
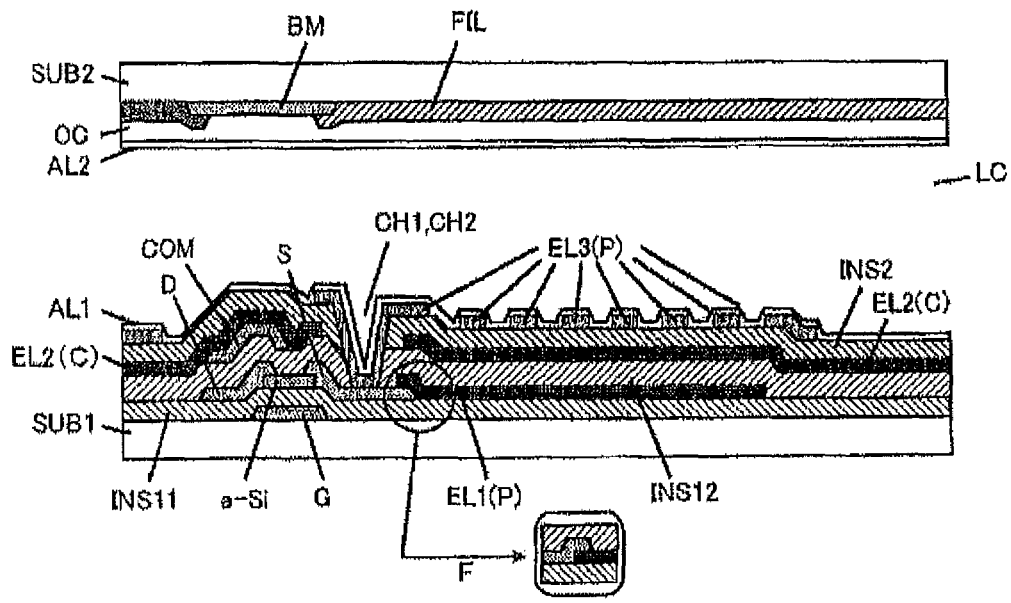
FIGS. 21A and 21B are schematic diagrams showing a pixel structure in the liquid crystal display device according to the seventh embodiment of the present invention.
Figure 21B:
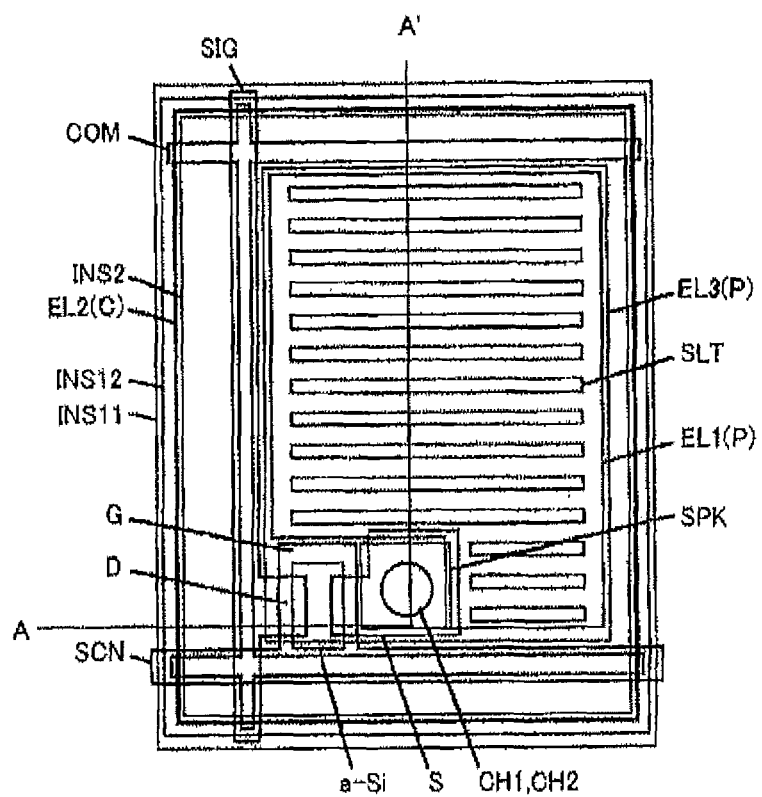

FIGS. 21A and 21B are schematic diagrams showing a pixel structure in the liquid crystal display device according to the seventh embodiment of the present invention. FIG. 21A shows the sectional structure of a pixel and FIG. 21B shows the plan view structure of the pixel on the TFT substrate side. The sectional structure shown in FIG. 21A corresponds to a view taken along the line A-A' illustrated in FIG. 21B.

On a first substrate SUB1, signal lines SIG are formed to intersect with scanning lines SCN with a gate insulating film INS11 interposed therebetween. Each pixel defined by the intersecting scanning lines SCN and signal lines SIG is provided with a thin film transistor TFT, a first transparent pixel electrode EL1 (P), which functions as the first transparent electrode and is shaped like a flat board, and a second transparent pixel electrode EL3 (P), which functions as the third transparent electrode.

The second transparent pixel electrode EL3 (P) has a planar shape with slit-like openings SLT which run parallel to one another. Alternatively, the second transparent pixel electrode EL3 (P) may have a planar shape like a slip or a comb.

The first transparent pixel electrode EL1 (P) between the gate insulating film INS11 and a passivation film INS12 is electrically connected to a source electrode S of the thin film transistor TFT by an overlapping portion between the first transparent pixel electrode EL1 (P) and the source electrode S.

The second transparent pixel electrode EL3 (P) which is above a second insulating film INS2 is electrically connected to the source electrode S through openings (CH1 and CH2) formed in a portion of the passivation film INS12 and a portion of the second insulating film INS2 that are located above the source electrode S.

A transparent counter electrode EL2 (C), which functions as the second transparent electrode and doubles as a storage capacitor electrode, is formed between the second insulating film INS2 and the passivation film INS12. The transparent counter electrode EL2 (C) has an opening SPK distanced from the openings CH1 and CH2, which are formed in the passivation film INS12 and the second insulating film INS2 to electrically connect the second transparent pixel electrode EL3 (P) and the source electrode S to each other, by at least a minimum insulation distance. The passivation film INS12 is used as a first insulating film INS1 through which a first storage capacitor Cst1 is formed between the first transparent pixel electrode EL1 (P) and the transparent counter electrode EL2 (C). A second storage capacitor Cst2 is formed between the transparent counter electrode EL2 (C) and the second transparent pixel electrode EL3 (P) through the second insulating film INS2. The gate insulating film INS11 constitutes a third insulating film INS3.

A common electrode wiring line COM which is shaped after the shape of the scanning line SCN and the signal line SIG and which doubles as a storage capacitor wiring line STG is formed between the passivation film INS12 and the transparent counter electrode EL2 (C). The transparent counter electrode EL2 (C) and the common electrode wiring line COM directly overlap each other to be electrically connected to each other and thereby lower the overall resistance of the counter electrode. A first alignment film AL1 for aligning a liquid crystal layer LC in a given direction is formed in the topmost layer of the TFT substrate.

On a second substrate SUB2, a light shielding film (black matrix) BM, a color filter FIL whose color varies from one pixel to another, a protective film (overcoat) OC, and a second alignment film AL2 are formed to obtain a counter substrate.

The first alignment film AL1 and the second alignment film AL2 are each processed in advance so that liquid crystal molecules are aligned in a given direction.

The first substrate SUB1 and the second substrate SUB2 are arranged such that their alignment film formation faces are opposed to each other across a predetermined interval, and the gap between the two is filled with a nematic liquid crystal composition having a positive dielectric anisotropy to form the liquid crystal layer LC.

The seventh embodiment employs an IPS method electrode arrangement in which an electric field having a component parallel to the surface of the first substrate SUB1 is generated between the transparent counter electrode EL2 (C) and the second transparent pixel electrode EL3 (P) through the liquid crystal layer LC to form a pixel capacitor Cpx.

A retardation plate and polarization plate (not shown) are disposed outside of the first substrate SUB1 and the second substrate SUB2 to obtain an NB display mode liquid crystal display device. Drive circuits (not shown) are connected to the scanning lines SCN, the signal lines SIG, and the common electrode wiring lines COM.

An equivalent circuit that represents a single pixel in the liquid crystal display device according to the seventh embodiment is the same as the one described in the second embodiment with reference to FIG. 7.

The first transparent pixel electrode EL1 (P), the second transparent pixel electrode EL3 (P), or the source electrode S is provided with a parasitic capacitor Cgs, which is formed between the gate (G) and source (S) of the thin film transistor TFT, and parasitic capacitors Cds1 and Cds2, which are formed by the electrode EL1, EL3, or S and the signal lines SIG, in addition to the first storage capacitor Cst1, the second storage capacitor Cst2, and the pixel capacitor Cpx.

When the pixel dimensions are reduced to obtain fine pixels, an equivalent storage capacitor sufficiently large in relation to the parasitic capacitors including Cgs, Cds1, and Cds2 can be formed from the parallel capacitance of the first storage capacitor Cst1 and the second storage capacitor Cst2.

This makes the voltage of the second transparent pixel electrode EL3 (P) less susceptible to feed-through voltage, which is caused by a voltage change in the scanning line SCN or the signal line SIG, during a hold period in which the thin film transistor TFT is off. Phenomena called smearing and cross talk can thus be prevented.

It also reduces the leakage of accumulated electric charges from the first transparent pixel electrode EL1 (P), the second transparent pixel electrode EL3 (P), and the source electrode (S) during a hold period, thereby allowing the electric field applied to the liquid crystal layer LC to drop less.

Accordingly, degradation in image quality can be avoided. Furthermore, since the first storage capacitor Cst1 and the second storage capacitor Cst2 are constituted of the first transparent pixel electrode EL1 (P), the passivation film INS12, the transparent counter electrode EL2 (C), the second insulating film INS2, and the second transparent pixel electrode EL3 (P), which are all transparent, forming a storage capacitor that is sufficiently large in relation to the parasitic capacitor does not lower the aperture ratio of the transmissive display portion. The formation of a sufficiently large storage capacitor and the securing of a sufficiently high aperture ratio are thus accomplished simultaneously. Those effects of the seventh embodiment are shared by the eighth to twelfth embodiment which will be described later.

In the seventh embodiment and the eighth to tenth embodiments described later, the common electrode wiring line COM and the transparent counter electrode EL2 (C) in one pixel row may receive voltage application independently of those in another pixel row, or the common electrode wiring line COM and the transparent counter electrode EL2 (C) in one pixel column may receive voltage application independently of those in another pixel column, although, from the viewpoint of reducing the resistance of the counter electrode, it is preferred to connect the common electrode wiring line COM and the transparent counter electrode EL2 (C) in one pixel to those in adjacent pixels so that a voltage is applied commonly to all pixels.

In the seventh embodiment and the eighth to tenth embodiments described later, a third storage capacitor Cst3 may be formed between the source electrode S and the storage capacitor wiring line STG through the gate insulating film INS11 by forming the storage capacitor wiring line STG in the gate layer below the source electrode S.

Figure 35B:
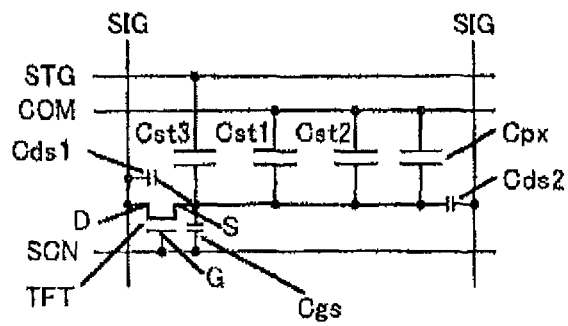
Figure 35C:
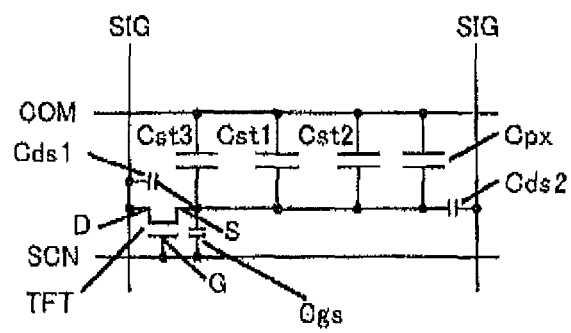

The third storage capacitor Cst3 in this case constitutes an equivalent circuit as the one shown in FIG. 35B. Besides, the third storage capacitor Cst3 in the seventh embodiment and the ninth embodiment described later may be formed by placing the storage capacitor wiring line STG below the first transparent pixel electrode EL1 (P) in addition to below the source electrode S, although it lowers the aperture ratio and is not so preferred.

In this case, a voltage may be applied to the storage capacitor wiring line STG commonly to all pixels, or individually on a pixel row basis. Further, the voltage of the storage capacitor wiring line STG and the voltage of the common electrode wiring line COM may be the same, which does not mean that the two always need to match.

FIGS. 22A to 22G show steps of manufacturing the TFT substrate in the liquid crystal display device according to the seventh embodiment.

Figure 22A:
FIGS. 22A to 22G are diagrams showing steps of manufacturing a TFT substrate in the liquid crystal display device according to the seventh embodiment of the present invention.

In FIG. 22A, a film is formed from a metal material on the first substrate SUB1, which is a transparent insulating member such as a glass substrate. The film is treated by a photolithography process to form the gate electrode G and the scanning line SCN (not shown). This layer is called a gate layer.

Figure 22B:
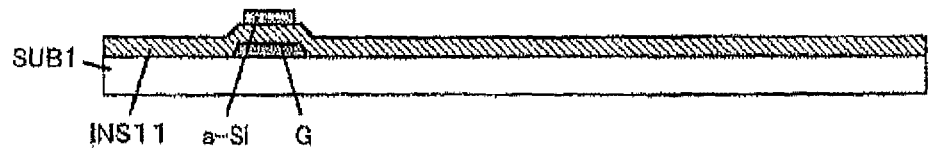

In FIG. 22B, the gate insulating film INS11, which is made of a transparent insulating material such as SiN, SiO, or TaO, and a semiconductor layer a-Si, which is made of amorphous silicon, are formed in succession, and only the semiconductor layer a-Si is treated by a photolithography process. A heavily doped n-type thin film (not shown) is present on the top face of the semiconductor layer a-Si.

Figure 22C:
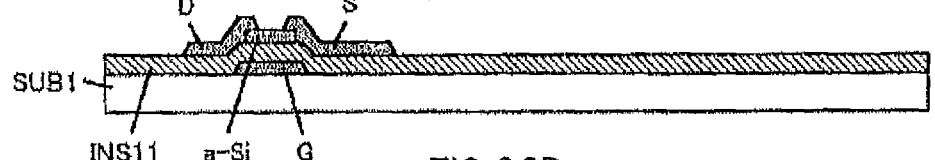

In FIG. 22C, a film is formed from a metal material to form the source electrode S, the drain electrode D, and the signal line SIG (not shown) simultaneously by a photolithography process. This layer is called a drain layer. The heavily doped n-type layer which is not covered with the drain layer is removed at the same time when the drain layer is treated.

Figure 22D:
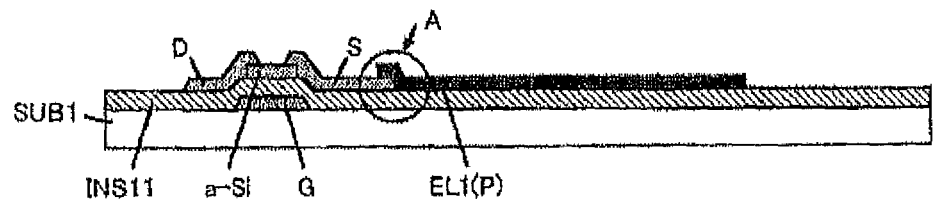

In FIG. 22D, a film is formed from a transparent conductive material such as ITO, and is treated by a photolithography process to form the first transparent pixel electrode EL1 (P). The first transparent pixel electrode EL1 (P) and the source electrode S are electrically connected to each other by an overlapping portion between the two (the circled portion indicated by an arrow A).

Figure 22E:
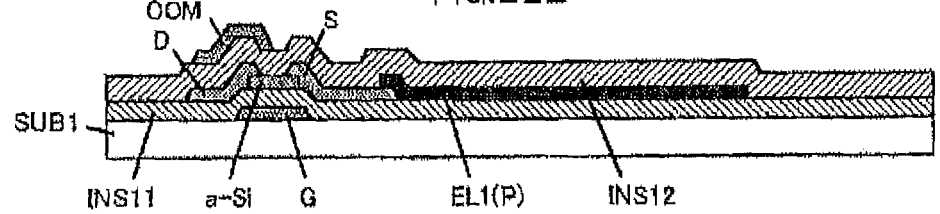

In FIG. 22E, the passivation film INS12 is formed from SiN. While the passivation film INS12 is left untreated, a film is formed from a metal material on the passivation film INS12 and is treated by a photolithography process to form the common electrode wiring line COM.

Figure 22F:
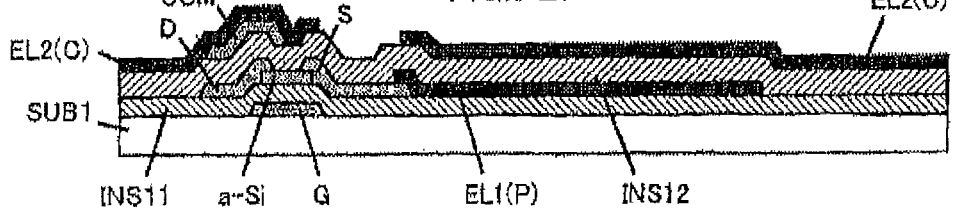

In FIG. 22F, a film is formed from a transparent conductive material such as ITO and is treated by a photolithography process to form the transparent counter electrode EL2 (C).

Figure 22G:
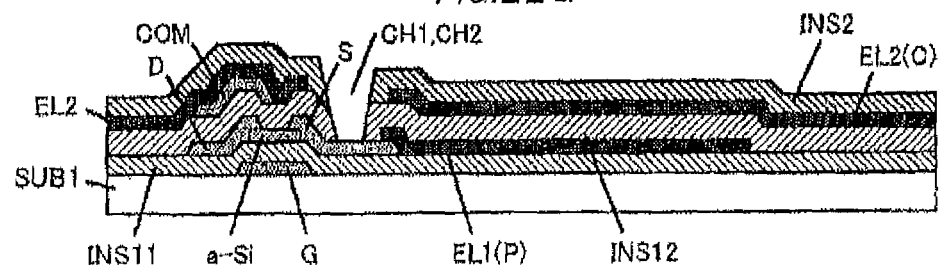

In FIG. 22G, the second insulating film INS2 is formed from SiN, and then three layers, the gate insulating film INS11, the passivation film INS12, and the second insulating film INS2, are treated by a photolithography process at once to form openings (CH1 and CH2) in a portion of the passivation film INS12 and a portion of the second insulating film INS2 that are located above the source electrode S.

Lastly, a film is formed from a transparent conductive material such as ITO, and is treated by a photolithography process to form the second transparent pixel electrode EL3 (P) as the one shown in FIG. 21A.

The second transparent electrode EL3 (P) is electrically connected to the source electrode S through the openings (CH1 and CH2) in the portion of the passivation film INS12 and the portion of the second insulating film INS2 that are located above the source electrode S. The TFT substrate is thus manufactured by conducting a photolithography process eight times in total.

While the number of times a photolithography process is conducted in the seventh embodiment is the same as in the second embodiment, the seventh embodiment has the following advantages over the second embodiment.

The seventh embodiment does not need an opening in an insulating film to connect the common electrode and the counter electrode to each other. The area that can be used to display therefore increases, which makes it easy to improve the aperture ratio.

The common electrode wiring line COM of the seventh embodiment is in a layer above the passivation film INS12 instead of the gate layer. The aperture ratio can therefore be improved by utilizing the common electrode wiring line COM as a self-shield against light.

The first insulating film INS1 constituting the first storage capacitor Cst1 consists solely of the passivation film INS12 in the seventh embodiment, which increases the capacitance per unit area. Accordingly, a sufficiently large storage capacitor can easily be formed in a pixel of smaller dimensions.

The seventh embodiment, where a photolithography process is conducted as many times as in the third embodiment, has the following advantage over the third embodiment.

The gate insulating film INS11 in the seventh embodiment is not used as an insulating film for a storage capacitor, which reduces limitations put on the material and thickness in consideration of the characteristics and reliability of the thin film transistor TFT. The seventh embodiment can thus increase the degree of freedom in selecting a material, a thickness, and the like for the second insulating film through which storage capacitors are formed.

As in the third and fourth embodiments, it is sufficient for the connection portion between the pixel electrode and the source electrode S in the seventh embodiment to electrically connect the two. The connection portion therefore may have a structure reverse to the one shown in FIG. 21A, and hence the source electrode S is laid on top of the first transparent pixel electrode EL1 (P) (see a structure indicated by an arrow F in FIG. 21A). This structure can be formed by reversing the order in which the steps of FIG. 22C and FIG. 22D are executed.

In the seventh embodiment, as well as the eighth to tenth embodiments, part of the eleventh embodiment, and the twelfth embodiment which will be described later, the transparent counter electrode EL2 (C) and the common electrode wiring line COM may be arranged otherwise as long as the two are electrically connected to each other. Therefore, the sectional structures of the pixel portions of the respective embodiments shown in the schematic diagrams may be reversed, and hence the common electrode wiring line COM is laid on top of the transparent counter electrode EL2 (C).

This structure is obtained by switching the order of the formation and treatment step of the transparent counter electrode EL2 (C) and the formation and treatment step of the common electrode wiring line COM in the TFT manufacturing processes of the respective embodiments shown in the drawings.

Figure 23A:
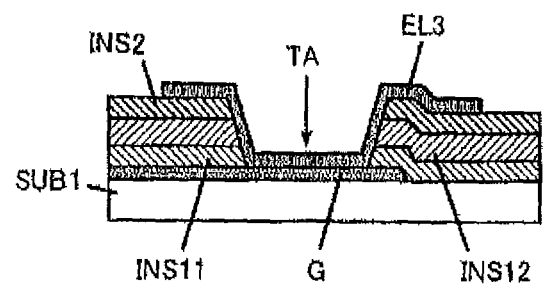
FIGS. 23A to 23D are sectional views showing the sectional structures of terminal portions and interlayer connection portions of the TFT substrate in the liquid crystal display devices according to the seventh and tenth embodiments of the present invention.
Figure 23B:
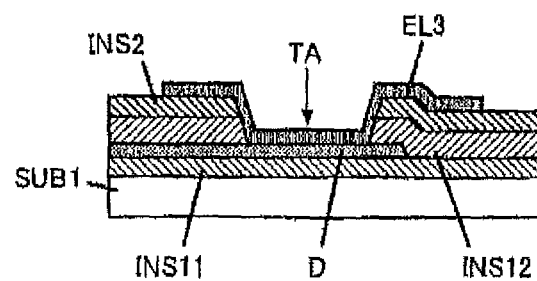
Figure 23C:
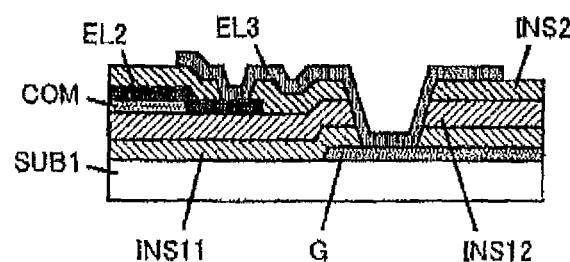
Figure 23D:
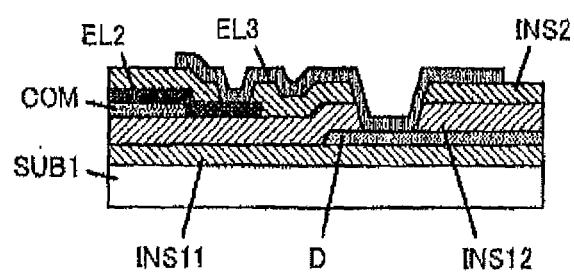

The sectional structures of terminal portions and interlayer connection portions that are formed by the manufacturing steps of the seventh embodiment, and of the tenth embodiment described later, are shown in FIGS. 23A to 23D. FIG. 23A shows a terminal portion of the scanning line SCN formed in the gate layer. FIG. 23B shows a terminal portion of the signal line SIG formed in the drain layer. FIG. 23C shows a connection portion between the common electrode wiring line COM and the gate layer. FIG. 23D shows a connection portion between the common electrode wiring line COM and the drain layer.

The terminal portions only need the transparent electrode EL3 because the layer of the second transparent pixel electrode EL3 (P) is formed immediately after the gate insulating film INS11, the passivation film INS12, and the second insulating film INS2 are treated at once.

However, since the common electrode wiring line COM or the transparent counter electrode EL2 (C) cannot be connected directly to the gate layer or the drain layer, the layer of the transparent electrode EL3 is connected to the common electrode wiring line COM through an opening in a portion of the second insulating film INS2 that is located above the transparent counter electrode EL2 (C), and the common electrode wiring line COM is connected to the gate layer and the drain layer through this layer of the transparent electrode EL3.

Eighth Embodiment

Figure 24A:
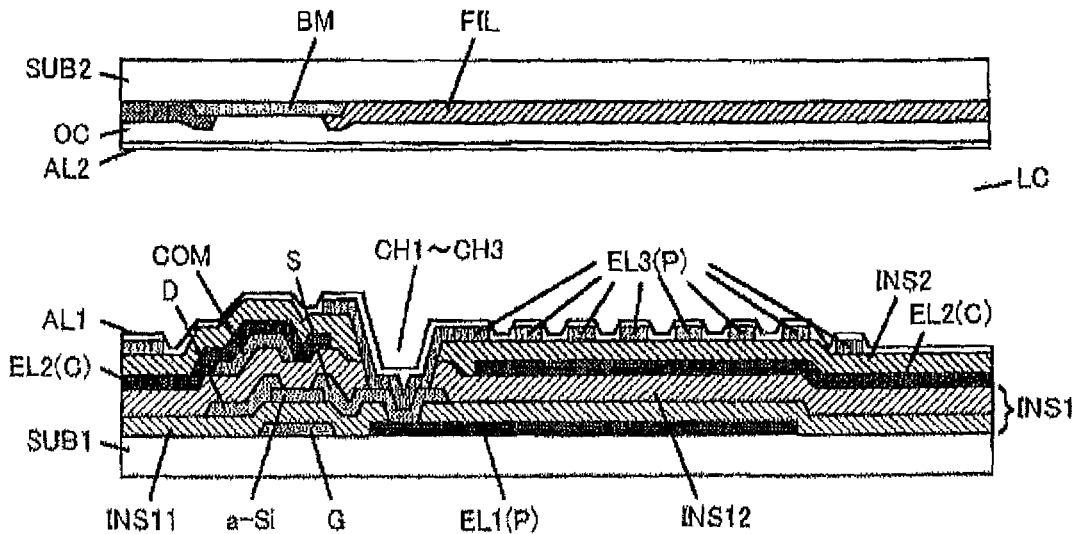
FIGS. 24A and 24B are schematic diagrams showing a pixel structure in the liquid crystal display device according to the eighth embodiment of the present invention.
Figure 24B:
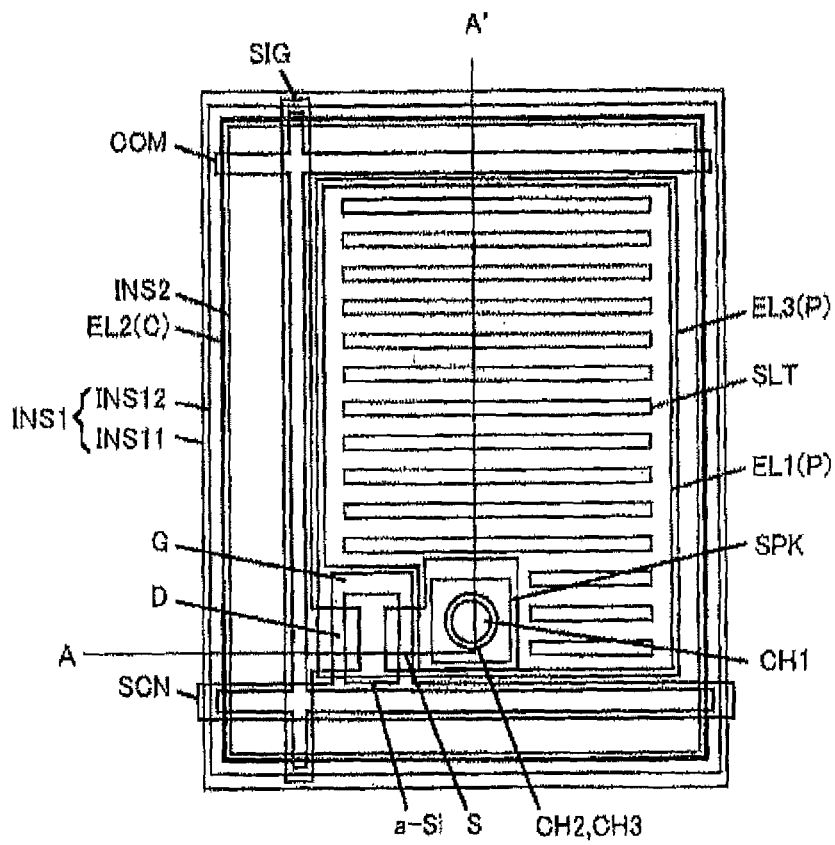

FIGS. 24A and 24B are schematic diagrams showing a pixel structure in a liquid crystal display device according to the eighth embodiment of the present invention. FIG. 24A shows the sectional structure of a pixel and FIG. 24B shows the plan view structure of the pixel on the TFT substrate side. The sectional structure shown in FIG. 24A corresponds to a view taken along the line A-A' illustrated in FIG. 24B.

The eighth embodiment is a modification example of the seventh embodiment, and differs from the seventh embodiment described with reference to FIGS. 21A and 21B in the following points.

The first transparent pixel electrode EL1 (P) is placed between the first substrate SUB1 and the gate insulating film INS11 instead of between the gate insulating film INS11 and the passivation film INS12, and a laminate constituted of the gate insulating film INS11 and the passivation film INS12 is used as the first insulating film INS1.

To accommodate this modification, the opening CH1 for electrically connecting the source electrode S of the thin film transistor TFT and the first transparent pixel electrode EL1 (P) to each other is formed in a portion of the gate insulating film INS11 that is located below the source electrode S.

The first insulating film INS1 and the second insulating film INS2 which are used for the first storage capacitor Cst1 and the second storage capacitor Cst2 respectively are thus given the same structures as in the first embodiment and the second embodiment.

The eighth embodiment differs from the first and second embodiments in that the first transparent pixel electrode EL1 (P) and the second transparent pixel electrode EL3 (P) serve as pixel electrodes P, whereas the transparent counter electrode EL2 (C) doubles as a counter electrode C and a storage capacitor electrode. An equivalent circuit that represents a single pixel in the eighth embodiment is the same as the one described in the second embodiment with reference to FIG. 7.

Figure 25A:
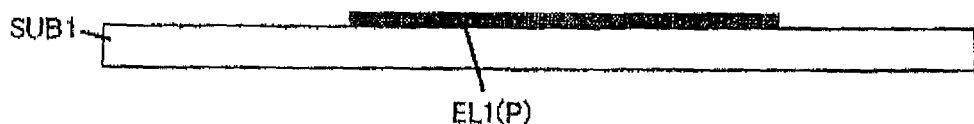
FIGS. 25A to 25H are diagrams showing steps of manufacturing a TFT substrate in the liquid crystal display device according to the eighth embodiment of the present invention.
Figure 25B:
Figure 25C:

FIGS. 25A to 25H show steps of manufacturing the TFT substrate in the liquid crystal display device according to the eighth embodiment. FIGS. 25A to 25C are the same as FIGS. 4A to 4C described in the first embodiment and FIGS. 8A to 8C described in the second embodiment, except that the storage capacitor wiring line STG and the common electrode wiring line COM are not formed in the gate layer and that the first transparent pixel electrode EL1 (P) is shaped differently.

Figure 25D:
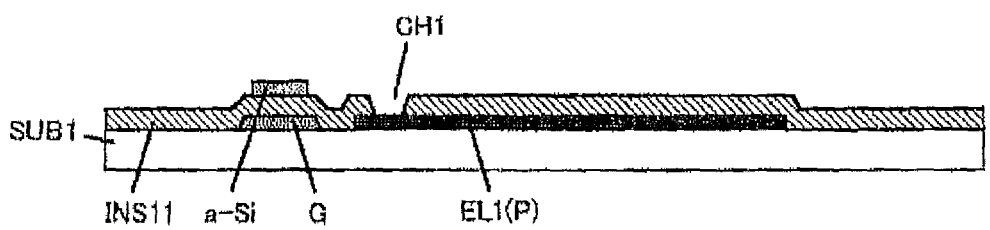

In FIG. 25D, the opening CH1 is formed by a photolithography process in a portion of the gate insulating film INS11 that is located above the first transparent pixel electrode EL1 (P) near the semiconductor layer a-Si made of amorphous silicon.

Figure 25E:
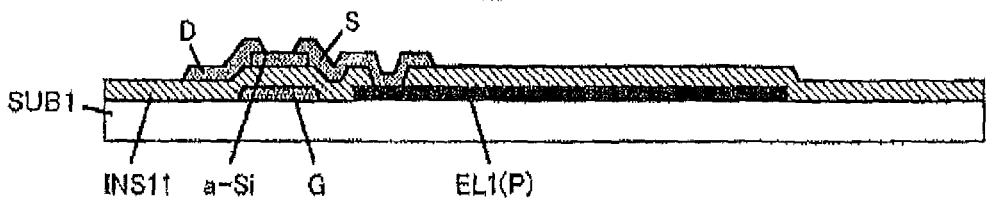

In FIG. 25E, a film is formed from a metal material and is treated by a photolithography process to form the source electrode S, the drain electrode D, and the signal line SIG (not shown) simultaneously. This layer is called a drain layer. A heavily doped n-type layer (not shown) which is on the top face of the semiconductor layer a-Si and which is not covered with the drain layer is removed at the same time when the drain layer is treated. The source electrode S and the first transparent pixel electrode EL1 (P) are electrically connected to each other through the opening CH1 formed in a portion of the gate insulating film INS11 that is located above the first transparent pixel electrode EL1 (P).

Figure 25F:
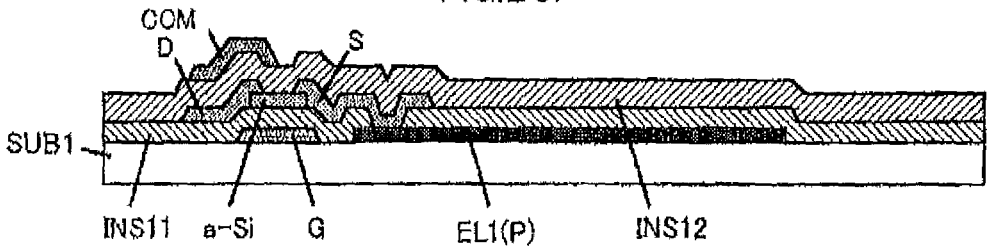

In FIG. 25F, the passivation film INS12 is formed from SiN. While the passivation film INS12 is left untreated, a film is formed from a metal material on the passivation film INS12 and is treated by a photolithography process to form the common electrode wiring line COM.

Figure 25G:
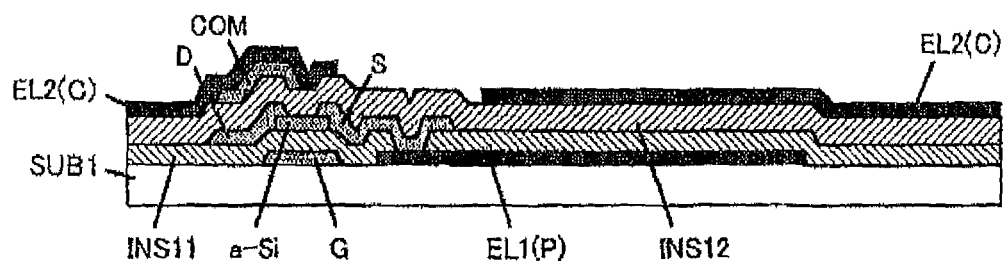

In FIG. 25G, a film is formed from a transparent conductive material such as ITO and is treated by a photolithography process to form the transparent counter electrode EL2 (C).

Figure 25H:
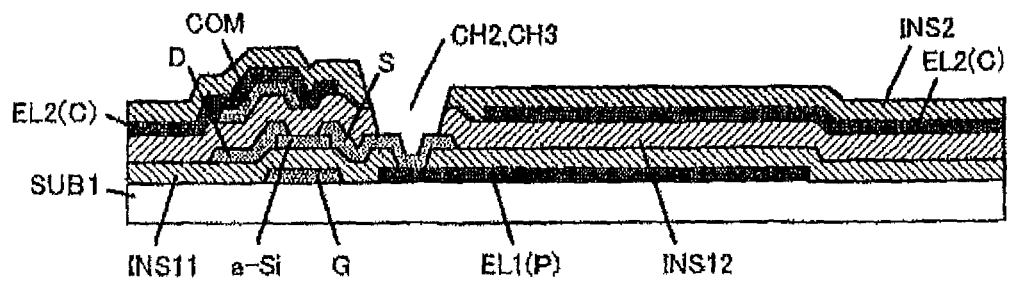

In FIG. 25H, the second insulating film INS2 is formed from SiN, and then three layers, the gate insulating film INS11, the passivation film INS12, and the second insulating film INS2, are treated by a photolithography process at once to form openings (CH2 and CH3) in a portion of the passivation film INS12 and a portion of the second insulating film INS2 that are located above the source electrode S.

Lastly, a film is formed from a transparent conductive material such as ITO and is treated by a photolithography process to form the second transparent pixel electrode EL3 (P) as the one shown in FIG. 24A.

The second transparent pixel electrode EL3 (P) is electrically connected to the source electrode S through the openings (CH2 and CH3) in a portion of the passivation film INS12 and a portion of the second insulating film INS2 that are located above the source electrode S.

The TFT substrate is thus manufactured by conducting a photolithography process nine times in total. The number of times a photolithography process is conducted in the eighth embodiment is larger than in the seventh embodiment by one, and is the same as in the first embodiment. The eighth embodiment therefore has the same effects that are obtained in the first embodiment. The order in which the steps of FIG. 25A and FIG. 25B are executed may be reversed.

Figure 26A:
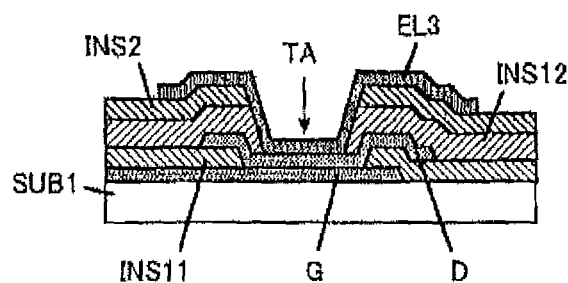
FIGS. 26A to 26D are sectional views showing the sectional structures of terminal portions and interlayer connection portions of the TFT substrate in the liquid crystal display device according to the eighth embodiment of the present invention.
Figure 26B:
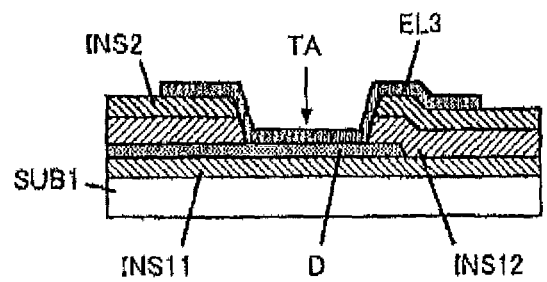
Figure 26C:
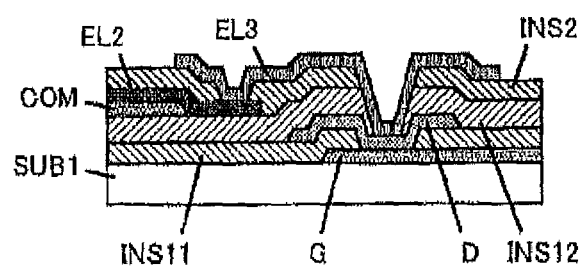
Figure 26D:
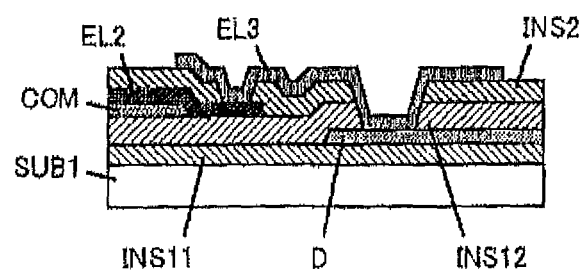

The sectional structures of terminal portions and interlayer connection portions that are formed by the manufacturing steps of the eighth embodiment are shown in FIGS. 26A to 26D. FIG. 26A shows a terminal portion of the scanning line SCN formed in the gate layer. FIG. 26B shows a terminal portion of the signal line SIG formed in the drain layer. FIG. 26C shows a connection portion between the common electrode wiring line COM and the gate layer. FIG. 26D shows a connection portion between the common electrode wiring line COM and the drain layer.

The opening in a portion of the gate insulating film INS11 that is located above the gate layer is covered with the drain layer in order to prevent the treatment of the drain layer from disturbing the gate layer.

The common electrode wiring line COM or the transparent counter electrode EL2 (C) cannot be connected directly to the gate layer and the drain layer. Therefore, as shown in FIGS. 26C and 26D, the layer of the transparent electrode EL3 is connected to the common electrode wiring line COM through the opening formed in a portion of the second insulating film INS2 that is located above the transparent counter electrode EL2 (C), and this layer of the transparent electrode EL3 is used to connect the common electrode wiring line COM to the exposed portion of the drain layer within the openings in the passivation film INS12 and the second insulating film INS2. The structures of FIGS. 26B and 26D are the same as those of FIGS. 23B and 23D described in the seventh embodiment.

Ninth Embodiment

In the seventh and eighth embodiments, as in the first to fourth embodiments, limitations are put on the material and thickness of the gate insulating film and the passivation film in consideration of the characteristics and reliability of the thin film transistor TFT, and an insulating film used for a storage capacitor is also bound by the limitations. In the ninth embodiment, as in the fifth and sixth embodiments, the first and second storage capacitors are moved to a layer above the passivation film and are each formed from a dedicated insulating film, thereby increasing the degree of freedom in selecting a material, a thickness, and the like for the first and second insulating films through which storage capacitors are formed.

Figure 27A:
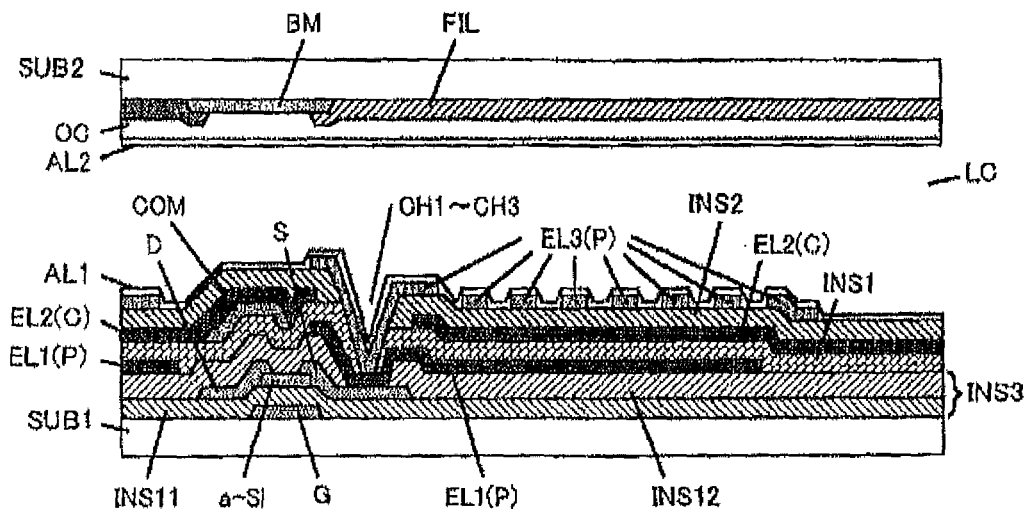
FIGS. 27A and 27B are schematic diagrams showing a pixel structure in the liquid crystal display device according to the ninth embodiment of the present invention.
Figure 27B:
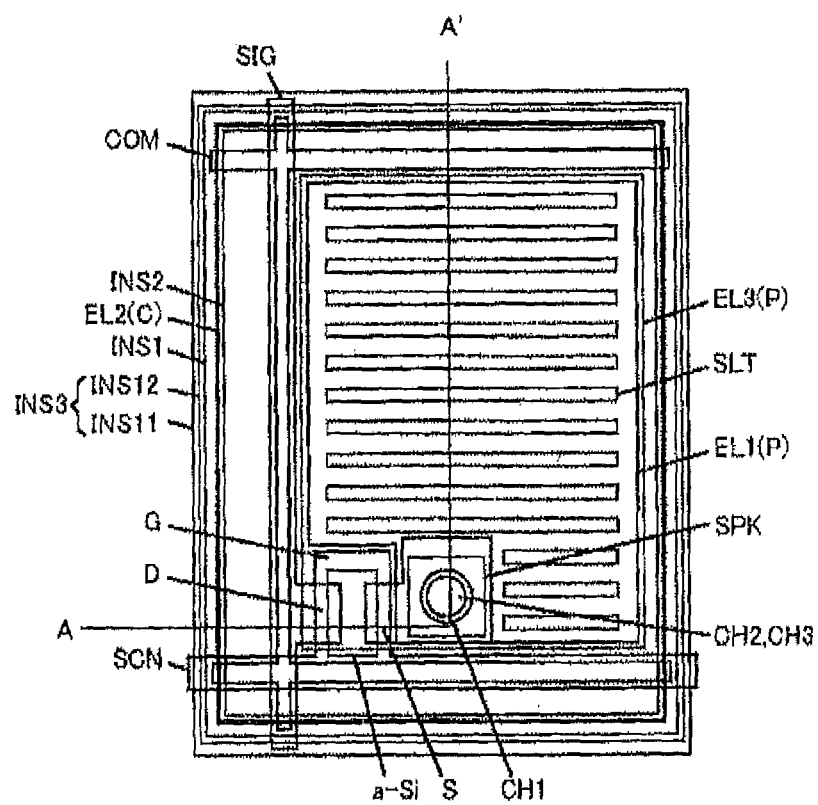

FIGS. 27A and 27B are schematic diagrams showing a pixel structure in a liquid crystal display device according to the ninth embodiment of the present invention. Shown in FIG. 27A is the sectional structure of a pixel, and shown in FIG. 27B is the plan view structure of the pixel on the TFT substrate side. The sectional structure of FIG. 27A corresponds to a view taken along the line A-A' illustrated in FIG. 27B.

On a first substrate SUB1, signal lines SIG are formed to intersect with scanning lines SCN with a gate insulating film INS11 interposed therebetween. Each pixel defined by the intersecting scanning lines SCN and signal lines SIG is provided with a thin film transistor TFT, a first transparent pixel electrode EL1 (P), which functions as the first transparent electrode and is shaped like a flat board, and a second transparent pixel electrode EL3 (P), which functions as the third transparent electrode.

The second transparent pixel electrode EL3 (P) has a planar shape with slit-like openings SLT which run parallel to one another. Alternatively, the second transparent pixel electrode EL3 (P) may have a planar shape like a slip or a comb.

The first transparent pixel electrode EL1 (P) between a passivation film INS12 and a first insulating film INS1 is electrically connected to a source electrode S of the thin film transistor TFT through an opening (contact hole) CH1 formed in a portion of the passivation film INS12 that is located above the source electrode S.

The second transparent pixel electrode EL3 (P) which is above a second insulating film INS2 is electrically connected to the first transparent pixel electrode EL1 (P) through openings (CH2 and CH3) formed in a portion of the first insulating film INS1 and a portion of the second insulating film INS2 that are located above the first transparent pixel electrode EL1 (P).

A transparent counter electrode EL2 (C), which functions as the second transparent electrode and doubles as a storage capacitor electrode, is formed between the first insulating film INS1 and the second insulating film INS2. The transparent counter electrode EL2 (C) has an opening SPK distanced from the openings (CH2 and CH3), which are formed in the first insulating film INS1 and the second insulating film INS2 to electrically connect the second transparent pixel electrode EL3 (P) and the source electrode S to each other, by at least a minimum insulation distance. A first storage capacitor Cst1 is formed between the first transparent pixel electrode EL1 (P) and the transparent counter electrode EL2 (C) through the first insulating film INS1. A second storage capacitor Cst2 is formed between the transparent counter electrode EL2 (C) and the second transparent pixel electrode EL3 (P) through the second insulating film INS2. A laminate made up of the gate insulating film INS11 and the passivation film INS12 below the first transparent pixel electrode EL1 (P) constitutes a third insulating film INS3.

A common electrode wiring line COM which is shaped after the shape of the scanning line SCN and the signal line SIG and which doubles as a storage capacitor wiring line STG is formed between the first insulating film INS1 and the transparent counter electrode EL2 (C). The transparent counter electrode EL2 (C) and the common electrode wiring line COM directly overlap each other to be electrically connected to each other and thereby lower the overall resistance of the counter electrode.

A first alignment film AL1 for aligning a liquid crystal layer LC in a given direction is formed in the topmost layer of the TFT substrate.

On a second substrate SUB2, a light shielding film (black matrix) BM, a color filter FIL whose color varies from one pixel to another, a protective film (overcoat) OC, and a second alignment film AL2 are formed to obtain a counter substrate.

The first alignment film AL1 and the second alignment film AL2 are each processed in advance so that liquid crystal molecules are aligned in a given direction. The first substrate SUB1 and the second substrate SUB2 are arranged such that their alignment film formation faces are opposed to each other across a predetermined interval, and the gap between the two is filled with a nematic liquid crystal composition having a positive dielectric anisotropy to form the liquid crystal layer LC.

The liquid crystal display device of this embodiment employs an IPS method electrode arrangement in which an electric field having a component parallel to the surface of the first substrate SUB1 is generated between the transparent counter electrode EL2 (C) and the second transparent pixel electrode EL3 (P) through the liquid crystal layer LC to form a pixel capacitor Cpx.

A retardation plate and polarization plate (not shown) are disposed outside of the first substrate SUB1 and the second substrate SUB2 to obtain an NB display mode liquid crystal display device.

Drive circuits (not shown) are connected to the scanning lines SCN, the signal lines SIG, and the common electrode wiring lines COM. An equivalent circuit that represents a single pixel in the ninth embodiment is the same as the one described in the second embodiment with reference to FIG. 7.

Figure 28A:
FIGS. 28A to 28H are diagrams showing steps of manufacturing a TFT substrate in the liquid crystal display device according to the ninth embodiment of the present invention.
Figure 28B:
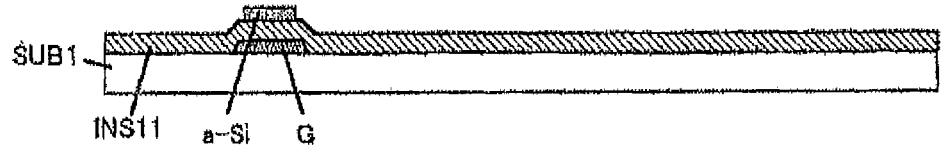
Figure 28C:
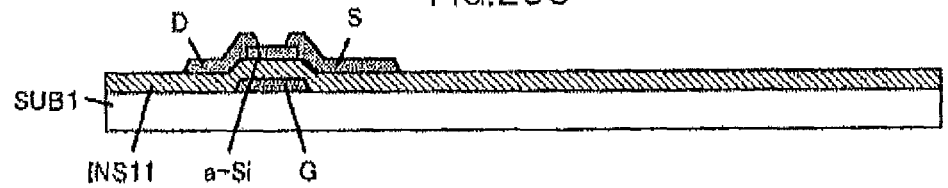

FIGS. 28A to 28H show steps of manufacturing the TFT substrate in the liquid crystal display device according to the ninth embodiment. FIGS. 28A to 28C are the same as FIGS. 22A to 22C described in the seventh embodiment.

Figure 28D:
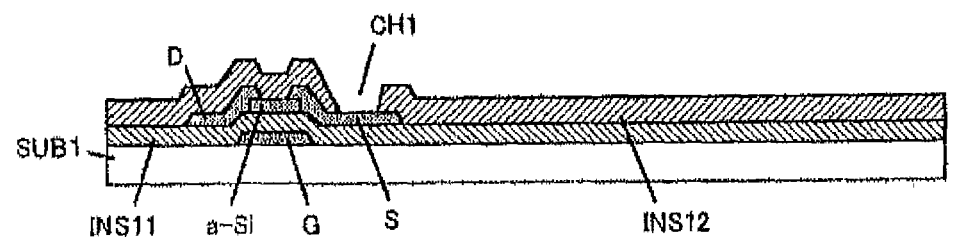

In FIG. 28D, the passivation film INS12 is formed from SiN, and then the gate insulating film INS11 and the passivation film INS12 are treated by a photolithography process at once. An opening (contact hole) CH1 is formed in a portion of the passivation film INS12 that is located above the source electrode S.

Figure 28E:
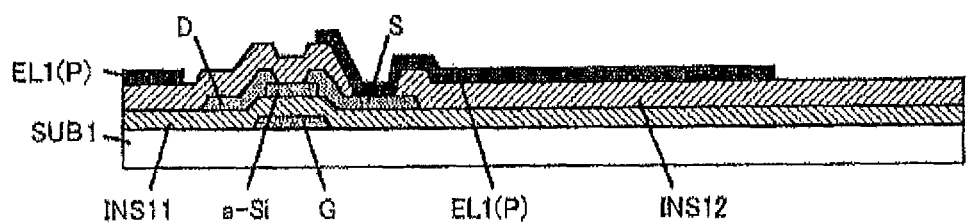

In FIG. 28E, a film is formed from a transparent conductive material such as ITO and is treated by a photolithography process to form the first transparent pixel electrode EL1 (P). The first transparent pixel electrode EL1 (P) is electrically connected to the source electrode S through the opening CH1 in the passivation film INS12.

Figure 28F:
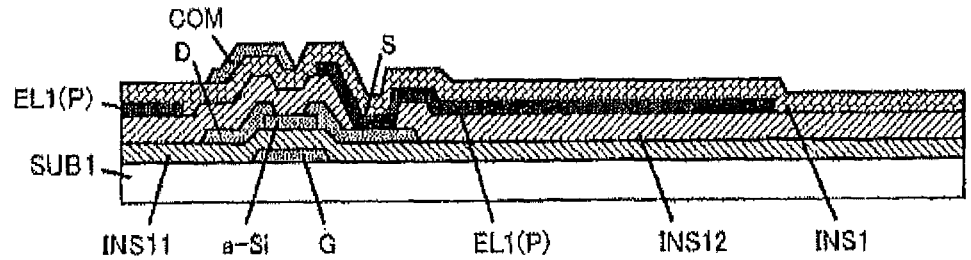

In FIG. 28F, the first insulating film INS1 is formed from SiN. While the first insulating film INS1 is left untreated, a film is formed from a metal material on the first insulating film INS1 and is treated by a photolithography process to form the common electrode wiring line COM.

Figure 28G:
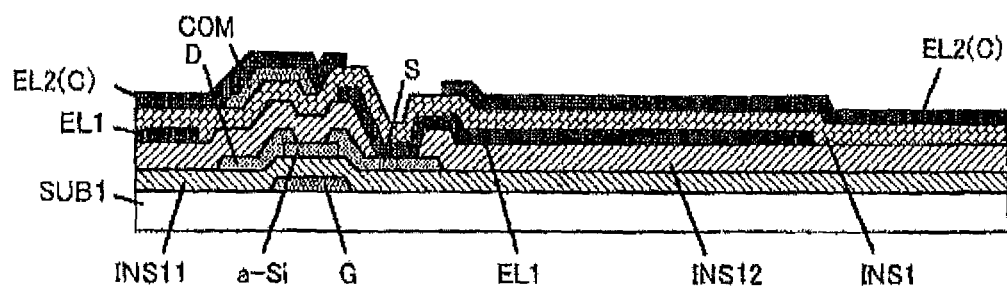

In FIG. 28G, a film is formed from a transparent conductive material such as ITO and is treated by a photolithography process to form the transparent counter electrode EL2 (C).

Figure 28H:
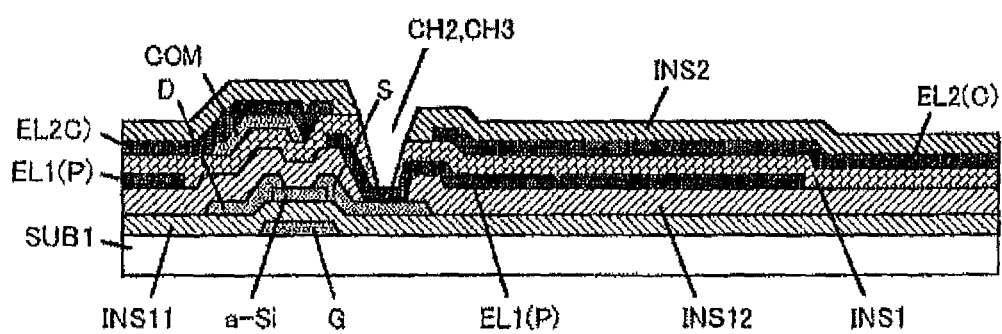

In FIG. 28H, the second insulating film INS2 is formed from SiN, and then the first insulating film INS1 and the second insulating film INS2 are treated by a photolithography process at once to form openings (CH2 and CH3) in a portion of the first insulating film INS1 and a portion of the second insulating film INS2 that are located above the first transparent pixel electrode EL1 (P).

Lastly, a film is formed from a transparent conductive material such as ITO and is treated by a photolithography process to form the second transparent pixel electrode EL3 (P) as the one shown in FIG. 27A.

The second transparent pixel electrode EL3 (P) is electrically connected to the first transparent pixel electrode EL1 (P) through the openings (CH2 and CH3) in a portion of the first insulating film INS1 and a portion of the second insulating film INS2 that are located above the first transparent pixel electrode EL1 (P).

The TFT substrate is thus manufactured by conducting a photolithography process nine times in total.

The steps of FIGS. 28A to 28E can be adopted from a manufacturing process of a fully transmissive liquid crystal display device that has already proven its effectiveness in mass production. Then, four subsequent steps are added to the steps of FIGS. 28A to 28E.

In the ninth embodiment, one more insulating films are formed than in the eighth embodiment, but the number of times a photolithography process is conducted in the ninth embodiment is the same as in the eighth embodiment. The ninth embodiment can thus increase the degree of freedom in selecting a material, a thickness, and the like for the first and second insulating films through which storage capacitors are formed without adding many steps to the manufacturing process of the eighth embodiment.

Figure 29A:
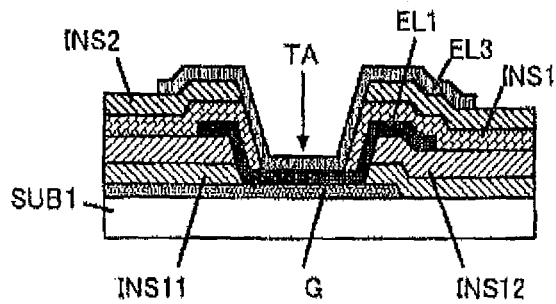
FIGS. 29A to 29D are sectional views showing the sectional structures of terminal portions and interlayer connection portions of the TFT substrate in the liquid crystal display device according to the ninth embodiment of the present invention.
Figure 29B:
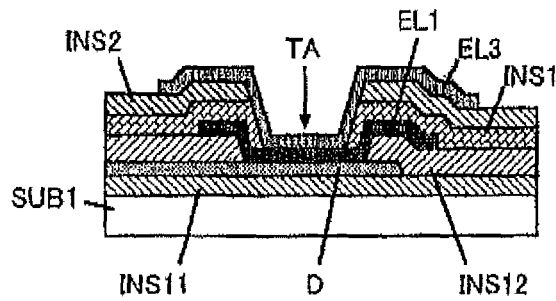
Figure 29C:
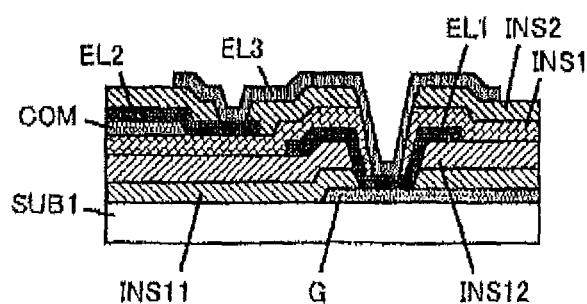
Figure 29D:
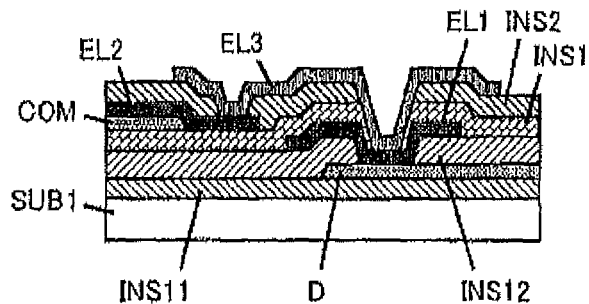

The sectional structures of terminal portions and interlayer connection portions that are formed by the manufacturing steps of the ninth embodiment are shown in FIGS. 29A to 29D. FIG. 29A shows a terminal portion of the scanning line SCN formed in the gate layer. FIG. 29B shows a terminal portion of the signal line SIG formed in the drain layer. FIG. 29C shows a connection portion between the common electrode wiring line COM and the gate layer. FIG. 29D shows a connection portion between the common electrode wiring line COM and the drain layer.

The transparent electrode EL1 is formed as shown in the drawings in order to prevent the simultaneous treatment of the first insulating film INS1 and the second insulating film INS2 from disturbing the gate insulating film INS11 and the passivation film INS12.

The common electrode wiring line COM or the transparent counter electrode EL2 (C) cannot be connected directly to the gate layer or the drain layer. Therefore, as shown in FIGS. 29C and 29D, the layer of the transparent electrode EL3 is connected to the common electrode wiring line COM through the opening formed in a portion of the second insulating film INS2 that is located above the transparent counter electrode EL2 (C), and this layer of the transparent electrode EL3 is used to connect the common electrode wiring line COM to the gate layer or the drain layer through the exposed portion of the layer of the transparent electrode EL1 within the openings in the first insulating film INS1 and the second insulating film INS2.

Tenth Embodiment

Figure 30A:
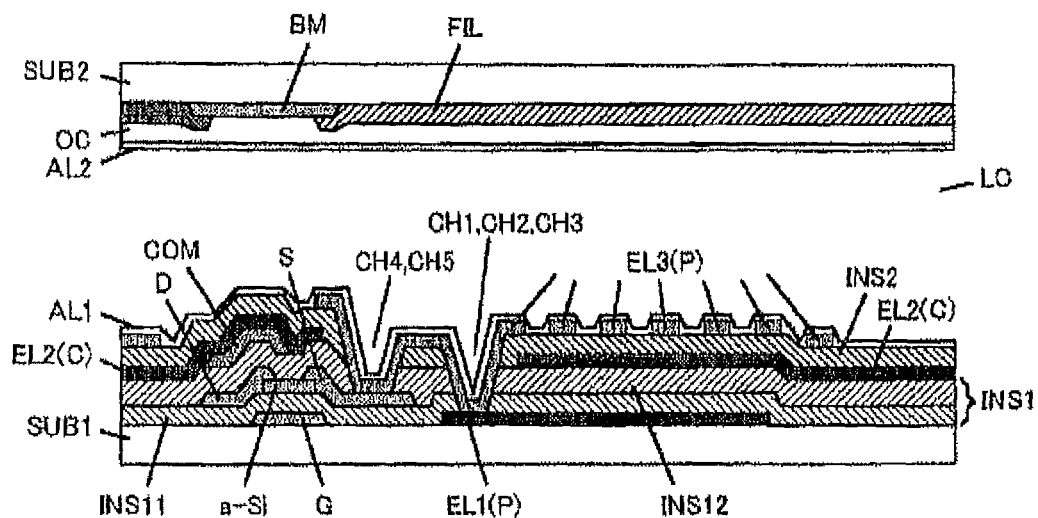
FIGS. 30A and 30B are schematic diagrams showing a pixel structure in the liquid crystal display device according to the tenth embodiment of the present invention.
Figure 30B:
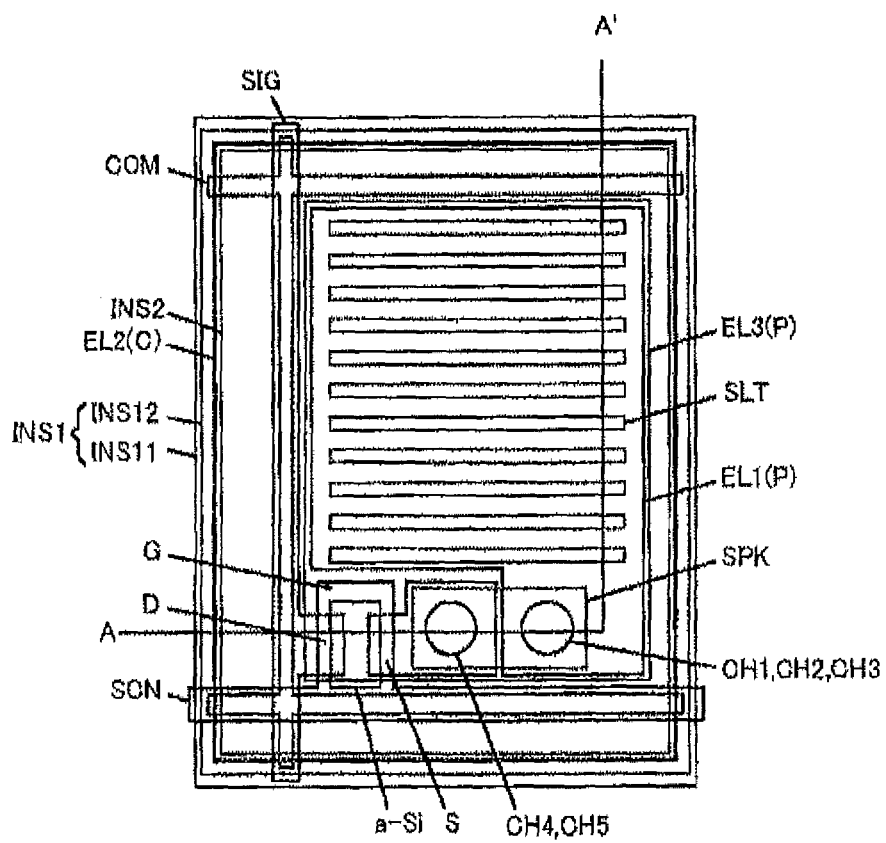

FIGS. 30A and 30B are schematic diagrams showing a pixel structure in a liquid crystal display device according to the tenth embodiment of the present invention. FIG. 30A shows the sectional structure of a pixel, and FIG. 30B shows the plan view structure of the pixel on the TFT substrate side. The sectional structure shown in FIG. 30A corresponds to a view taken along the line A-A' illustrated in FIG. 30B.

The tenth embodiment is a modification example of the eighth embodiment, and differs from the eighth embodiment described with reference to FIGS. 24A and 24B in the following points.

Instead of being connected directly to the source electrode S of the thin film transistor TFT through the opening in the gate insulating film INS11, the first transparent pixel electrode EL1 (P) is connected to the second transparent pixel electrode EL3 (P) through openings formed in the gate insulating film INS11, the passivation film INS12, and the second insulating film INS2, and hence the first transparent pixel electrode EL1 (P) is electrically connected to the source electrode S through the second transparent pixel electrode EL3 (P).

To accommodate this modification, openings (CH1 to CH3) for electrically connecting the second transparent pixel electrode EL3 (P) and the first transparent pixel electrode EL1 (P) to each other are formed in addition to openings (CH4 and CH5) that are formed in the passivation film INS12 and the second insulating film INS2 in order to electrically connect the second transparent pixel electrode EL3 (P) and the source electrode S to each other.

The opening SPK of the transparent counter electrode EL2 (C) in the tenth embodiment is shaped to be at least a minimum insulation distance apart from the openings (CH4 and CH5) that are formed in the passivation film INS12 and the second insulating film INS2 in order to electrically connect the second transparent pixel electrode EL3 (P) and the source electrode S to each other, and from the openings (CH1 to CH3) for electrically connecting the second transparent pixel electrode EL3 (P) and the first transparent pixel electrode EL1 (P) to each other. An equivalent circuit that represents a single pixel in the tenth embodiment is the same as the one in the second embodiment which is shown in FIG. 7.

In FIG. 30B where additional openings (CH1 to CH3) are formed in the gate insulating film INS11, the passivation film INS12, and the second insulating film INS2 in order to connect the second transparent pixel electrode EL3 (P) and the first transparent pixel electrode EL1 (P) to each other, the opening SPK of the transparent counter electrode EL2 (C) are larger than in FIG. 24B. The transparent counter electrode EL2 (C) accordingly has a smaller region where the slit-like openings SLT are provided to apply an electric field to the liquid crystal layer LC, and the aperture ratio is lowered compared to FIG. 24B. However, the structure of FIG. 30B has an advantage over the structure of FIG. 24B in that the number of TFT substrate manufacturing steps in the tenth embodiment is one step less than in the eighth embodiment, as described below.

Figure 31A:
FIGS. 31A to 31G are diagrams showing steps of manufacturing a TFT substrate in the liquid crystal display device according to the tenth embodiment of the present invention.
Figure 31B:
Figure 31C:
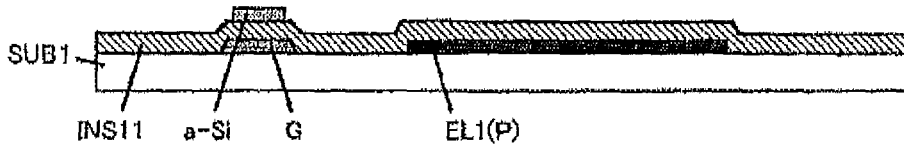

FIGS. 31A to 31G show steps of manufacturing the TFT substrate in the liquid crystal display device according to the tenth embodiment. FIGS. 31A to 31C are the same as FIGS. 25A to 25C described in the eighth embodiment except for the shape of the first transparent pixel electrode EL1 (P).

Figure 31D:
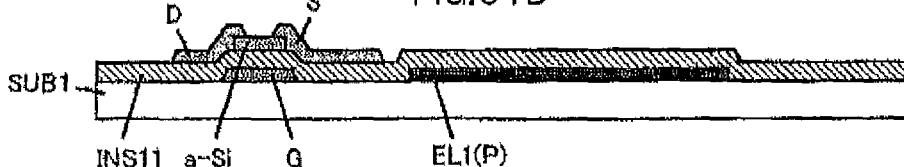

In FIG. 31D, a film is formed from a metal material and is treated by a photolithography process to form the source electrode S, the drain electrode D, and the signal line SIG (not shown) simultaneously. This layer is called a drain layer. A heavily doped n-type layer (not shown) which is on the top face of the semiconductor layer a-Si and which is not covered with the drain layer is removed at the same time when the drain layer is treated.

Figure 31E:
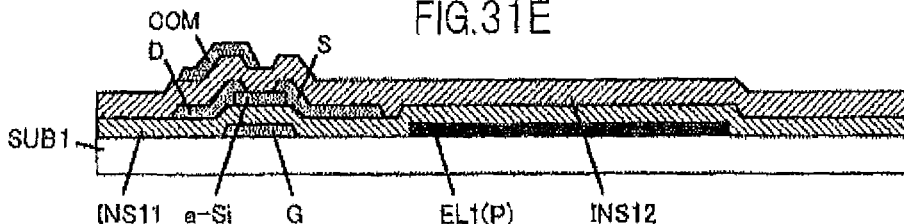

In FIG. 31E, the passivation film INS12 is formed from SiN. While the passivation film INS12 is left untreated, a film is formed from a metal material on the passivation film INS12 and is treated by a photolithography process to form the common electrode wiring line COM.

Figure 31F:
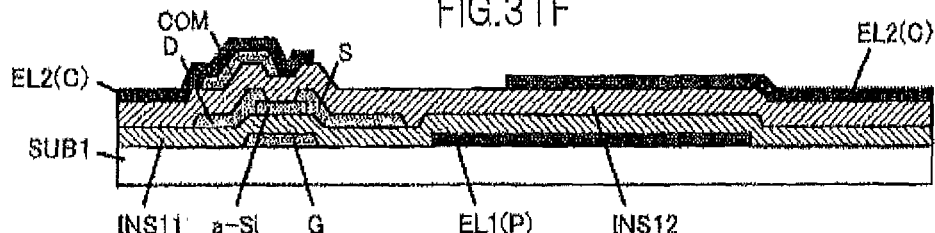

In FIG. 31F, a film is formed from a transparent conductive material such as ITO and is treated by a photolithography process to form the transparent counter electrode EL2 (C).

Figure 31G:
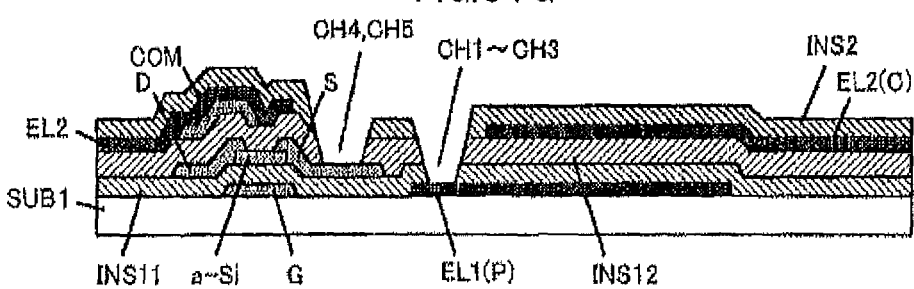

In FIG. 31G, the second insulating film INS2 is formed from SiN, and then three layers, the gate insulating film INS11, the passivation film INS12, and the second insulating film INS2, are treated by a photolithography process at once to form openings (CH4 and CH5) in a portion of the passivation film INS12 and a portion of the second insulating film INS2 that are located above the source electrode S. At the same time, openings (CH1 to CH3) are formed in a portion of the gate insulating film INS11, a portion of the passivation film INS12, and a portion of the second insulating film INS2 that are located above the first transparent pixel electrode EL1 (P).

Lastly, a film is formed from a transparent conductive material such as ITO and is treated by a photolithography process to form the second transparent pixel electrode EL3 (P) as the one shown in FIG. 30A.

The second transparent pixel electrode EL3 (P) is electrically connected to the source electrode S through the openings (CH4 and CH5) in a portion of the passivation film INS12 and a portion of the second insulating film INS2 that are located above the source electrode S. The second transparent pixel electrode EL3 (P) is electrically connected to the first transparent pixel electrode EL1 (P) through the openings (CH1 to CH3) in a portion of the gate insulating film INS11, a portion of the passivation film INS12, and a portion of the second insulating film INS2 that are located above the first transparent pixel electrode EL1 (P).

The TFT substrate is thus manufactured by conducting a photolithography process eight times in total. In other words, the number of times a photolithography process is conducted in the tenth embodiment is smaller than in the eighth embodiment by one, and is the same as in the second embodiment.

An effect obtained in the tenth embodiment is that the aperture ratio can be improved more easily than in the second embodiment because the common electrode wiring line COM is shaped so as to overlap the scanning line SCN flatly with the gate insulating film INS11 and the passivation film INS12 interposed between the two. The order in which the steps of FIG. 31 and FIG. 31B are executed may be reversed as in the eighth embodiment.

Terminal portions and interlayer connection portions that are formed by the manufacturing steps of the tenth embodiment are the same as those in the seventh embodiment which are shown in FIGS. 23A to 23D.

Eleventh Embodiment

The eleventh embodiment is a modification example in which an organic insulating film FPS is formed from photosensitive acrylic resin or the like on the passivation film in the IPS liquid crystal display devices according to the first to tenth embodiments.

FIGS. 32A to 32J show modification examples of the sectional structures of the pixels on the TFT substrate side in the first to tenth embodiments, respectively.

In FIGS. 32A, 32B, 32G, 32H, and 32J, the capacitance of the first storage capacitor Cst1 formed between the transparent electrode EL2 and the transparent electrode EL1 is prevented from dropping by not forming the organic insulating film FPS in a region where the transparent electrode EL2 and the transparent electrode EL1 overlap each other with the first insulating film INS1 interposed between the two to form the first storage capacitor Cst1.

On the other hand, the organic insulating film FPS is formed in regions where the transparent electrode EL2 overlaps the scanning line SCN, the common electrode wiring line COM, and the signal line SIG, to thereby lower the capacitance of parasitic capacitors.

Figure 32A:
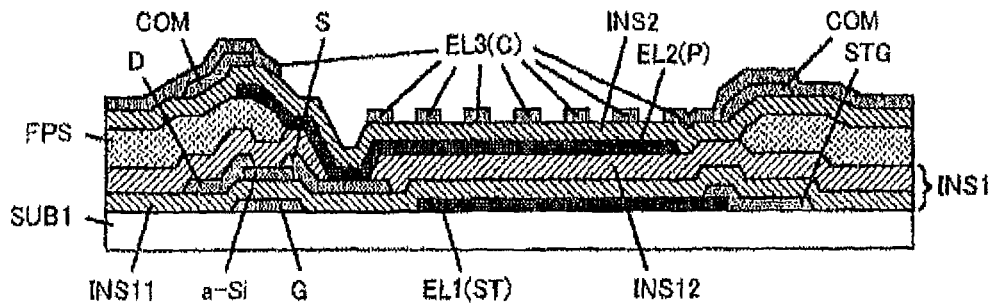
FIGS. 32A to 32J are schematic diagrams showing modification examples of the pixel structures in the liquid crystal display devices according to the first to tenth embodiments of the present invention.
Figure 32B:
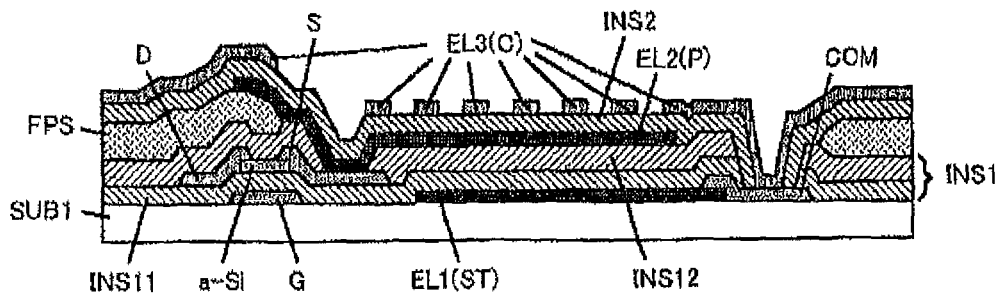
Figure 32C:
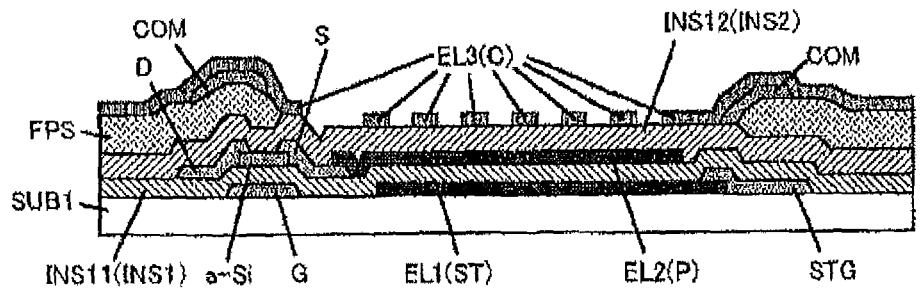
Figure 32D:
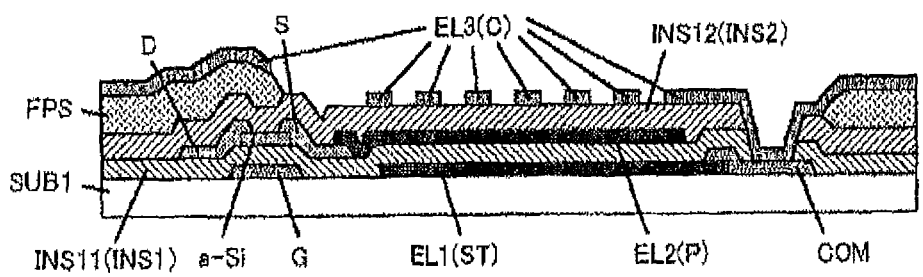

In FIGS. 32C and 32D, the capacitance of the second storage capacitor Cst2 formed between the transparent electrode EL3 and the transparent electrode EL2 is prevented from dropping by not forming the organic insulating film FPS in a region where the transparent electrode EL3 and the transparent electrode EL2 overlap each other with the second insulating film INS2 interposed between the two to form the second storage capacitor Cst2.

On the other hand, the organic insulating film FPS is formed in regions where the transparent electrode EL3 overlaps the scanning line SCN and the signal line SIG, to thereby lower the capacitance of parasitic capacitors.

Figure 32E:
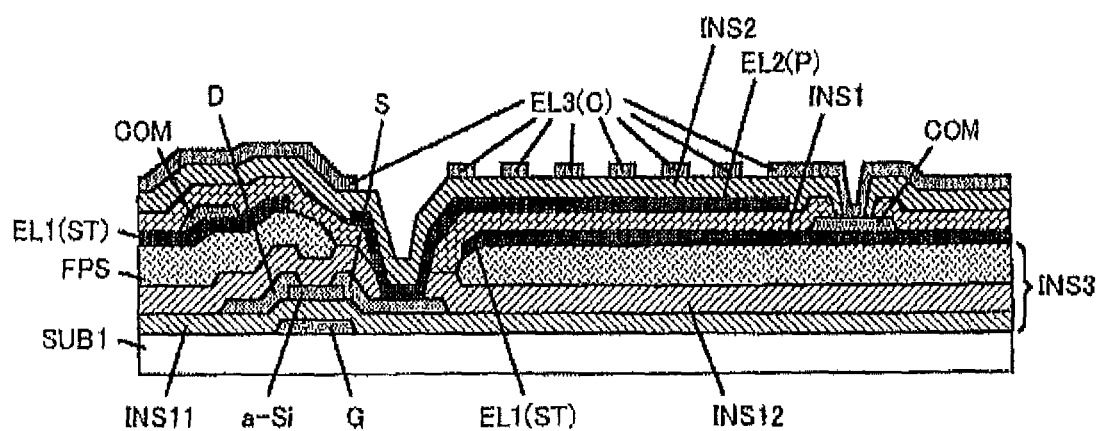
Figure 32F:
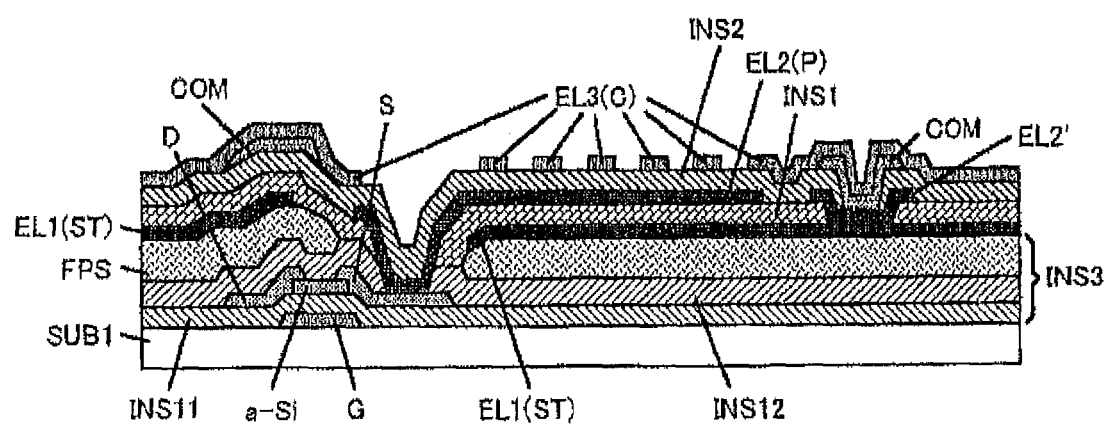
Figure 32G:
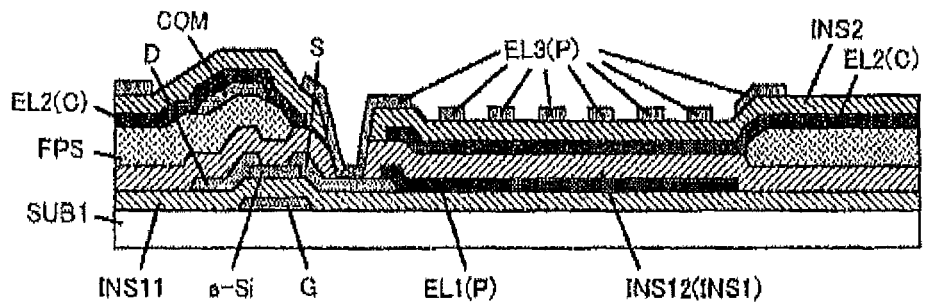
Figure 32H:
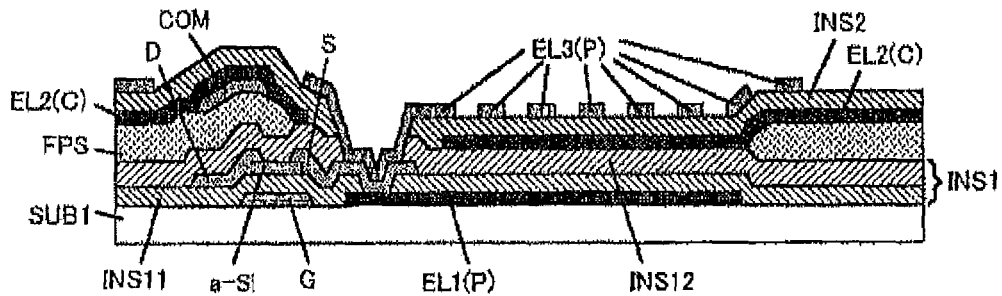
Figure 32I:
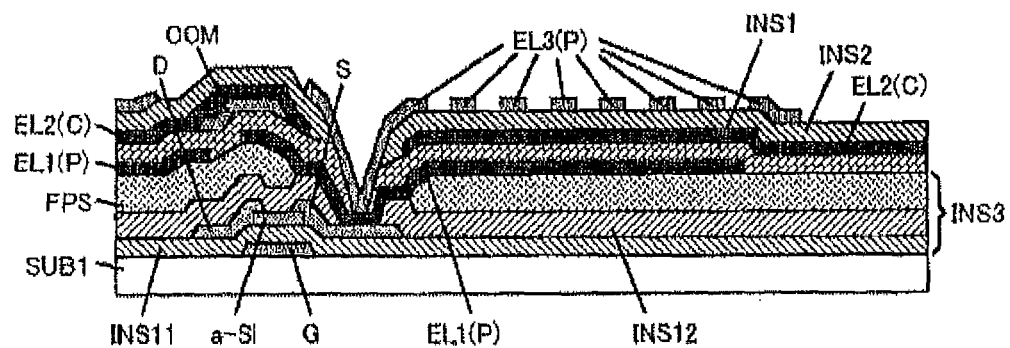
Figure 32J:
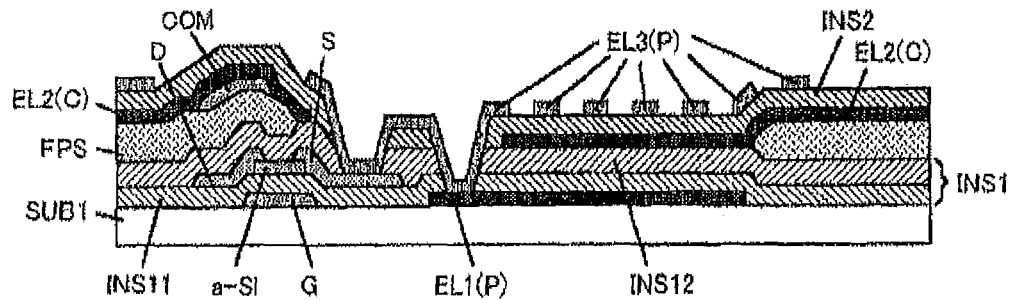

In FIGS. 32E, 32F, and 32I, forming the organic insulating film FPS in a region where the first storage capacitor Cst1 is formed and in a region where the second storage capacitor Cst2 is formed does not influence the capacitance of the first storage capacitor Cst1 and the second storage capacitor Cst2. Accordingly, the organic insulating film FPS is formed avoiding openings (CH1 and CH2) in a portion of the passivation film INS12 and a portion of the first insulating film INS1 that are located above the source electrode S of the thin film transistor TFT. This reduces the capacitance of the parasitic capacitors between the transparent electrode EL1 and the scanning line SCN and between the transparent electrode EL1 and the signal line SIG, and levels the pixel surface as well.

In any of the above-mentioned cases, the additional step of forming the organic insulating film FPS increases the number of the TFT substrate manufacturing steps. However, since the capacitance of a parasitic capacitor is lowered by providing the TFT substrate with the organic insulating film FPS, degradation in image quality can be prevented without increasing the capacitance of storage capacitors much.

In FIGS. 32E, 32F, and 32I, a reflective electrode may be formed along a minute concave-convex structure, which is formed in at least part of the organic insulating film FPS in the display area within a single pixel. This makes it possible to apply the structure of this invention to a transflective or reflective liquid crystal display device that has an internal diffuse reflection structure.

In FIGS. 32E and 32I, part of the common electrode wiring line COM can be used as a reflective electrode. In FIGS. 32F and 32I, a reflective electrode may be provided as a component separate from the common electrode wiring line COM. It is preferred in this case to form the reflective electrode below or above the transparent electrode EL1 so that the minute concave-convex structure is reflected well. In any of those cases, the reflective display portion may be provided with a liquid crystal layer thickness adjusting layer.

When the structures of FIGS. 32A, 32B, 32C, 32D, 32G, 32H, and 32J are applied to a transflective liquid crystal display device, the reflective display portion may be constituted of the organic insulating film FPS with a minute concave-convex structure which is formed in at least part of the display area within a single pixel and a reflective electrode which is formed above the organic insulating film FPS. Desirably, however, the organic insulating film FPS is not formed in the transmissive display portion, and hence a sufficiently large storage capacitor is secured. This way, the organic insulating film FPS placed in the reflective display portion also functions as a liquid crystal layer thickness adjusting layer.

In FIGS. 32A, 32B, 32C, 32D, 32G, 32H, and 32J, a light shielding film (black matrix) BM may be formed from an insulating material in place of the organic insulating film FPS. The light shielding film BM on the side of the second substrate SUB2 in this case is not always necessary.

In FIGS. 32E, 32F, and 32I, a color filter FIL whose color varies from one pixel to another may be provided in place of the organic insulating film FPS. The color filter FIL on the side of the second substrate SUB2 in this case is not always necessary.

Twelfth Embodiment

The twelfth embodiment discusses an example of the structure of a vertical-field driven liquid crystal display device. In vertical field driving where the liquid crystal layer LC is driven by a major electric field generated in the thickness direction of the liquid crystal layer LC, the third transparent electrode EL3 which is closest to the liquid crystal layer LC on the TFT substrate side needs to function as a pixel electrode P.

FIGS. 33A to 33H are schematic diagrams showing the sectional structures of a pixel on the TFT substrate side in a liquid crystal display device according to the twelfth embodiment.

FIGS. 33A, 33C, 33E, and 33G show structures in which the seventh to tenth embodiments are applied to a vertical-field driven liquid crystal display device, respectively, and correspond to the TFT substrate side sectional structures shown in FIGS. 21A, 24A, 27A, and 30A, respectively.

FIGS. 33A, 33C, 33E, and 33G merely differ from FIGS. 21A, 24A, 27A, and 30A in that the second transparent pixel electrode EL3 (P) does not have slit-like openings which run parallel to one another, that the transparent electrode EL2 is a storage capacitor electrode that does not double as a counter electrode, and that the metal wiring line below the transparent storage capacitor electrode EL2 (ST) is accordingly the storage capacitor wiring line STG instead of the common electrode wiring line COM. A TFT substrate manufacturing process of this embodiment can therefore adopt the steps shown in FIGS. 22A to 22G, the steps shown in FIGS. 25A to 25H, the steps shown in FIGS. 28A to 28H, and the steps shown in FIGS. 31A to 31G.

Terminal portions and interlayer connection portions in this embodiment can have the same structures as the ones shown in FIGS. 23A to 23D, the ones shown in FIGS. 26A to 26D, the ones shown in FIGS. 29A to 29D, and the ones shown in FIGS. 23A to 23D.

FIGS. 33B, 33D, 33F, and 33H show modification examples in which an organic insulating film FPS is formed from photosensitive acrylic resin or the like on the passivation film in the vertical-field mode liquid crystal display devices of FIGS. 33A, 33C, 33E, and 33G, respectively.

Figure 33A:
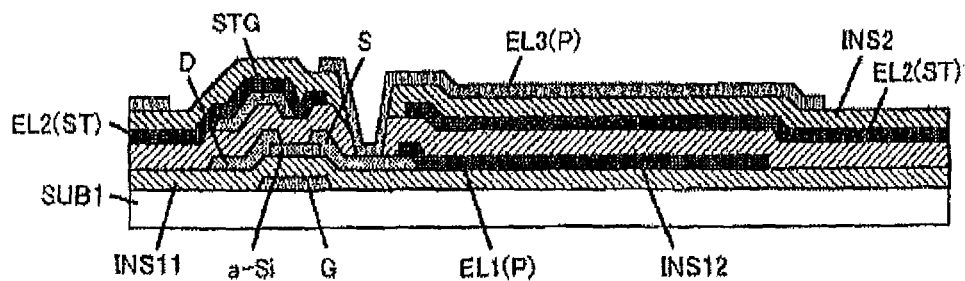
FIGS. 33A to 33H are schematic diagrams showing examples of a pixel structure in a liquid crystal display device according to a twelfth embodiment of the present invention.
Figure 33B:
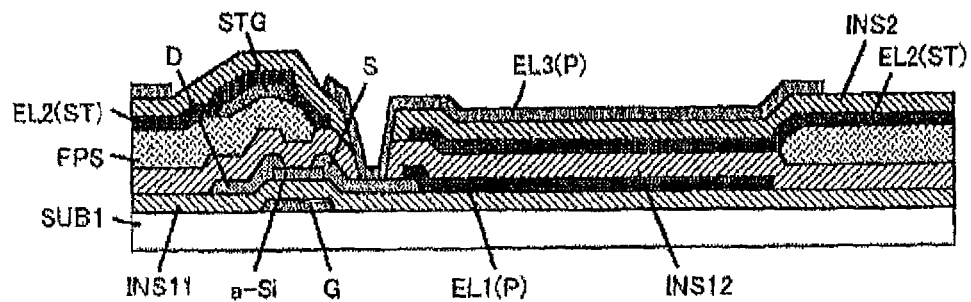
Figure 33C:
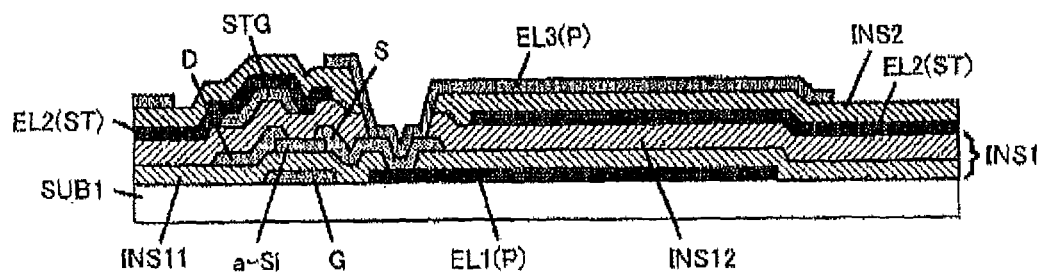
Figure 33D:
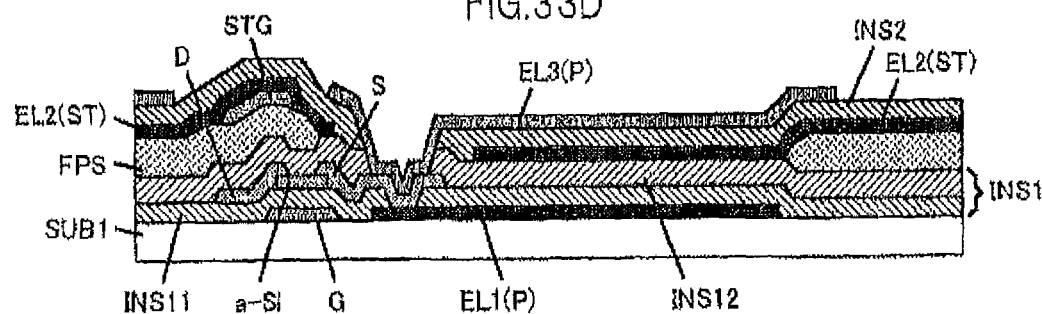
Figure 33E:
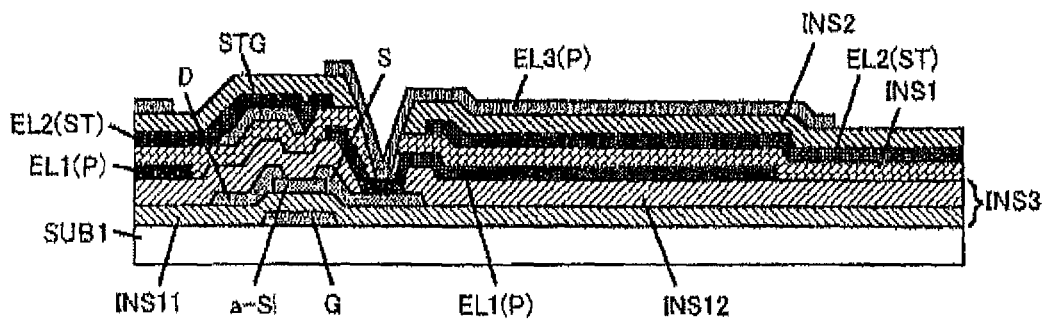
Figure 33F:
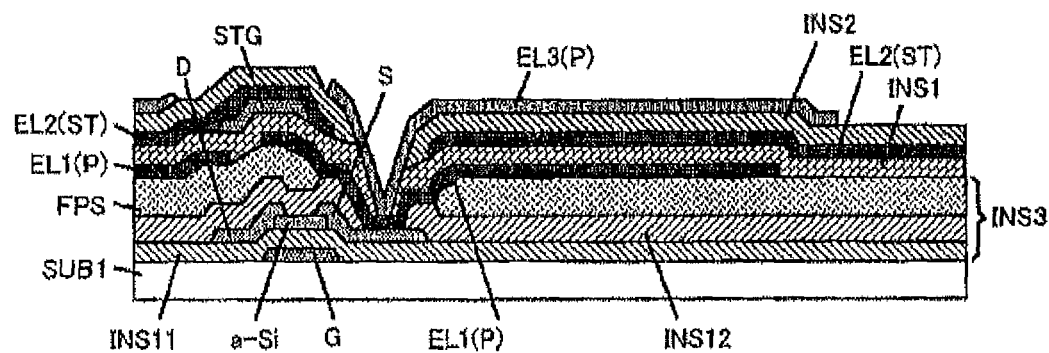
Figure 33G:
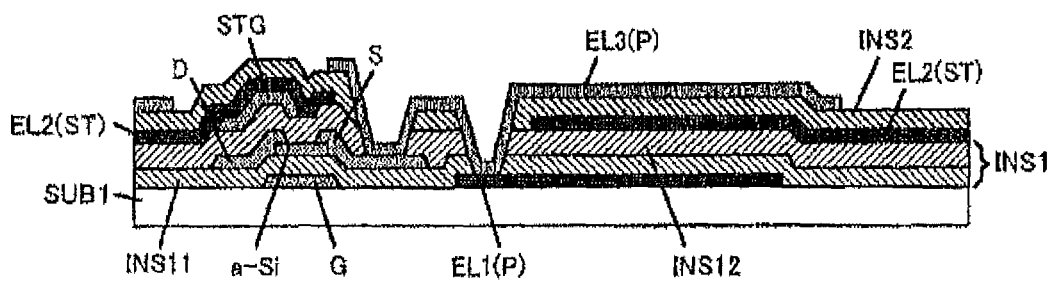
Figure 33H:
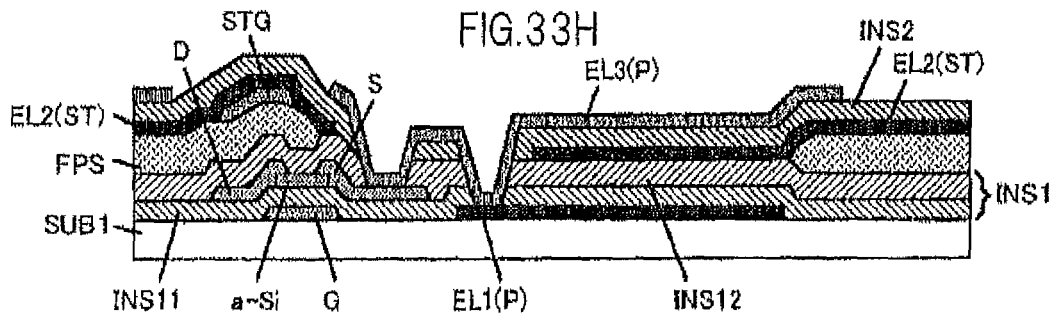

In FIGS. 33B, 33D, and 33H, the capacitance of the first storage capacitor Cst1 formed between the first transparent pixel electrode EL1 (P) and the transparent storage capacitor electrode EL2 (ST) is prevented from dropping by not forming the organic insulating film FPS in a region where the transparent storage capacitor electrode EL2 (ST) and the first transparent pixel electrode EL1 (P) overlap each other with the first insulating film INS1 interposed between the two to form the first storage capacitor Cst1.

On the other hand, the organic insulating film FPS is formed in regions where the transparent storage capacitor electrode EL2 (ST) overlaps the scanning line SCN and the signal line SIG, to thereby lower the capacitance of parasitic capacitors.

In FIG. 33F, forming the organic insulating film FPS in a region where the first storage capacitor Cst1 is formed and in a region where the second storage capacitor Cst2 is formed does not influence the capacitance of the first storage capacitor Cst1 and the second storage capacitor Cst2. Accordingly, the organic insulating film FPS is formed avoiding an opening (CH1) in a portion of the passivation film INS12 that is located above the source electrode S of the thin film transistor TFT. This reduces the capacitance of the parasitic capacitors between the first transparent pixel electrode EL1 (P) and the scanning line SCN and between the first transparent pixel electrode EL1 (P) and the signal line SIG, and levels the pixel surface as well.

Providing the TFT substrate with the organic insulating film FPS lowers the capacitance of a parasitic capacitor, and degradation in image quality can therefore be prevented without increasing the capacitance of storage capacitors much.

Components of the liquid crystal display device on the side of the second substrate SUB2 are omitted from FIGS. 33A to 33H, but a fourth transparent electrode EL4 which serves as a counter electrode is formed from a transparent conductive material such as ITO on a face of the second substrate SUB2 that is close to the liquid crystal layer. The fourth transparent electrode EL4 also functions as the common electrode wiring line COM.

Figure 34A:
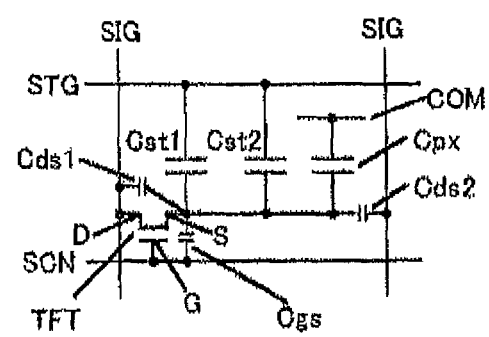
FIG. 34A is a circuit diagram showing an equivalent circuit that represents a single pixel in the liquid crystal display device according to the twelfth embodiment of the present invention.

FIG. 34A shows an equivalent circuit that represents a single pixel in the liquid crystal display device according to the twelfth embodiment. The first transparent pixel electrode EL1 (P), the second transparent pixel electrode EL3 (P), or the source electrode S is provided with a parasitic capacitor Cgs, which is formed between the gate (G) and source (S) of the thin film transistor TFT, and parasitic capacitors Cds1 and Cds2, which are formed by the electrode EL1, EL3, or S and the signal lines SIG, in addition to the first storage capacitor Cst1, the second storage capacitor Cst2, and the pixel capacitor Cpx.

As in all the other embodiments, when the pixel dimensions are reduced to obtain fine pixels, an equivalent storage capacitor sufficiently large in relation to the parasitic capacitors including Cgs, Cds1, and Cds2 can be formed from the parallel capacitance of the first storage capacitor Cst1 and the second storage capacitor Cst2.

This makes the voltage of the second transparent pixel electrode EL3 (P) less susceptible to feed-through voltage, which is caused by a voltage change in the scanning line SCN or the signal line SIG, during a hold period in which the thin film transistor TFT is off. Phenomena called smearing and cross talk can thus be prevented.

It also reduces the leakage of accumulated electric charges from the first transparent pixel electrode EL1 (P), the second transparent pixel electrode EL3 (P), and the source electrode (S) during a hold period, thereby allowing the electric field applied to the liquid crystal layer LC to drop less. Accordingly, degradation in image quality can be avoided.

Furthermore, since the first storage capacitor Cst1 and the second storage capacitor Cst2 are constituted of the first transparent pixel electrode EL1 (P), the first insulating film INS1, the transparent storage capacitor electrode EL2 (ST), the second insulating film INS2, and the second transparent pixel electrode EL3 (P), which are all transparent, forming a storage capacitor that is sufficiently large in relation to the parasitic capacitor does not lower the aperture ratio of the transmissive display portion. The formation of a sufficiently large storage capacitor and the securing of a sufficiently high aperture ratio are thus accomplished simultaneously.

As in the seventh to tenth embodiments, the storage capacitor wiring line STG and the transparent storage capacitor electrode EL2 (ST) in one pixel row may be separated from those in another pixel row to receive voltage application independently of those in the other pixel row, or the storage capacitor wiring line STG and the transparent storage capacitor electrode EL2 (ST) in one pixel column may be separated from those in another pixel column to receive voltage application independently of those in the other pixel column, although, from the standpoint of reducing the resistance of the storage capacitor wiring line, it is preferred to connect the storage capacitor wiring line STG and the transparent storage capacitor electrode EL2 (ST) in one pixel to those in adjacent pixels so that a voltage is applied commonly to all pixels.

The voltage of the storage capacitor wiring line STG, namely, the voltage of the transparent storage capacitor electrode EL2 (ST), may be the same as the voltage of the fourth transparent electrode EL4, which does not mean that the two always need to match.

A second storage capacitor wiring line STG2 may be formed in the gate layer below the source electrode S, to thereby form a third storage capacitor Cst3 between the source electrode S and the second storage capacitor wiring line STG2 through the gate insulating film.

Figure 34B:
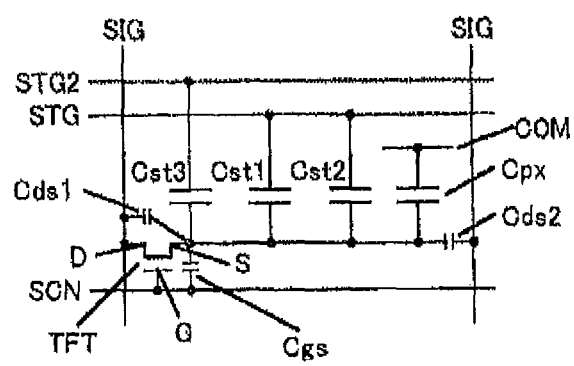
FIG. 34B is a circuit diagram showing a modification example of the equivalent circuit that represents a single pixel in the liquid crystal display device according to the twelfth embodiment of the present invention.

The third storage capacitor Cst3 in this case constitutes an equivalent circuit as the one shown in FIG. 34B. A voltage is applied to the second storage capacitor wiring line STG2 commonly to all pixels, or individually on a pixel row basis. The voltage of the storage capacitor wiring line STG and the voltage of the second storage capacitor wiring line STG2 may be the same, which does not mean that the two always need to match.

The structure of the twelfth embodiment is also applicable to a reflective or transflective liquid crystal display device that employs a vertical-field driven liquid crystal display mode.

In this case, a reflective electrode is formed in at least part of one of the first transparent pixel electrode EL1 (P), the transparent storage capacitor electrode EL2 (ST), and the second transparent pixel electrode EL3 (P) to be used as the reflective display portion, which may be provided with a liquid crystal layer thickness adjusting layer.

FIG. 33F, in particular, can be applied to a transflective or reflective liquid crystal display device that has an internal diffuse reflection structure if a reflective electrode is formed along a minute concave-convex structure, which is formed in at least part of the organic insulating film FPS in the display area within a single pixel.

Part of the storage capacitor wiring line STG may be used as a reflective electrode. Desirably, however, a reflective electrode separate from the storage capacitor wiring line STG is formed below or above the first transparent pixel electrode EL1 (P), and hence the minute concave-convex structure is reflected well.

In the case where FIGS. 33B, 33D, and 33H are applied to a transflective liquid crystal display device, the reflective display portion may be constituted of the organic insulating film FPS with a minute concave-convex structure which is formed in at least part of the display area within a single pixel and a reflective electrode which is formed above the organic insulating film FPS.

Desirably, however, the organic insulating film FPS is not formed in the transmissive display portion, and hence a sufficiently large storage capacitor is secured. In this way, the organic insulating film FPS placed in the reflective display portion also functions as a liquid crystal layer thickness adjusting layer.

In FIGS. 33B, 33D, and 33H, a light shielding film (black matrix) BM may be formed from an insulating material in place of the organic insulating film FPS. The light shielding film BM on the side of the second substrate SUB2 in this case is not always necessary.

In FIG. 33F, a color filter FIL whose color varies from one pixel to another may be provided in place of the organic insulating film FPS. The color filter FIL on the side of the second substrate SUB2 in this case is not always necessary.

The second transparent pixel electrode EL3 (P) does not have slit-like openings SLT in the vertical-field driven liquid crystal display device according to the twelfth embodiment. Alternatively, the second transparent pixel electrode EL3 (P) may have an opening for controlling the alignment of liquid crystal molecules as in the vertical alignment (VA) display mode. Besides, a dielectric projection for controlling the alignment of liquid crystal molecules may be formed on the second transparent pixel electrode EL3 (P).

The vertical-field driven liquid crystal display mode discussed here may be a known technology such as the VA mode, the TN mode, the ECB mode, the OCB mode, the polymer dispersed type, and the like.

In all of the above-mentioned embodiments, a retardation plate may be added if necessary for a desired display mode and, conversely, may be removed if not necessary. For example, when the guest-host display mode is employed, the polarization plate may also be removed if not necessary. Besides, the retardation plate and the polarization plate may be placed not only outside but also inside of the first substrate SUB1 and the second substrate SUB2.

A columnar spacer may be placed on at least one of the opposing faces of the first substrate SUB1 and the second substrate SUB2. With the columnar spacer, the liquid crystal layer LC can have a uniform thickness throughout the plane of the liquid crystal display device.

Further, a backlight is provided on the opposite side of the display surface of the liquid crystal display device.

The alignment of the liquid crystal layer employed can be horizontal alignment, twisted alignment, vertical alignment, hybrid alignment, and the like.

As has been described above, in each of the above-mentioned embodiments, an equivalent storage capacitor sufficiently large in relation to the parasitic capacitors can be formed from the parallel capacitance of the first storage capacitor Cst1 and the second storage capacitor Cst2. This makes the voltage of the pixel electrode less susceptible to feed-through voltage, which is caused by a voltage change in the scanning line or the signal line, during a hold period in which the thin film transistor TFT is off. Phenomena called smearing and cross talk can thus be prevented, and degradation in image quality is prevented.

It also reduces the leakage of accumulated electric charges from the pixel electrode and the source electrode (or the drain electrode) during a hold period, thereby allowing the electric field applied to the liquid crystal layer to drop less. This prevents luminance shading and unevenness in a displayed image without raising the voltage output from drive circuits and without increasing power consumption.

Further, since the first storage capacitor and the second storage capacitor are both transparent in the transmissive display area, forming a storage capacitor that is sufficiently large in relation to the parasitic capacitors does not lower the aperture ratio of the transmissive display portion, and the luminance in transmissive display is prevented from dropping. The formation of a sufficiently large storage capacitor and the securing of a sufficiently high aperture ratio are thus accomplished simultaneously.

The invention made by the present inventors has been described concretely through the above-mentioned embodiments. However, the present invention is not limited to the above-mentioned embodiments and is modifiable in various ways without departing from the spirit of the invention.

What is claimed is:

1. A display device comprising:
a first substrate;
an organic insulating film on the first substrate;
a first inorganic insulating film laminated on the organic insulating film;
a second inorganic insulating film laminated on the first inorganic insulating film;
an alignment film covering the second inorganic insulating film;
a thin film transistor between the first substrate and the organic insulating film;
a transparent pixel electrode between the organic insulating film and the alignment film;
a transparent counter electrode between the organic insulating film and the alignment film; and
a metal wiring between the organic insulating film and the alignment film, wherein
the metal wiring is connected to the transparent counter electrode,
the transparent pixel electrode is connected to a source electrode of the thin film transistor at a region where the organic insulating film is not formed,
the metal wiring is between the organic insulating film and the first inorganic insulating film, and
a part of the metal wiring overlaps a drain electrode of the thin film transistor.

2. The display device of claim 1, wherein
the transparent pixel electrode is between the first inorganic insulating film and the second inorganic insulating film,
the transparent counter electrode is between the second inorganic insulating film and the alignment film, and
the transparent counter electrode has silts.

3. A display device comprising:
a first substrate;
an organic insulating film on the first substrate;
a first inorganic insulating film laminated on the organic insulating film;
a second inorganic insulating film laminated on the first inorganic insulating film;
an alignment film covering the second inorganic insulating film;
a thin film transistor between the first substrate and the organic insulating film;
a transparent pixel electrode between the organic insulating film and the alignment film;
a transparent counter electrode between the organic insulating film and the alignment film; and
a metal wiring between the organic insulating film and the alignment film, wherein
the metal wiring is connected to the transparent counter electrode,
the metal wiring is between the second inorganic insulating film and the alignment film, and a part of the metal wiring overlaps a drain electrode of the thin film transistor.

4. The display device of claim 3, wherein
the transparent pixel electrode is between the first inorganic insulating film and the second inorganic insulating film,
the transparent counter electrode is between the second inorganic insulating film and the alignment film,
the transparent counter electrode has silts, and
the transparent counter electrode is stacked on the part of the metal wiring.

5. A display device comprising:
a first substrate;
an organic insulating film on the first substrate;
a first inorganic insulating film laminated on the organic insulating film;
a second inorganic insulating film laminated on the first inorganic insulating film;
an alignment film covering the second inorganic insulating film;
a thin film transistor between the first substrate and the organic insulating film;
a transparent pixel electrode between the organic insulating film and the alignment film;
a transparent counter electrode between the organic insulating film and the alignment film; and
a metal wiring between the organic insulating film and the alignment film, wherein
the metal wiring is connected to the transparent counter electrode,
the transparent pixel electrode is connected to a source electrode of the thin film transistor at a region where the organic insulating film is not formed,
the metal wiring is between the first inorganic insulating film and the second inorganic insulating film, and
a part of the metal wiring overlaps a drain electrode of the thin film transistor.

6. The display device of claim 5, wherein
the transparent pixel electrode is between the second inorganic insulating film and the alignment film,
the transparent counter electrode is between the first inorganic insulating film and the second inorganic insulating film,
the transparent pixel electrode has silts, and
the transparent counter electrode is stacked on the part of the metal wiring.

7. The display device of claim 5, wherein
the transparent pixel electrode is between the organic insulating film and the first inorganic insulating film,
the transparent counter electrode is between the first inorganic insulating film and the second inorganic insulating film,
the transparent counter electrode is stacked on the part of the metal wiring.

* * * * *